US012581747B2

(12) United States Patent (10) Patent No.: US 12,581,747 B2
Yamazaki et al. (45) Date of Patent: Mar. 17, 2026

(54) MANUFACTURING METHOD OF SEMICONDUCTOR DEVICE

(71) Applicant: Semiconductor Energy Laboratory Co., Ltd., Atsugi (JP)

(72) Inventors: Shunpei Yamazaki, Setagaya (JP); Toshiya Endo, Atsugi (JP); Ryota Hodo, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 277 days.

(21) Appl. No.: 18/207,821

(22) Filed: Jun. 9, 2023

(65) Prior Publication Data

US 2023/0411500 A1 Dec. 21, 2023

(30) Foreign Application Priority Data

Jun. 20, 2022 (JP) ................................. 2022-098829

(51) Int. Cl.
H10D 99/00 (2025.01)
(52) U.S. Cl.
CPC ................................... H10D 99/00 (2025.01)
(58) Field of Classification Search
CPC . H10D 30/6755; H10D 30/6734; H10D 99/00
See application file for complete search history.

(56) References Cited

U.S. PATENT DOCUMENTS 11,245,040 B2 * 2/2022 Yamazaki ............. H01L 21/768
11,316,051 B2 * 4/2022 Yamazaki ............. H10B 12/05

11,495,690 B2 * 11/2022 Yamazaki .......... H10D 30/6743
2006/0197092 A1 * 9/2006 Hoffman ............ H10D 30/6755
257/E21.411
2010/0025676 A1 * 2/2010 Yamazaki .............. H10D 99/00
204/192.1
2010/0025678 A1 * 2/2010 Yamazaki .............. H10D 86/60
257/E21.414
2010/0133530 A1 * 6/2010 Akimoto ............. H10D 30/031
257/E29.296
2010/0301329 A1 * 12/2010 Asano ................... H01L 21/465
257/E29.296

(Continued)

FOREIGN PATENT DOCUMENTS

JP 2011-151383 A 8/2011
JP 2012-257187 A 12/2012
WO WO-2016/125052 8/2016

*Primary Examiner* — Vincent Wall
(74) *Attorney, Agent, or Firm* — Eric J. Robinson; Robinson Intellectual Property Law Office, P.C.

(57) ABSTRACT

To manufacture a semiconductor device by a method including the steps of: forming an oxide over a substrate, a first conductor over the oxide, and a second conductor over the first conductor; forming a first insulator to cover the oxide, the first conductor, and the second conductor; forming an opening in the first insulator to divide the second conductor into a third conductor and a fourth conductor; forming a second insulator and a third insulator to cover the oxide and the first insulator; processing the second insulator and the third insulator into a fourth insulator and a fifth insulator; processing the first conductor using the fourth insulator and the fifth insulator as a mask to divide the first conductor into a fifth conductor and a sixth conductor; and removing the fifth insulator.

12 Claims, 30 Drawing Sheets

(56)          References Cited

U.S. PATENT DOCUMENTS

| | | | |
|---|---|---|---|
| 2011/0133177 A1* | 6/2011 | Suzawa ............. | H10D 30/6757 |
| | | | 438/151 |
| 2011/0156027 A1 | 6/2011 | Yamazaki et al. | |
| 2012/0032730 A1 | 2/2012 | Koyama | |
| 2016/0172500 A1* | 6/2016 | Yamazaki ......... | H10D 30/6755 |
| | | | 257/43 |
| 2016/0276487 A1* | 9/2016 | Yamazaki ............. | H10D 99/00 |
| 2017/0170211 A1* | 6/2017 | Yamazaki ......... | H10D 30/6732 |
| 2018/0019343 A1* | 1/2018 | Asami ............... | H10D 30/6213 |
| 2020/0119199 A1* | 4/2020 | Yamazaki ............. | H10B 12/31 |
| 2020/0279951 A1* | 9/2020 | Hodo .................... | H10D 62/80 |
| 2020/0335630 A1* | 10/2020 | Iida ....................... | H01L 21/443 |
| 2021/0111196 A1 | 4/2021 | Yamazaki et al. | |
| 2021/0119054 A1* | 4/2021 | Yamazaki ............. | H10D 99/00 |
| 2021/0175361 A1* | 6/2021 | Yamazaki ............. | H10D 30/69 |
| 2021/0320193 A1* | 10/2021 | Yamazaki ......... | H10D 84/0128 |
| 2023/0411500 A1* | 12/2023 | Yamazaki ......... | H10D 30/6755 |
| 2024/0379866 A1* | 11/2024 | Kunitake ............. | H01L 21/268 |
| 2025/0048676 A1* | 2/2025 | Hodo ................ | H01L 21/02107 |
| 2025/0280566 A1* | 9/2025 | Sasagawa ............ | H10D 64/675 |

* cited by examiner

FIG. 4A
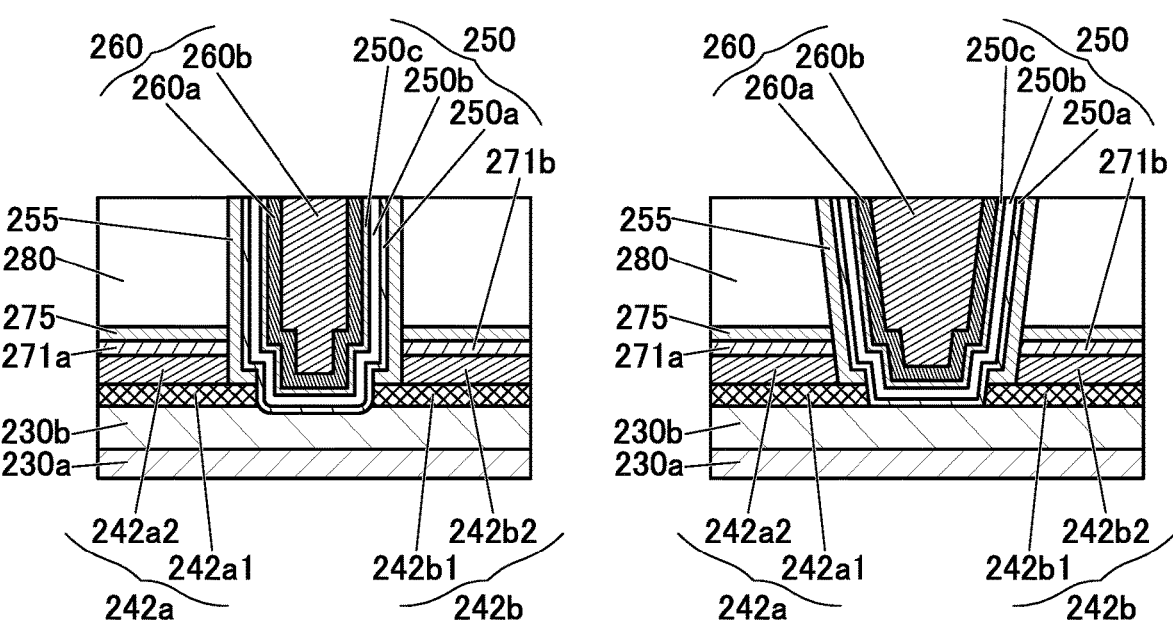
FIG. 4B
FIG. 4C
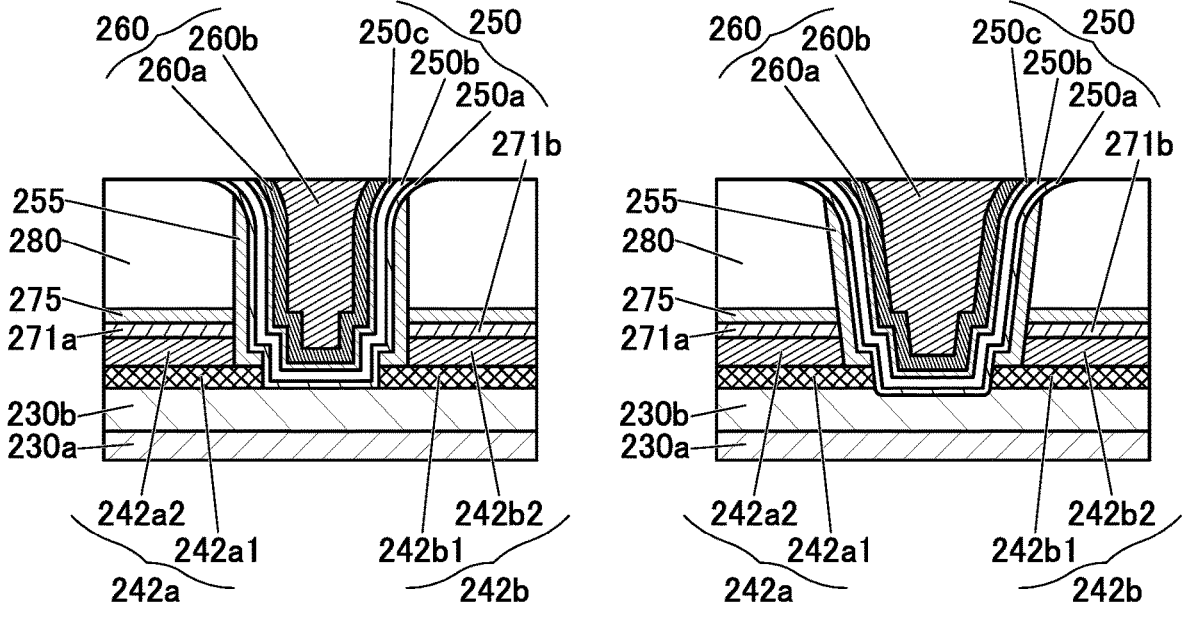
FIG. 4D 205
221,222,224f,230af,230bf,242_1f,242_2f,271f 205
224,230a,230b,242_1,242_2,271

FIG. 28A
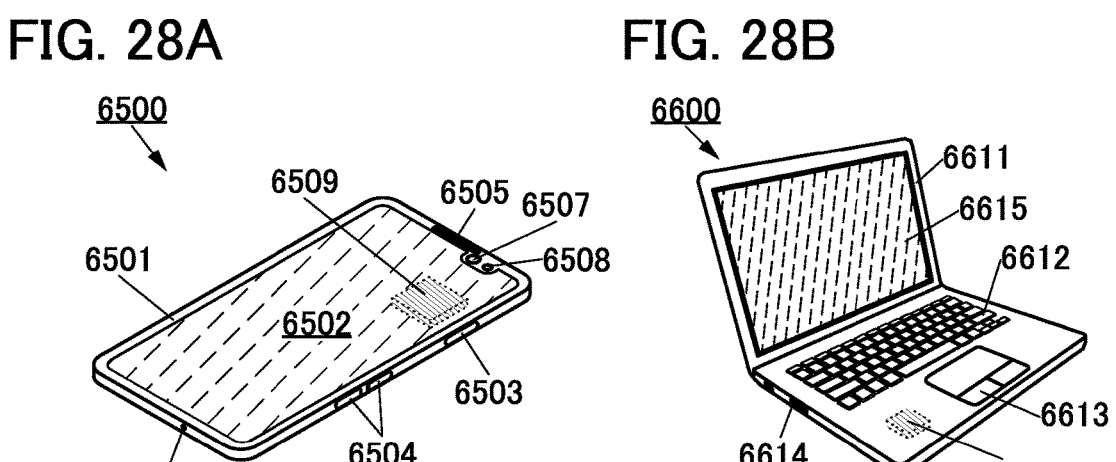
6500
6509 6505 6507
6501
6508
6502
6503
6504
6506
FIG. 28B
6600
6611
6615
6612
6613
6614
6616
FIG. 28C
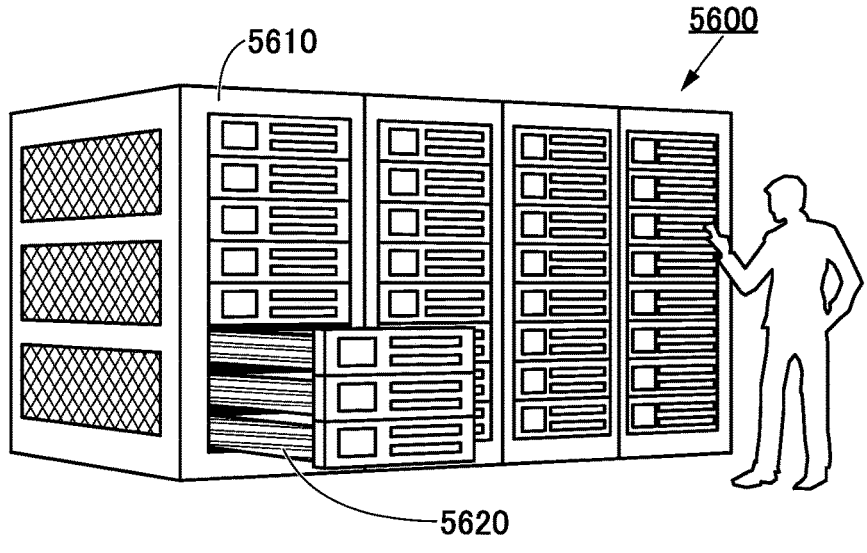
5610
5600
5620
FIG. 28D
5620
5621
5625
5630
5631
5624
5623
FIG. 28E
5621
5625
5622
5626
5627
5628
5624
5629
5623

7000

MANUFACTURING METHOD OF SEMICONDUCTOR DEVICE

BACKGROUND OF THE INVENTION

1. Field of the Invention

One embodiment of the present invention relates to a semiconductor device, a storage device, and an electronic device each including an oxide semiconductor. One embodiment of the present invention relates to a method of manufacturing the semiconductor device.

Note that one embodiment of the present invention is not limited to the above technical field. Examples of the technical field of one embodiment of the present invention include a semiconductor device, a display device, a light-emitting apparatus, a power storage device, a storage device, an electronic device, a lighting device, an input device (e.g., a touch sensor), an input/output device (e.g., a touch panel), a method of driving any of them, and a method of manufacturing any of them.

In this specification and the like, a semiconductor device generally means a device that can function by utilizing semiconductor characteristics. A semiconductor element such as a transistor, a semiconductor circuit, an arithmetic device, and a storage device are each an embodiment of the semiconductor device. A display device (e.g., a liquid crystal display device and a light-emitting display device), a projection device, a lighting device, an electro-optical device, a power storage device, a storage device, a semiconductor circuit, an imaging device, an electronic device, and the like may include a semiconductor device.

2. Description of the Related Art

In recent years, semiconductor devices have been developed to be used mainly for an LSI, a CPU, a memory, and the like. A CPU is an aggregation of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has attracted attention. The transistor is used in a wide range of electronic devices such as an integrated circuit (IC) and an image display device (also simply referred to as a display device). A silicon-based semiconductor material is widely known as a material for a semiconductor thin film that can be used in a transistor. As another material, an oxide semiconductor has been attracting attention.

It is known that a transistor including an oxide semiconductor has an extremely low leakage current in an off state. For example, Patent Document 1 discloses a low-power CPU utilizing a characteristic of a low leakage current of the transistor including an oxide semiconductor. Furthermore, for example, Patent Document 2 discloses a storage device that can retain stored data for a long time by utilizing a characteristic of a low leakage current of the transistor including an oxide semiconductor.

Patent Document 3 discloses a transistor with a minute structure in which a source electrode layer and a drain electrode layer are provided in contact with a top surface of an oxide semiconductor.

REFERENCES

Patent Documents

[Patent Document 1] Japanese Published Patent Application No. 2012-257187
[Patent Document 2] Japanese Published Patent Application No. 2011-151383
[Patent Document 3] PCT International Publication No. WO2016/125052

SUMMARY OF THE INVENTION

An object of one embodiment of the present invention is to provide a semiconductor device that can be miniaturized or highly integrated. Another object of one embodiment of the present invention is to provide a semiconductor device that operates at high speed. Another object of one embodiment of the present invention is to provide a semiconductor device with favorable electrical characteristics. Another object of one embodiment of the present invention is to provide a semiconductor device with a small variation in electrical characteristics of transistors. Another object of one embodiment of the present invention is to provide a highly reliable semiconductor device. Another object of one embodiment of the present invention is to provide a semiconductor device with a high on-state current. Another object of one embodiment of the present invention is to provide a semiconductor device with low power consumption. Another object of one embodiment of the present invention is to provide a novel semiconductor device. Another object of one embodiment of the present invention is to provide a method of manufacturing a semiconductor device with high productivity. Another object of one embodiment of the present invention is to provide a method of manufacturing of a novel semiconductor device.

Another object of one embodiment of the present invention is to provide a storage device having large storage capacity. Another object of one embodiment of the present invention is to provide a storage device that operates at high speed. Another object of one embodiment of the present invention is to provide a storage device with low power consumption. Another object of one embodiment of the present invention is to provide a novel storage device.

Note that the description of these objects does not preclude the existence of other objects. One embodiment of the present invention does not need to achieve all of these objects. Other objects can be derived from the description of the specification, the drawings, and the claims.

One embodiment of the present invention is a method of manufacturing a semiconductor device, including the steps of: forming an oxide over a substrate, a first conductor over the oxide, and a second conductor over the first conductor; forming a first insulator to cover the oxide, the first conductor, and the second conductor; forming an opening in the first insulator; dividing the second conductor into a third conductor and a fourth conductor by the opening; forming a second insulator to cover the oxide and the first insulator; forming a third insulator over the second insulator; processing the second insulator and the third insulator by a dry etching method into a fourth insulator in contact with a side surface of the first insulator, a side surface of the third conductor, and a side surface of the fourth conductor and a fifth insulator in contact with a side surface and a top surface of the fourth insulator; processing the first conductor by a dry etching method using the fourth insulator and the fifth insulator as a mask to divide the first conductor into a fifth conductor and a sixth conductor; removing the fifth insulator by isotropic etching; performing heat treatment on the oxide in an atmosphere containing oxygen; forming a sixth insulator to cover the oxide, the first insulator, and the fourth insulator; forming a seventh conductor over the sixth insulator; and processing the sixth insulator and the seventh conductor by CMP treatment to form a seventh insulator and an eighth conductor in the opening. A nitride insulator is formed as the second insulator and an oxide insulator is formed as the third insulator.

In the above method, silicon nitride is preferably formed by a PEALD method as the second insulator.

In the above method, silicon oxide is preferably formed by a PEALD method as the third insulator.

In the above method, tantalum nitride is preferably formed by a sputtering method as the first conductor.

In the above method, tungsten is preferably formed by a sputtering method as the second conductor.

In the above method, oxide containing indium, gallium, and zinc is preferably formed by a sputtering method as the oxide.

One embodiment of the present invention can provide a semiconductor device that can be miniaturized or highly integrated. One embodiment of the present invention can provide a semiconductor device that operates at high speed. One embodiment of the present invention can provide a semiconductor device with favorable electrical characteristics. One embodiment of the present invention can provide a semiconductor device with a small variation in electrical characteristics of transistors. One embodiment of the present invention can provide a highly reliable semiconductor device. One embodiment of the present invention can provide a semiconductor device with a high on-state current. One embodiment of the present invention can provide a semiconductor device with low power consumption. One embodiment of the present invention can provide a novel semiconductor device. One embodiment of the present invention can provide a method of manufacturing a semiconductor device with high productivity. One embodiment of the present invention can provide a method of manufacturing of a novel semiconductor device.

One embodiment of the present invention can provide a storage device having large storage capacity. One embodiment of the present invention can provide a storage device that operates at high speed. One embodiment of the present invention can provide a storage device with low power consumption. One embodiment of the present invention can provide a novel storage device.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIGS. 4A to 4D are cross-sectional views illustrating examples of a semiconductor device.

FIGS. 21A and 21B are schematic views illustrating examples of a storage device.

FIGS. 28A and 28B illustrate examples of electronic devices and FIGS. 28C to 28E illustrate an example of a large computer.

DETAILED DESCRIPTION OF THE INVENTION

Figure 1A:
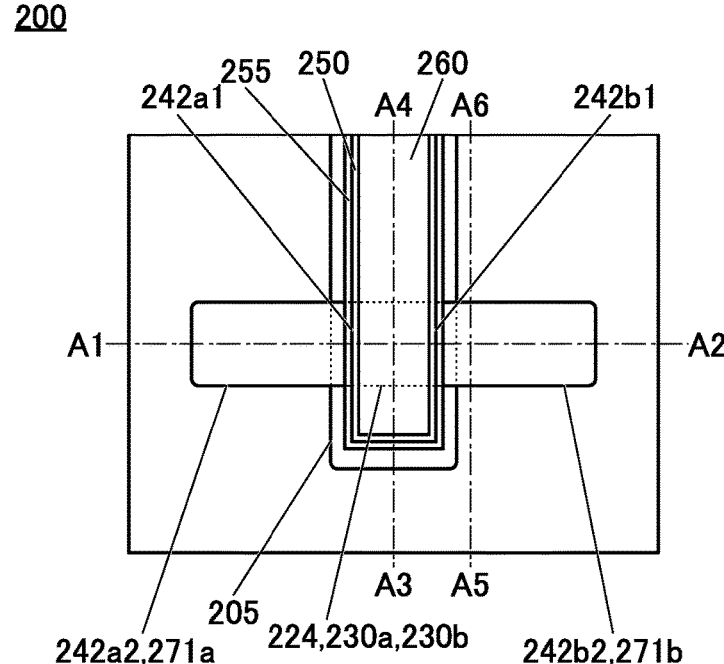
FIG. 1A is a plan view illustrating an example of a semiconductor device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that in this specification and the like, ordinal numbers such as "first" and "second" are used for convenience and do not limit the number of components or the order of components (e.g., the order of steps or the stacking order of layers). Furthermore, an ordinal number used for a component in a certain part in this specification is not the same as an ordinal number used for the component in another part in this specification or claims in some cases.

Note that the terms "film" and "layer" can be used interchangeably depending on the case or the circumstances. For example, the term "conductive layer" can be replaced with the term "conductive film". As another example, the term "insulating film" can be replaced with the term "insulating layer". The term "conductor" can be replaced with the term "conductive layer" or "conductive film" depending on the case or the circumstances. The term "insulator" can be replaced with the term "insulating layer" or "insulating film" depending on the case or the circumstances.

Examples of the opening include a groove and a slit. A region where the opening is formed may be referred to as an opening portion.

In the drawings used in embodiments in this specification, a sidewall of an insulator in an opening is perpendicular or substantially perpendicular to a substrate surface or a formation surface, but the sidewall may have a tapered shape.

In this specification and the like, a tapered shape refers to a shape such that at least part of a side surface of a component is inclined with respect to a substrate surface or a formation surface of the component. For example, a tapered shape refers to a shape including a region where the angle between the inclined side surface and the substrate surface or the formation surface of the component (hereinafter, such an angle is referred to as a taper angle in some cases) is less than 90°. Note that the side surface of the component and the substrate plane are not necessarily completely flat and may be substantially flat with a slight curvature or with slight unevenness.

Embodiment 1

In this embodiment, a semiconductor device including an oxide semiconductor and a method of manufacturing the semiconductor device will be described with reference to FIGS. 1A to 1D to FIGS. 18A to 18D.

<Structure Example of Semiconductor Device>

Figure 1C:
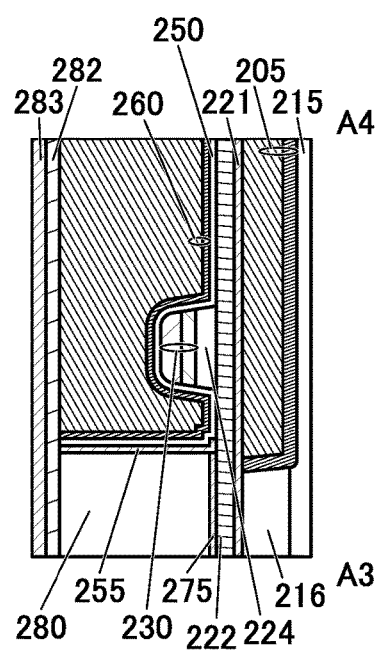
FIGS. 1B to 1D are cross-sectional views illustrating the example of a semiconductor device.
Figure 1B:
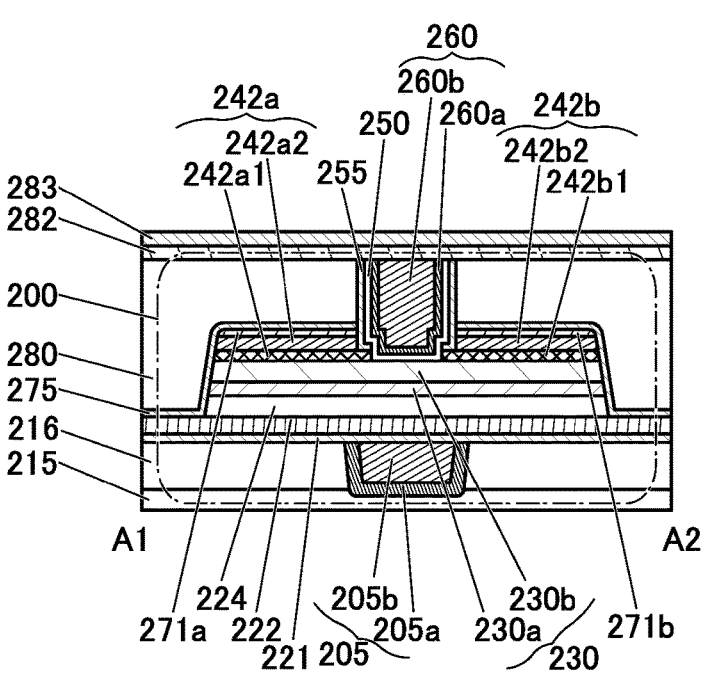
Figure 1D:
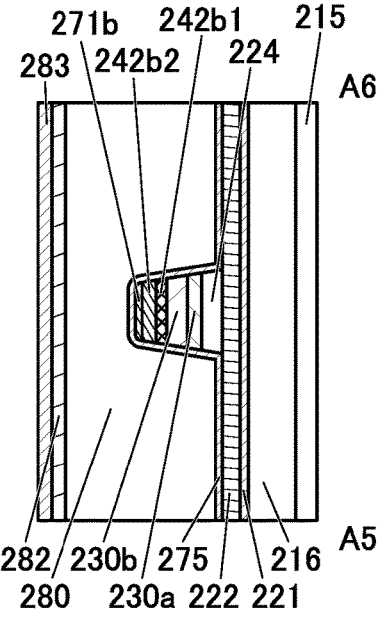

An example of a structure of a semiconductor device is described with reference to FIGS. 1A to 1D to FIGS. 4A to 4D. FIGS. 1A to 1D are a plan view and cross-sectional views of a semiconductor device (a transistor 200). FIG. 1A is the plan view of the semiconductor device. FIGS. 1B to 1D are the cross-sectional views of the semiconductor device. FIG. 1B illustrates a cross section taken along the dashed-dotted line A1-A2 in FIG. 1A, which corresponds to a cross-sectional view of the transistor 200 in the channel length direction. FIG. 1C illustrates a cross section taken along the dashed-dotted line A3-A4 in FIG. 1A, which corresponds to a cross-sectional view of the transistor 200 in the channel width direction. FIG. 1D illustrates a cross section taken along the dashed-dotted line A5-A6 in FIG. 1A, which corresponds to a cross-sectional view of the transistor 200 in the channel width direction. Note that for simplification, some components are not illustrated in the plan view of FIG. 1A. FIGS. 2A and 2B to FIGS. 4A to 4D are enlarged cross-sectional views of the transistor 200 in the channel length direction.

The transistor 200 includes a conductor 205 (a conductor 205a and a conductor 205b) embedded in an insulator 216, an insulator 221 over the insulator 216 and the conductor 205, an insulator 222 over the insulator 221, an insulator 224 over the insulator 222, an oxide 230 (an oxide 230a and an oxide 230b) over the insulator 224, a conductor 242a (a conductor 242a1 and a conductor 242a2) and a conductor 242b (a conductor 242b1 and a conductor 242b2) over the oxide 230, an insulator 271a over the conductor 242a, an insulator 271b over the conductor 242b, an insulator 250 over the oxide 230, and a conductor 260 (a conductor 260a and a conductor 260b) over the insulator 250.

An insulator 275 is provided over the insulators 271a and 271b, and an insulator 280 is provided over the insulator 275. An insulator 255, the insulator 250, and the conductor 260 are provided in an opening formed in the insulator 280 and the insulator 275. An insulator 282 is provided over the insulator 280 and the conductor 260. An insulator 283 is provided over the insulator 282. An insulator 215 is provided below the insulator 216 and the conductor 205. The insulator 255 is provided between the insulator 250 and the conductor 242a2, the conductor 242b2, the insulator 271a, the insulator 271b, the insulator 275, and the insulator 280.

The oxide 230 includes a region that functions as a channel formation region of the transistor 200. The conductor 260 includes a region that functions as a first gate electrode (an upper gate electrode) of the transistor 200. The insulator 250 includes a region that functions as a first gate insulator of the transistor 200. The conductor 205 includes a region that functions as a second gate electrode (a lower gate electrode) of the transistor 200. Each of the insulator 224, the insulator 222, and the insulator 221 includes a region that functions as a second gate insulator of the transistor 200.

The conductor 242a includes a region that functions as one of a source electrode and a drain electrode of the transistor 200. The conductor 242b includes a region that functions as the other of the source electrode and the drain electrode of the transistor 200. The conductor 242a has a stacked-layer structure of the conductor 242a1 and the conductor 242a2 over the conductor 242a1. The conductor 242b has a stacked-layer structure of the conductor 242b1 and the conductor 242b2 over the conductor 242b1. The conductors 242a1 and 242b1 in contact with the oxide 230b are preferably conductors that are not easily oxidized, such as metal nitride. In that case, the conductors 242a and 242b can be prevented from being oxidized excessively due to oxygen contained in the oxide 230b. The conductors 242a2 and 242b2 are preferably conductors having higher conductivity than the conductors 242a1 and 242b1, such as a metal layer. Thus, the conductors 242a and 242b can function as a wiring or an electrode with high conductivity. In this manner, a semiconductor device in which the conductors 242a and 242b which function as a wiring or an electrode are provided in contact with a top surface of the oxide 230 functioning as an active layer can be provided.

The insulator 255 is preferably an insulator that is not easily oxidized, such as nitride. By anisotropic etching, the insulator 255 is formed in a sidewall shape to be in contact with a sidewall of the opening formed in the insulator 280 and the like (here, the sidewall of the opening corresponds to, for example, a side surface of the insulator 280 or the like in the opening). The insulator 255 is formed in contact with side surfaces of the conductors 242a2 and 242b2 and has a function of protecting the conductors 242a2 and 242b2. Although the details will be described later, heat treatment in an atmosphere containing oxygen is preferably performed after the separation of the conductor into the conductor 242a1 and the conductor 242b1 and before the formation of the insulator 250. At this time, since the insulator 255 is formed in contact with the side surfaces of the conductor 242a2 and the conductor 242b2, excessive oxidation of the conductors 242a2 and 242b2 can be prevented.

The opening formed in the insulator 280 and the insulator 275 overlap with a region between the conductors 242a2 and 242b2. In a top view, the side surface of the insulator 280 in the opening is aligned or substantially aligned with a side surface of the conductor 242a2 and a side surface of the conductor 242b2. A part of a top surface of the conductor 242a1 is in contact with the conductor 242a2, and a part of a top surface of the conductor 242b1 is in contact with the conductor 242b2. Accordingly, the insulator 255 is in contact with another part of the top surface of the conductor 242a1, another part of the top surface of the conductor 242b1, the side surface of the conductor 242a2, and the side surface of the conductor 242b2 in the opening. Here, as illustrated in FIGS. 1B and 1C, projecting portions are formed in portions of the insulator 255 in contact with the top surface of the conductor 242a1, the top surface of the conductor 242b1, or a top surface of the insulator 222. Each of the projecting portions of the insulator 255 extends toward the center of the opening beyond the other portion of the insulator 255. Thus, the projecting portions of the insulator 255, a part of the conductor 242a1, and a part of the conductor 242b1 are formed to extend in the opening.

The insulator 250 is in contact with the top surface of the oxide 230, a side surface of the conductor 242a1, a side surface of the conductor 242b1, and a side surface of the insulator 255. Since the projecting portions of the insulator 255, the part of the conductor 242a1, and the part of the conductor 242b1 extend in the opening, the shape of the insulator 250 is reflected by the shapes of the projecting portions of the insulator 255, the part of the conductor 242a1, and the part of the conductor 242b1.

As described above, the conductors 242a1 and 242b1 can be formed to extend beyond the conductors 242a2 and 242b2 to the same extent as the projecting portions of the insulator 255. Thus, in the cross-sectional view of the transistor 200 in the channel length direction in FIG. 2B, a distance L2 between the conductors 242a1 and 242b1 is smaller than a distance L1 between the conductors 242a2 and 242b2. With such a structure, the distance between a source and a drain can be shortened, and the channel length can also be shortened in accordance with the distance. Therefore, the frequency characteristics of the transistor 200 can be improved. By miniaturization of the semiconductor device in this manner, the semiconductor device can have improved operation speed.

The oxide 230 preferably includes the oxide 230a over the insulator 224 and the oxide 230b over the oxide 230a. When the oxide 230a is provided below the oxide 230b, impurities can be inhibited from diffusing into the oxide 230b from the components formed below the oxide 230a.

Although an example in which the oxide 230 has a two-layer structure of the oxide 230a and the oxide 230b is described in this embodiment, one embodiment of the present invention is not limited to this example. For example, the oxide 230 may have a single-layer structure of the oxide 230b or a stacked-layer structure of three or more layers.

In the oxide 230b, a channel formation region and source and drain regions of the transistor 200 are formed. The channel formation region is sandwiched between the source and drain regions. At least a part of the channel formation region overlaps with the conductor 260. The source region overlaps with the conductor 242a, and the drain region overlaps with the conductor 242b. Note that the source region and the drain region can be interchanged with each other.

The channel formation region has a smaller amount of oxygen vacancies or a lower impurity concentration than the source and drain regions, and thus has a low carrier concentration and a high resistance. Thus, the channel formation region can be regarded as an i-type (intrinsic) or substantially i-type region.

The source and drain regions have a large amount of oxygen vacancies or a high concentration of impurities such as hydrogen, nitrogen, or a metal element, and thus are low-resistance regions with a high carrier concentration. In other words, the source and drain regions are n-type regions (low-resistance regions) having a higher carrier concentration than the channel formation region.

Note that the carrier concentration in the channel formation region is preferably lower than or equal to $1 \times 10^{18}$ cm$^{-3}$, lower than $1 \times 10^{17}$ cm$^{-3}$, lower than $1 \times 10^{16}$ cm$^{-3}$, lower than $1 \times 10^{15}$ cm$^{-3}$, lower than $1 \times 10^{14}$ cm$^{-3}$, lower than $1 \times 10^{13}$ cm$^{-3}$, lower than $1 \times 10^{12}$ cm$^{-3}$, lower than $1 \times 10^{11}$ cm$^{-3}$, or lower than $1 \times 10^{10}$ cm$^{-3}$. The lower limit of the carrier concentration of the channel formation region is not particularly limited and can be, for example, $1 \times 10^{-9}$ cm$^{-3}$.

In order to reduce the carrier concentration of the oxide 230$b$, the impurity concentration in the oxide 230$b$ is reduced so that the density of defect states is reduced. In this specification and the like, a state with a low impurity concentration and a low density of defect states is referred to as a highly purified intrinsic or substantially highly purified intrinsic state. Note that an oxide semiconductor (or metal oxide) having a low carrier concentration may be referred to as a highly purified intrinsic or substantially highly purified intrinsic oxide semiconductor.

To obtain stable electrical characteristics of the transistor 200, it is effective to reduce the concentration of impurities in the oxide 230$b$. In order to reduce the concentration of impurities in the oxide 230$b$, the concentration of impurities also in a film adjacent to the oxide 230$b$ is preferably reduced. Examples of impurities include hydrogen, nitrogen, an alkali metal, an alkaline earth metal, iron, nickel, and silicon. Note that an impurity in the oxide 230$b$ refers to, for example, elements other than the main components of the oxide 230$b$. For example, an element with a concentration lower than 0.1 atomic % is regarded as an impurity.

Note that the channel formation region, the source region, and the drain region may be formed not only in the oxide 230$b$ but also in the oxide 230$a$.

In the oxide 230, the boundaries between the regions are difficult to clearly observe in some cases. The concentration of a metal element and an impurity element such as hydrogen or nitrogen, which is detected in each region, may be gradually changed not only between the regions but also in each region. That is, the region closer to the channel formation region may have a lower concentration of a metal element and an impurity element such as hydrogen or nitrogen.

A metal oxide functioning as a semiconductor (hereinafter such a metal oxide is also referred to as an oxide semiconductor) is preferably used for the oxide 230 (the oxides 230$a$ and 230$b$).

The band gap of the metal oxide functioning as a semiconductor is preferably greater than or equal to 2.0 eV, further preferably greater than or equal to 2.5 eV. The use of such metal oxide having a wide band gap can reduce the off-state current of the transistor. A transistor including metal oxide in a channel formation region is referred to as an OS transistor. The off-state current of the OS transistor is small, so that power consumption of the semiconductor device can be sufficiently reduced. The OS transistor has high frequency characteristics, which enables the semiconductor device to operate at high speed.

The oxide 230 preferably includes metal oxide (an oxide semiconductor). Examples of the metal oxide that can be used for the oxide 230 include indium oxide, gallium oxide, and zinc oxide. The metal oxide preferably contains at least indium (In) or zinc (Zn). The metal oxide preferably contains two or three selected from indium, an element M, and zinc. The element M is a metal element or metalloid element having a high bonding energy with oxygen. For example, the bonding energy of the metal element or metalloid element with oxygen is higher than that of indium. Specific examples of the element M include aluminum, gallium, tin, yttrium, titanium, vanadium, chromium, manganese, iron, cobalt, nickel, zirconium, molybdenum, hafnium, tantalum, tungsten, lanthanum, cerium, neodymium, magnesium, calcium, strontium, barium, boron, silicon, germanium, and antimony. The element M included in the metal oxide is preferably one or more of the above elements, further preferably one or more selected from aluminum, gallium, tin, and yttrium, still further preferably gallium. Note that in this specification and the like, a metal element and a metalloid element are collectively referred to as a "metal element" in some cases, and a "metal element" described in this specification and the like includes a metalloid element in some cases.

As the oxide 230, indium zinc oxide (In—Zn oxide), indium tin oxide (In—Sn oxide), indium titanium oxide (In—Ti oxide), indium gallium oxide (In—Ga oxide), indium gallium aluminum oxide (In—Ga—Al oxide), indium gallium tin oxide (In—Ga—Sn oxide), gallium zinc oxide (also referred to as Ga—Zn oxide or GZO), aluminum zinc oxide (also referred to as Al—Zn oxide or AZO), indium aluminum zinc oxide (also referred to as In—Al—Zn oxide or IAZO), indium tin zinc oxide (In—Sn—Zn oxide), indium titanium zinc oxide (In—Ti—Zn oxide), indium gallium zinc oxide (also referred to as In—Ga—Zn oxide or IGZO), indium gallium tin zinc oxide (also referred to as In—Ga—Sn—Zn oxide or IGZTO), or indium gallium aluminum zinc oxide (also referred to as In—Ga—Al—Zn oxide, IGAZO, or IAGZO) can be used, for example. Alternatively, indium tin oxide containing silicon, gallium tin oxide (Ga—Sn oxide), aluminum tin oxide (Al—Sn oxide), or the like can be used.

By increasing the proportion of indium atoms in the sum of atoms of all metal elements included in the metal oxide, the field-effect mobility of the transistor can be increased.

Instead of indium or in addition to indium, the metal oxide may contain one or more kinds of metal elements whose period number in the periodic table is large. As an overlap of orbitals of metal elements becomes larger, the carrier conduction in the metal oxide is likely to be large. Thus, when a metal element with a large period number is included in the metal oxide, the field-effect mobility of the transistor can be increased in some cases. As examples of the metal element with a large period number, metal elements belonging to Period 5 or 6 in the periodic table are given. Specific examples of the metal element include yttrium, zirconium, silver, cadmium, tin, antimony, barium, lead, bismuth, lanthanum, cerium, praseodymium, neodymium, promethium, samarium, and europium. Note that lanthanum, cerium, praseodymium, neodymium, promethium, samarium, and europium are called light rare-earth elements.

The metal oxide may contain one or more kinds of non-metal elements. The metal oxide containing a non-metal element can increase the field-effect mobility of a transistor in some cases. Examples of the non-metal element include carbon, nitrogen, phosphorus, sulfur, selenium, fluorine, chlorine, bromine, and hydrogen.

By increasing the proportion of zinc atoms in the sum of atoms of all metal elements included in the metal oxide, the metal oxide has high crystallinity, so that diffusion of impurities in the metal oxide can be inhibited. Consequently, changes in the electrical characteristics of the transistor can be reduced to improve the reliability of the transistor.

By increasing the proportion of the element M atoms in the sum of atoms of all metal elements included in the metal oxide, oxygen vacancies can be prevented from being formed in the metal oxide. Accordingly, generation of carriers due to oxygen vacancies is inhibited, which makes the off-state current of the transistor small. Furthermore, changes in the electrical characteristics of the transistor can be reduced to improve the reliability of the transistor.

As described above, electrical characteristics and reliability of a transistor are changed depending on the composition of metal oxide used for the oxide 230. Therefore, by changing the composition of the metal oxide in accordance with electrical characteristics and reliability required for the transistor, a semiconductor device having both excellent electrical characteristics and high reliability can be achieved.

The oxide 230 preferably has a stacked-layer structure of oxide layers with different chemical compositions. For example, the atomic ratio of the element M to a metal element that is the main component in the metal oxide used as the oxide 230a is preferably higher than that in the metal oxide used as the oxide 230b. The atomic ratio of the element M to In in the metal oxide used as the oxide 230a is preferably higher than that in the metal oxide used as the oxide 230b. This structure can inhibit impurities and oxygen from diffusing into the oxide 230b from the components formed below the oxide 230a.

The atomic ratio of In to the element M in the metal oxide used as the oxide 230b is preferably higher than that in the metal oxide used as the oxide 230a. With this structure, the transistor 200 can have high on-state current and high frequency characteristics.

When the oxide 230a and the oxide 230b contain a common element as the main component besides oxygen, the density of defect states at the interface between the oxide 230a and the oxide 230b can be low. This reduces the influence of interface scattering on carrier conduction, and the transistor 200 can have a high on-state current and high frequency characteristics.

Specifically, as the oxide 230a, a metal oxide having an atomic ratio of In:M:Zn=1:3:2 or a neighborhood thereof, In:M:Zn=1:3:4 or a neighborhood thereof, or In:M:Zn=1:1:0.5 or a neighborhood thereof can be used. As the oxide 230b, a metal oxide having an atomic ratio of In:M:Zn=1:1:1 or a neighborhood thereof, In:M:Zn=1:1:1.2 or a neighborhood thereof, In:M:Zn=1:1:2 or a neighborhood thereof, or In:M:Zn=4:2:3 or a neighborhood thereof can be used. Note that the neighborhood of an atomic ratio includes ±30% of an intended atomic ratio. Gallium is preferably used as the element M. In the case where a single layer of the oxide 230b is provided as the oxide 230, metal oxide that can be used as the oxide 230a may be used as the oxide 230b. The compositions of the metal oxide that can be used as the oxide 230a and the oxide 230b are not limited to the above. For example, the composition of metal oxide that can be used as the oxide 230a can be applied to the oxide 230b. Similarly, the composition of metal oxide that can be used as the 230b can be applied to the oxide 230a.

When the metal oxide is deposited by a sputtering method, the above atomic ratio is not limited to the atomic ratio of the deposited metal oxide and may be the atomic ratio of a sputtering target used for depositing the metal oxide.

The oxide 230b preferably exhibits crystallinity. In particular, as the oxide 230b, a c-axis-aligned crystalline oxide semiconductor (CAAC-OS) is preferably used.

The CAAC-OS is a metal oxide having a dense structure with high crystallinity and a low amount of impurities and defects (e.g., oxygen vacancies). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. As the density of the CAAC-OS is increased in such a manner, diffusion of impurities or oxygen in the CAAC-OS can be further reduced.

In the CAAC-OS, a reduction in electron mobility due to a crystal grain boundary is less likely to occur because it is difficult to observe a clear crystal grain boundary. Thus, a metal oxide including the CAAC-OS is physically stable. Accordingly, the metal oxide including the CAAC-OS is resistant to heat and has high reliability.

When an oxide having crystallinity, such as CAAC-OS, is used as the oxide 230b, oxygen extraction from the oxide 230b by source or drain electrodes can be inhibited. In this case, extraction of oxygen from the oxide 230b can be inhibited even when heat treatment is performed; hence, the transistor 200 is stable against high temperatures in the manufacturing process (i.e., thermal budget).

If impurities and oxygen vacancies exist in a channel formation region of an oxide semiconductor, a transistor including the oxide semiconductor might have variable electrical characteristics and poor reliability. In some cases, a defect that is an oxygen vacancy into which hydrogen enters (hereinafter also referred to as VoH in some cases) generates an electron serving as a carrier. Therefore, when the channel formation region in the oxide semiconductor includes oxygen vacancies, the transistor tends to have normally-on characteristics (the channel is generated even when no voltage is applied to the gate electrode and current flows through the transistor). Thus, impurities, oxygen vacancies, and VoH are preferably reduced as much as possible in the channel formation region in the oxide semiconductor. In other words, the channel formation region in the oxide semiconductor is an i-type (intrinsic) or substantially i-type region with a low carrier concentration.

By contrast, when an insulator containing oxygen that is released by heating (hereinafter sometimes referred to as excess oxygen) is provided in the vicinity of the oxide semiconductor and heat treatment is performed, oxygen can be supplied from the insulator to the oxide semiconductor so as to reduce oxygen vacancies and VoH. Note that too much oxygen supplied to the source region or the drain region might cause a decrease in the on-state current or the field-effect mobility of the transistor 200. Furthermore, a variation in the amount of oxygen supplied to the source region or the drain region in the substrate plane leads to variations in characteristics of the semiconductor device including the transistor. When oxygen supplied from the insulator to the oxide semiconductor diffuses into a conductor such as the gate electrode, the source electrode, or the drain electrode, the conductor might be oxidized and the conductivity might be impaired, for example, so that electrical characteristics and reliability of the transistor might be adversely affected.

Therefore, the oxide semiconductor preferably includes an i-type or substantially i-type channel formation region with a low carrier concentration and n-type source and drain regions with a high carrier concentration. That is, the amounts of oxygen vacancies and VoH in the channel formation region of the oxide semiconductor are preferably reduced. Excessive supply of oxygen to the source and drain regions and excessive reduction in the amount of VoH in the source and drain regions are preferably inhibited. Furthermore, a reduction in the conductivity of the conductors 260, 242a, and 242b and the like is preferably inhibited. For example, oxidation of the conductors 260, 242a, and 242b, and the like is preferably inhibited. Note that hydrogen in an oxide semiconductor can form VoH; thus, the hydrogen concentration needs to be reduced in order to reduce the amount of VoH.

The semiconductor device of this embodiment has a structure in which the hydrogen concentration in the channel formation region is reduced, oxidation of the conductor 242a, the conductor 242b, and the conductor 260 is inhibited, and the hydrogen concentration in the source and drain regions is inhibited from being reduced.

The insulator 250 in contact with the channel formation region of the oxide 230b preferably has a function of capturing or fixing hydrogen. Thus, the hydrogen concentration in the channel formation region of the oxide 230b can be reduced. Accordingly, VoH in the channel formation region can be reduced, so that the channel formation region can be an i-type or substantially i-type region.

Figure 2A:
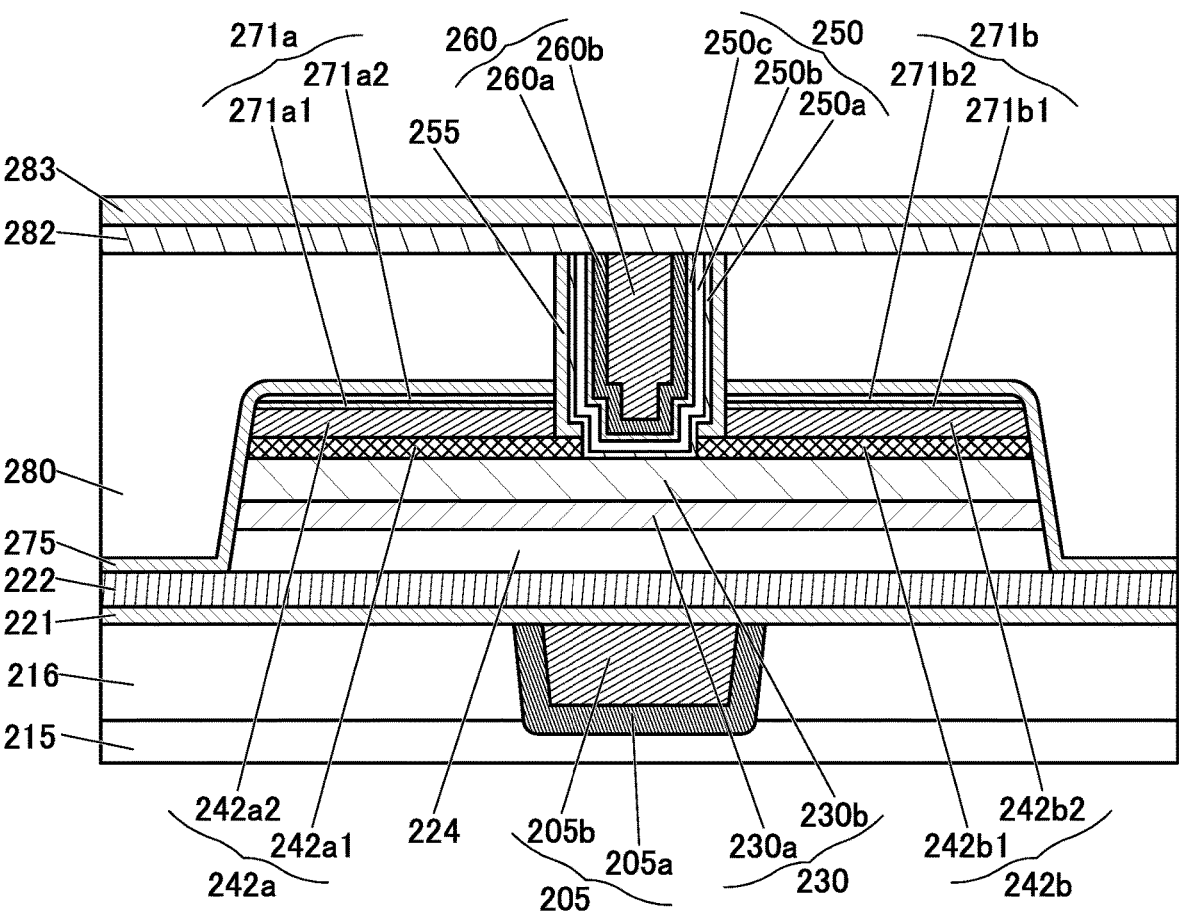
FIGS. 2A and 2B are cross-sectional views illustrating an example of a semiconductor device.

Here, as illustrated in FIG. 2A, the insulator 250 preferably has a stacked-layer structure including an insulator 250a in contact with the oxide 230, an insulator 250b over the insulator 250a, and an insulator 250c over the insulator 250b. In that case, the insulator 250a preferably has a function of capturing or fixing hydrogen.

An example of the insulator having a function of capturing or fixing hydrogen is metal oxide having an amorphous structure. As the insulator 250a, for example, metal oxide, such as magnesium oxide or oxide containing aluminum and/or hafnium, is preferably used. In such metal oxide having an amorphous structure, an oxygen atom has a dangling bond with which hydrogen is trapped or fixed in some cases. That is, the metal oxide having an amorphous structure has high capability of capturing or fixing hydrogen.

Moreover, a high dielectric constant (high-k) material is preferably used for the insulator 250a. An example of the high-k material is oxide containing aluminum and/or hafnium. With use of the high-k material for the insulator 250a, a gate potential applied during operation of the transistor can be reduced while the physical thickness of the gate insulator is maintained. In addition, the equivalent oxide thickness (EOT) of the insulator functioning as the gate insulator can be reduced.

As described above, oxide containing aluminum and/or hafnium is preferably used for the insulator 250a, and more preferably, oxide containing aluminum and/or hafnium and having an amorphous structure is used. Since aluminum oxide can be formed as an amorphous film relatively easily by an ALD method, use of aluminum oxide having an amorphous structure is further preferable. In this embodiment, an aluminum oxide film is used as the insulator 250a. In that case, the insulator 250a contains at least oxygen and aluminum. The aluminum oxide has an amorphous structure. In that case, the insulator 250a has an amorphous structure.

An insulator having thermal stability, such as silicon oxide or silicon oxynitride, is preferably used as the insulator 250b. Note that in this specification and the like, oxynitride refers to a material that contains more oxygen than nitrogen, and nitride oxide refers to a material that contains more nitrogen than oxygen. For example, silicon oxynitride refers to a material that contains more oxygen than nitrogen, and silicon nitride oxide refers to a material that contains more nitrogen than oxygen.

Figures 3A, 3B, 3C:
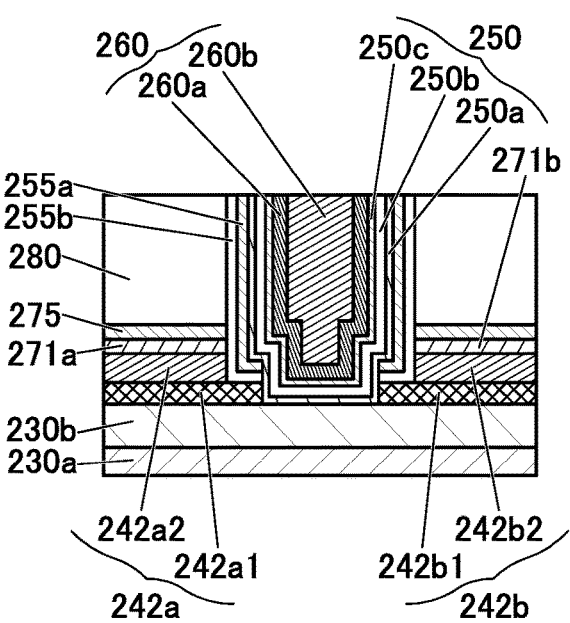
FIGS. 3A to 3C are cross-sectional views illustrating examples of a semiconductor device.
Figure 5A:
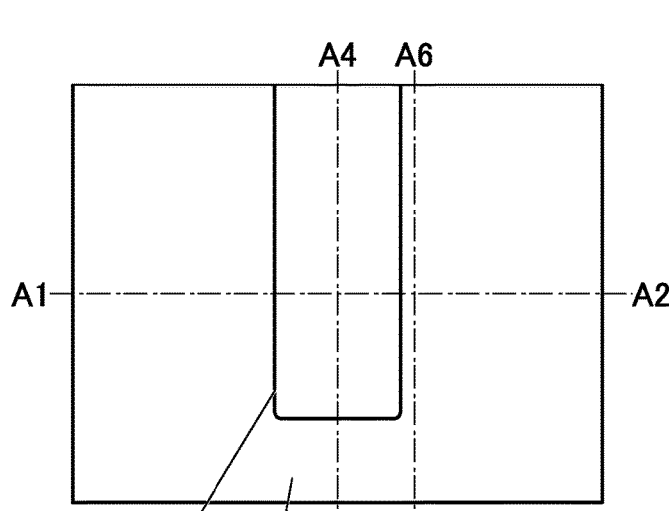
FIG. 5A is a plan view illustrating an example of a manufacturing method of a semiconductor device.
Figure 5C:
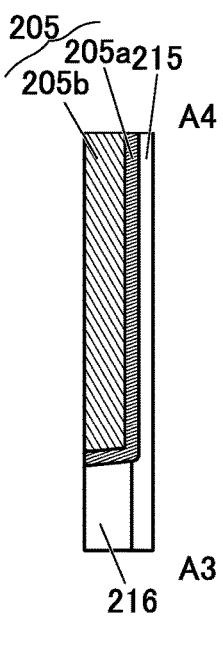
FIGS. 5B to 5D are cross-sectional views illustrating the example of a manufacturing method of a semiconductor device.
Figure 5B:
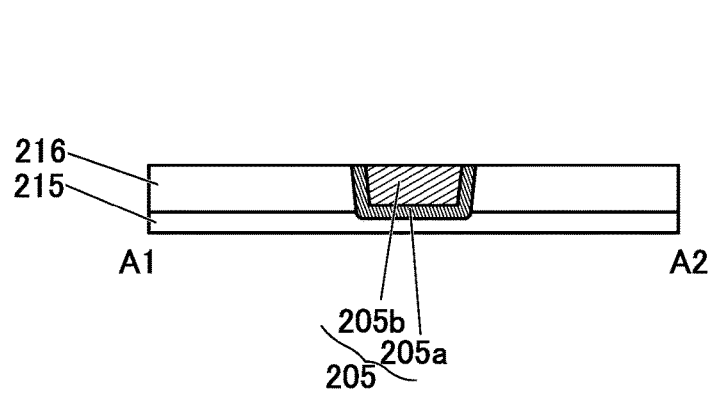
Figure 5D:
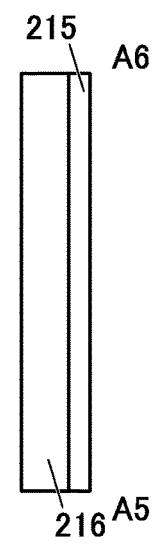
Figure 6A:
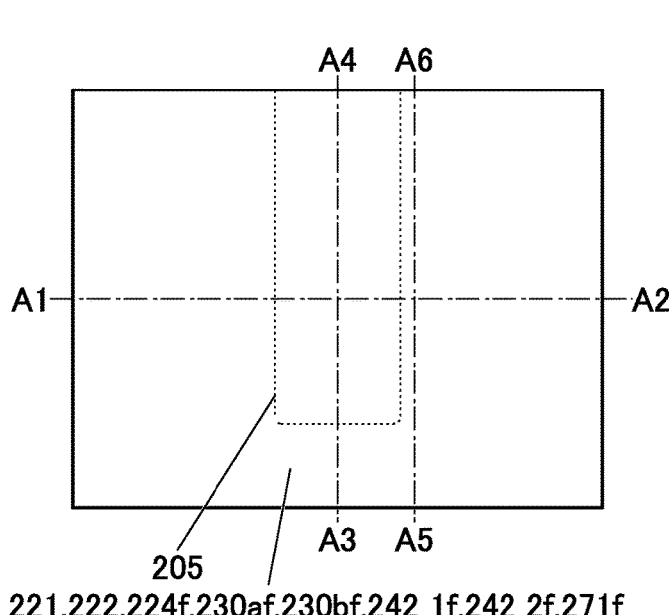
FIG. 6A is a plan view illustrating an example of a manufacturing method of a semiconductor device.
Figure 6B:
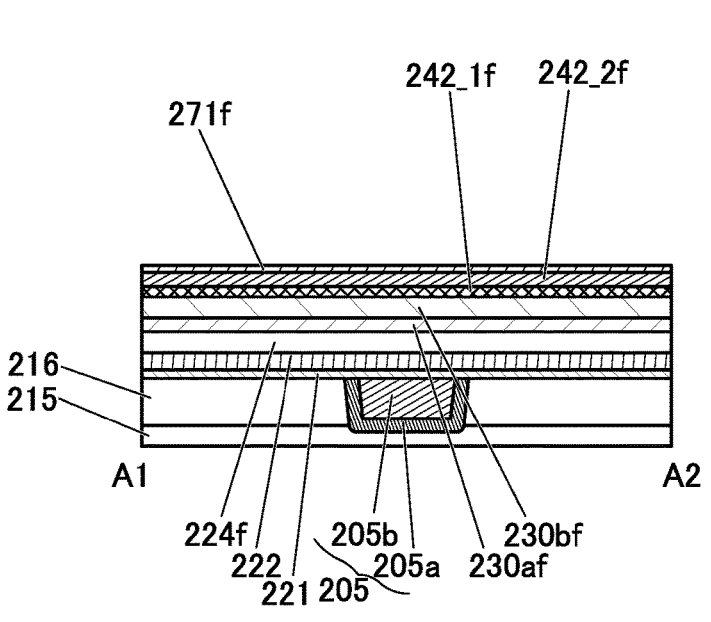
FIGS. 6B to 6D are cross-sectional views illustrating the example of a manufacturing method of a semiconductor device.
Figure 6C:
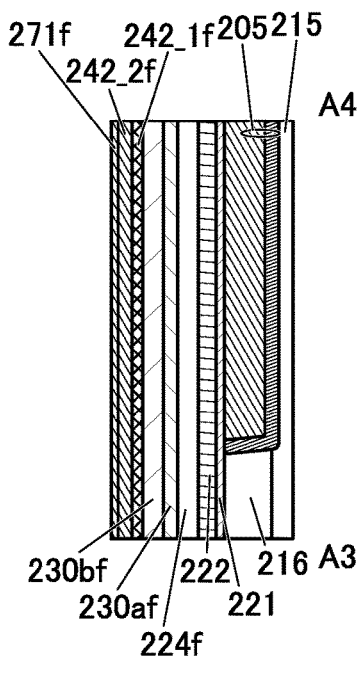
Figure 6D:
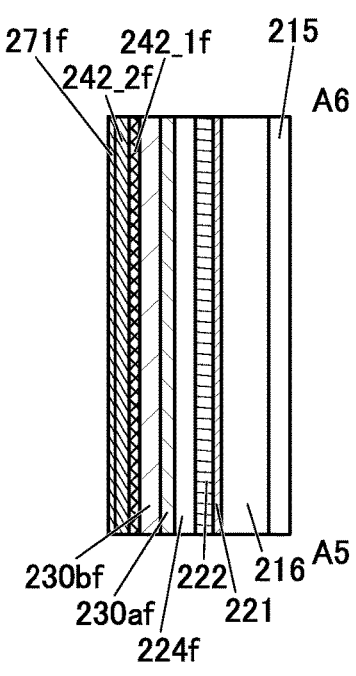

As illustrated in FIG. 3B, an insulator 250d may be provided over the insulator 250b. In that case, an insulator that can be used as the insulator 250a can be provided as the insulator 250d. For example, hafnium oxide can be used as the insulator 250d. Here, when the insulator 250d is provided between the insulator 250c and the insulator 250b, hydrogen contained in the insulator 250b and the like can be captured or fixed more effectively.

In order to inhibit oxidation of the conductors 242a, 242b, and 260, a barrier insulator against oxygen is preferably provided in the vicinity of each of the conductors 242a, 242b, and 260. In the semiconductor device described in this embodiment, the insulators correspond to, for example, the insulator 250a, the insulator 250c, the insulator 250d, the insulator 255, and the insulator 275.

Note that in this specification and the like, a barrier insulator refers to an insulator having a barrier property. In this specification and the like, "having a barrier property" means having a property of hindering the permeation of a target substance (also referred to as having a low permeability). For example, an insulator having a barrier property hardly allows a target substance to diffuse into the insulator. As another example, an insulator having a barrier property has a function of capturing or fixing (also referred to as gettering) a target substance in the insulator.

Examples of a barrier insulator against oxygen include oxide containing aluminum and/or hafnium, magnesium oxide, gallium oxide, indium gallium zinc oxide, silicon nitride, and silicon nitride oxide. Examples of the oxide containing aluminum and/or hafnium include aluminum oxide, hafnium oxide, oxide containing aluminum and hafnium (hafnium aluminate), and oxide containing hafnium and silicon (hafnium silicate). For example, each of the insulators 250a, 250c, 250d, 255, and 275 preferably has a single-layer structure or a stacked-layer structure of the barrier insulator against oxygen. For example, in the case where the insulator 255 has a stacked-layer structure, the insulator 255 can have a two-layer structure of an aluminum oxide film and a silicon nitride film over the aluminum oxide film.

The insulators 250a and 255 preferably have a barrier property against oxygen. The insulators 250a and 255 are preferably less permeable to oxygen than at least the insulator 280 is. The insulator 250a includes a region in contact with the side surface of the conductor 242a1 and the side surface of the conductor 242b1. The insulator 255 includes a region in contact with the top surface of the conductor 242a1, the top surface of the conductor 242b1, the side surface of the conductor 242a2, and the side surface of the conductor 242b2. The insulator 250a is in contact with the side surface of the insulator 255. When the insulators 250a and 255 have a barrier property against oxygen, oxidation of the side surfaces of the conductors 242a and 242b and formation of oxide films on the side surfaces can be prevented. Accordingly, a reduction in on-state current or field-effect mobility of the transistor 200 can be inhibited.

The insulator 250a is provided in contact with the top surface and the side surface of the oxide 230b, the side surface of the oxide 230a, the side surface of the insulator 224, and the top surface of the insulator 222. When the insulator 250a has a barrier property against oxygen, release of oxygen from the channel formation region of the oxide 230b caused by heat treatment or the like can be prevented. Thus, oxygen vacancies formed in the oxides 230a and 230b can be reduced.

By providing the insulators 250a and 255, even when the insulator 280 contains an excess amount of oxygen, excessive supply of oxygen to the oxides 230a and 230b can be prevented and an appropriate amount of oxygen can be supplied to the oxides 230a and 230b. Thus, excessive oxidation of the source and drain regions can be prevented, and a reduction in on-state current or field-effect mobility of the transistor 200 can be inhibited.

Oxide containing aluminum and/or hafnium has a barrier property against oxygen and thus can be suitably used for the insulator 250a.

Silicon nitride also has a barrier property against oxygen and thus can be suitably used for the insulator 255. In that case, the insulator 255 contains at least nitrogen and silicon. The insulator 255 preferably has a barrier property against hydrogen. Accordingly, impurities contained in the conductors 242a2 and 242b2, such as hydrogen, can be prevented from diffusing into the oxide 230b.

The insulator 250c also preferably has a barrier property against oxygen. The insulator 250c is provided between the conductor 260 and the channel formation region of the oxide 230 and between the insulator 280 and the conductor 260. Such a structure can prevent oxygen contained in the channel formation region of the oxide 230 from diffusing into the conductor 260 and thus can prevent formation of oxygen vacancies in the channel formation region of the oxide 230. Oxygen contained in the oxide 230 and oxygen contained in the insulator 280 can be prevented from diffusing into the conductor 260 and oxidizing the conductor 260. The insulator 250c is preferably less permeable to oxygen than at least the insulator 280 is. For example, a silicon nitride film is preferably used for the insulator 250c. In that case, the insulator 250c contains at least nitrogen and silicon.

The insulator 250c preferably has a barrier property against hydrogen. This can prevent diffusion of impurities contained in the conductor 260, such as hydrogen, into the oxide 230b.

The insulator 275 also preferably has a barrier property against oxygen. The insulator 275 is provided between the insulator 280 and the conductor 242a and between the insulator 280 and the conductor 242b. This structure can prevent diffusion of oxygen contained in the insulator 280 into the conductors 242a and 242b. Accordingly, oxidation of the conductors 242a and 242b by oxygen contained in the insulator 280 can be inhibited, so that an increase in resistivity and a reduction in on-state current due to the oxidation can be prevented. The insulator 275 is preferably less permeable to oxygen than at least the insulator 280 is. For example, a silicon nitride film is preferably used for the insulator 275. In that case, the insulator 275 contains at least nitrogen and silicon.

In order to prevent a reduction in hydrogen concentration in the source and drain regions in the oxide 230, a barrier insulator against hydrogen is preferably provided in the vicinity of each of the source and drain regions. In the semiconductor device described in this embodiment, the barrier insulator against hydrogen is, for example, the insulator 275.

Examples of the barrier insulator against hydrogen include oxide such as aluminum oxide, hafnium oxide, and tantalum oxide and nitride such as silicon nitride. For example, the insulator 275 preferably has a single-layer structure or a stacked-layer structure of the above barrier insulator against hydrogen.

Providing the insulator 275 described above can reduce the amount of hydrogen diffusing from the source and drain regions into the outside, so that a reduction in the hydrogen concentration in the source and drain regions can be inhibited. Thus, the source and drain regions can be n-type regions.

With the above structure, the i-type or substantially i-type channel formation region and the n-type source and drain regions can be formed; therefore, a semiconductor device with favorable electrical characteristics can be provided. The semiconductor device with the above structure can have favorable electrical characteristics even when being miniaturized or highly integrated. Furthermore, miniaturization of the transistor 200 can improve the frequency characteristics. Specifically, the cutoff frequency can be improved.

The insulators 250a to 250d function as a part of the first gate insulator. The insulators 250a to 250d are provided together with the insulator 255 and the conductor 260 in the opening formed in the insulator 280. The thickness of each of the insulators 250a to 250d is preferably small for miniaturization of the transistor 200. The thickness of each of the insulators 250a to 250d is preferably greater than or equal to 0.1 nm and less than or equal to 10 nm, further preferably greater than or equal to 0.1 nm and less than or equal to 5.0 nm, further preferably greater than or equal to 0.5 nm and less than or equal to 5.0 nm, further preferably greater than or equal to 1.0 nm and less than 5.0 nm, further preferably greater than or equal to 1.0 nm and less than or equal to 3.0 nm. Note that each of the insulators 250a to 250d at least partly includes a region with the above thickness.

In order that the insulators 250a to 250d have small thicknesses as described above, an atomic layer deposition (ALD) method is preferably employed. Furthermore, in the case where the insulators 250a to 250d and the insulator 255 are provided in the opening in the insulator 280 and the like, an ALD method is preferably employed. Examples of the ALD method include a thermal ALD method, in which a precursor and a reactant react with each other only by a thermal energy, and a plasma-enhanced ALD (PEALD) method, in which a reactant excited by plasma is used. A PEALD method utilizing plasma is preferable, in which case deposition at lower temperatures is possible in some cases.

An ALD method enables a single atomic layer to be formed at a time, and has various advantages such as deposition of an extremely thin film, deposition on a component with a high aspect ratio, deposition of a film with few defects such as pinholes, deposition of a film with excellent coverage, and low-temperature deposition. Thus, the insulators 255 and 250 can be formed with small thicknesses and high coverage on the side surface of the opening formed in the insulator 280, the side surfaces of the conductors 242a and 242b, and the like.

Note that a precursor used in the ALD method sometimes contains impurities such as carbon. Thus, a film formed by the ALD method may contain impurities such as carbon in a larger amount than a film formed by another deposition method. Note that impurities can be quantified by secondary ion mass spectrometry (SIMS), X-ray photoelectron spectroscopy (XPS), or auger electron spectroscopy (AES).

Although the case where the insulator 250 has a three-layer structure of the insulators 250a to 250c or a four-layer structure of the insulators 250a to 250d is described above, the present invention is not limited to these structures. The insulator 250 can have a structure including at least one of the insulators 250a to 250d. When the insulator 250 is formed using one, two, or three layers selected from the insulators 250a to 250d, the manufacturing process of the semiconductor device can be simplified and the productivity can be improved.

For example, as illustrated in FIG. 3A, the insulator 250 may have a two-layer structure. In that case, the insulator 250 preferably has a stacked-layer structure of the insulator 250a and the insulator 250c over the insulator 250a. A high-k material can be used for at least one of the insulators 250a and 250c. Thus, the equivalent oxide thicknesses (EOT) of the insulators 250a and 250c can be reduced while the thickness thereof is kept large enough to prevent leakage current.

In addition to the above structure, the semiconductor device of this embodiment preferably has a structure in which hydrogen is prevented from entering the transistor 200 and the like. For example, an insulator having a function of preventing diffusion of hydrogen is preferably provided over and/or below the transistor 200 and the like. In the semiconductor device described in this embodiment, the insulator corresponds to, for example, the insulator 283, the insulator 282, the insulator 222, and the insulator 221. The insulator 215 provided below the transistor 200 may have a structure similar to the structure(s) of the insulator 282 and/or the insulator 283. In that case, the insulator 215 may have a stacked-layer structure of the insulator 282 and the insulator 283; the insulator 283 may be positioned over the insulator 282 or the insulator 282 may be positioned over the insulator 283.

At least one of the insulators 283, 282, 222, and 221 preferably functions as a barrier insulator that inhibits diffusion of impurities such as water and hydrogen from the substrate side or from above the transistor 200 and the like into the transistor 200 and the like. Therefore, at least one of the insulators 283, 282, 222, and 221 preferably includes an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom, that is, an insulating material through which the above impurities are less likely to pass. Alternatively, at least one of the insulators 283, 282, 222, and 221 preferably includes an insulating material having a function of inhibiting diffusion of oxygen (e.g., at least one of an oxygen atom, a oxygen molecule, and the like), that is, an insulating material which is less likely to transmit the oxygen.

Each of the insulators 283, 282, 222, and 221 preferably includes an insulator having a function of preventing diffusion of oxygen and impurities such as water and hydrogen. Examples of the insulator include aluminum oxide, magnesium oxide, hafnium oxide, zirconium oxide, oxide containing aluminum and hafnium (hafnium aluminate), oxide containing hafnium and zirconium (hafnium zirconium oxide), gallium oxide, indium gallium zinc oxide, silicon nitride, and silicon nitride oxide. For example, silicon nitride, which has a higher hydrogen barrier property, is preferably used for the insulators 283 and 221. For example, aluminum oxide, which has high capability of capturing or fixing hydrogen, is preferably used for the insulator 282. For example, hafnium oxide, which has high capability of capturing or fixing hydrogen and is a high dielectric constant (high-k) material, is preferably used for the insulator 222.

Such a structure can prevent impurities such as water and hydrogen from diffusing from an interlayer insulating film or the like positioned above the insulator 283 into the transistor 200 or the like. Furthermore, impurities such as water and hydrogen can be prevented from diffusing from an interlayer insulating film or the like positioned below the insulator 221 into the transistor 200 or the like. Moreover, hydrogen contained in the insulators 280, 224, and 250, and the like can be captured and fixed in the insulator 282 or the insulator 222. Providing the insulators 282 and 283 can inhibit oxygen contained in the insulator 280 and the like from diffusing above the transistor 200 or the like. Providing the insulators 222 and 221 can prevent oxygen contained in the insulator 224 and the like from diffusing below the transistor 200 or the like. With such a structure where the transistor 200 is surrounded by insulators having a function of preventing diffusion of oxygen and impurities such as water and hydrogen, excess oxygen and excess hydrogen can be prevented from diffusing into the oxide semiconductor. Therefore, the electrical characteristics and reliability of the semiconductor device can be improved.

Moreover, silicon nitride, which has a high hydrogen barrier property, is preferably used for the insulators 255, 275, and 250c. Aluminum oxide, which has high capability of capturing or fixing hydrogen, is preferably used for the insulator 250a.

Here, it is preferable that a region of the insulator 275 not overlapping with the oxide 230 be in contact with the insulator 222, a side end portion of the insulator 275 be in contact with the insulator 255, and an upper end portion of the insulator 255 and upper end portions of the insulators 250a to 250c be in contact with the insulator 282. With the above structure, in a region sandwiched between the insulator 283 and the insulator 221, the insulator 280 is separated from the oxide 230 by the insulator 275, the insulator 280 is separated from the insulator 250b by the insulators 255 and 250a, the conductor 260 is separated from the insulator 250b by the insulator 250c, and the conductors 242a2 and 242b2 are separated from the insulator 250b by the insulators 255 and 250a.

Thus, diffusion of impurities such as water and hydrogen contained in the insulator 280 can be prevented from diffusing into the oxides 230 and 250b. Impurities such as water and hydrogen contained in the conductor 260 can be prevented from diffusing into the oxide 230 through the insulator 250b. Impurities such as water and hydrogen contained in the conductors 242a2 and 242b2 can be prevented from diffusing into the oxide 230 through the insulator 250b. For example, even when a contact plug is formed in contact with top surfaces of the conductors 242a2 and 242b2 and impurities such as water and hydrogen diffuse into the conductors 242a2 and 242b2 through the contact plug, the amount of impurities such as water and hydrogen diffusing into the oxide 230 can be reduced. Hydrogen contained in the insulators 250a and 250b can be captured and fixed in the insulator 282. With such a structure, the amount of hydrogen diffusing into the oxide semiconductor can be further reduced. Therefore, the electrical characteristics and reliability of the semiconductor device can be improved.

In the transistor 200, the conductor 205 is provided to overlap with the oxide 230 and the conductor 260. Here, the conductor 205 is preferably provided to fill an opening formed in the insulator 216. The conductor 205 is preferably provided to extend in the channel width direction as illustrated in FIGS. 1A and 1C. With such a structure, the conductor 205 functions as a wiring when a plurality of transistors are provided.

As illustrated in FIGS. 1B and 1C, the conductor 205 preferably includes the conductors 205a and 205b. The conductor 205a is provided in contact with a bottom surface and a sidewall of the opening. The conductor 205b is provided to fill a depressed portion formed by the conductor 205a formed along the opening. Here, the top surface of the conductor 205 is level or substantially level with the top surface of the insulator 216.

Here, the conductor 205a preferably includes a conductive material having a function of inhibiting diffusion of impurities such as hydrogen atoms, hydrogen molecules, water molecules, nitrogen atoms, nitrogen molecules, nitrogen oxide molecules (e.g., $N_2O$, $NO$, and $NO_2$), and copper atoms. Alternatively, the conductor 205a preferably includes a conductive material having a function of inhibiting diffusion of oxygen (e.g., at least one of oxygen atoms and oxygen molecules).

When the conductor 205a is formed using a conductive material having a function of inhibiting diffusion of hydrogen, impurities such as hydrogen contained in the conductor 205b can be prevented from diffusing into the oxide 230 through the insulator 216 and the like. When a conductive material having a function of inhibiting oxygen diffusion is used for the conductor 205a, a reduction in conductivity of the conductor 205b due to oxidation of the conductor 205b can be inhibited. Examples of the conductive material having a function of inhibiting diffusion of oxygen include titanium, titanium nitride, tantalum, tantalum nitride, ruthenium, and ruthenium oxide. The conductor 205a can have a single-layer structure or a stacked-layer structure of the above conductive material. For example, the conductor 205a preferably contains titanium nitride.

A conductive material containing tungsten, copper, or aluminum as its main component is preferably used for the conductor 205b. For example, the conductor 205b preferably contains tungsten.

The conductor 205 can function as a second gate electrode. In that case, by changing a potential applied to the conductor 205 independently of a potential applied to the conductor 260, the threshold voltage ($V_{th}$) of the transistor 200 can be controlled. In particular, by applying a negative potential to the conductor 205, $V_{th}$ of the transistor 200 can be higher, and its off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. The insulator 216 with a reduced thickness contains a smaller absolute amount of impurities such as hydrogen, inhibiting the diffusion of the impurity into the oxide 230.

Although the stacked-layer structure of the conductor 205a and the conductor 205b is described above, the present invention is not limited to this structure. The conductor 205 may have a single-layer structure or a stacked-layer structure of three or more layers. For example, in the case where the conductor 205 has a three-layer structure, a conductor that contains the same material as the conductor 205a can be further provided over the conductor 205b of the above-described stacked-layer structure of the conductors 205a and 205b. At this time, a top surface of the conductor 205b is positioned lower than an uppermost portion of the conductor 205a, and the conductor may be formed to fill the depressed portion formed by the conductors 205a and 205b.

The insulator 224, the insulator 221, and the insulator 222 function as a second gate insulator.

The insulator 224 in contact with the oxide 230 preferably contains, for example, silicon oxide or silicon oxynitride. Accordingly, oxygen can be supplied from the insulator 224 to the oxide 230, so that oxygen vacancies can be reduced.

The insulator 224 is preferably processed into an island shape in a manner similar to that of the oxide 230. Thus, in the case where the plurality of transistors 200 are provided, the insulator 224 having a size substantially the same as that of the transistors 200 is provided for one transistor 200. Accordingly, among the transistors 200, the amount of oxygen supplied from the insulator 224 to the oxide 230 is substantially the same. Therefore, variations in electrical characteristics of the transistors 200 in the substrate plane can be reduced. Note that the structure is not limited to this, and a structure in which like the insulator 222, the insulator 224 is not patterned can be employed.

Note that the insulator 224 may have a stacked-layer structure of two or more layers. In that cases, without limitation to a stacked-layer structure formed of the same material, a stacked-layer structure formed of different materials may be employed.

A conductive material that is less likely to be oxidized or a conductive material having a function of preventing diffusion of oxygen is preferably used for the conductors 242a, 242b, and 260. Examples of the conductive material include a conductive material containing nitrogen and a conductive material containing oxygen. Thus, a decrease in conductivity of the conductors 242a, 242b, and 260 can be inhibited. In the case where a conductive material containing metal and nitrogen is used for the conductors 242a, 242b, and 260, the conductors 242a, 242b, and 260 contain at least metal and nitrogen.

FIG. 1B illustrates the conductors 242a and 242b each having a two-layer structure. The conductor 242a is a stacked-layer film of the conductor 242a1 and the conductor 242a2 over the conductor 242a1. The conductor 242b is a stacked-layer film of the conductor 242b1 and the conductor 242b2 over the conductor 242b1. At this time, for a layer (the conductors 242a1 and 242b1) in contact with the oxide 230b, a conductive material that is less likely to be oxidized or a conductive material having a function of preventing diffusion of oxygen is preferably used. Thus, a decrease in conductivity of the conductors 242a and 242b can be inhibited. Oxygen is prevented from being extracted from the oxide 230b, that is, an excessive amount of oxygen vacancies can be prevented from being formed. For a layer (the conductors 242a1 and 242b1) in contact with the oxide 230b, a material that is likely to absorb (extract) hydrogen is preferably used, in which case the hydrogen concentration in the oxide 230 can be reduced.

For the conductors 242a1 and 242b1, metal nitride is preferably used; for example, a nitride containing tantalum, a nitride containing titanium, a nitride containing molybdenum, a nitride containing tungsten, a nitride containing tantalum and aluminum, or a nitride containing titanium and aluminum is preferably used. In one embodiment of the present invention, a nitride containing tantalum is particularly preferable. As another example, ruthenium, ruthenium oxide, ruthenium nitride, an oxide containing strontium and ruthenium, or an oxide containing lanthanum and nickel may be used. These materials are preferable because they are conductive materials that are not easily oxidized or a material that maintains the conductivity even when absorbing oxygen.

Note that hydrogen contained in the oxide 230b or the like diffuses into the conductor 242a1 or 242b1 in some cases. In particular, when a nitride containing tantalum is used for the conductors 242a1 and 242b1, hydrogen contained in the oxide 230b or the like is likely to diffuse into the conductor 242a1 or 242b1, and the diffused hydrogen is bonded to nitrogen contained in the conductor 242a1 or 242b1 in some cases. That is, hydrogen contained in the oxide 230b or the like is sometimes absorbed by the conductor 242a1 or 242b1.

The conductors 242a2 and 242b2 preferably have higher conductivity than the conductors 242a1 and 242b1. For example, the conductors 242a2 and 242b2 preferably have a larger thickness than the conductors 242$a$1 and 242$b$1. For the conductors 242$a$2 and 242$b$2, a conductor that can be used as the conductor 205$b$ may be used. The above-described structure can reduce the resistance of the conductors 242$a$2 and 242$b$2. As a result, the operation speed of the semiconductor device of this embodiment can be improved.

For example, tantalum nitride or titanium nitride can be used for the conductors 242$a$1 and 242$b$1, and tungsten can be used for the conductors 242$a$2 and 242$b$2.

To inhibit a decrease in the conductivity of the conductors 242$a$ and 242$b$, oxide having crystallinity, such as a CAAC-OS, is preferably used as the oxide 230$b$. Specifically, metal oxide containing one or more selected from indium, zinc, gallium, aluminum, and tin is preferably used. The use of CAAC-OS can inhibit the conductor 242$a$ or the conductor 242$b$ from extracting oxygen from the oxide 230$b$. Furthermore, a decrease in the conductivity of the conductors 242$a$ and 242$b$ can be inhibited.

As illustrated in FIGS. 1B and 1C, the insulator 255 is provided in the opening formed in the insulator 280 and the like, and in contact with the side surface of the insulator 280, a side surface of the insulator 275, a side surface of the insulator 271$a$, a side surface of the insulator 271$b$, a side surface of the conductor 242$a$2, a side surface of conductor 242$b$2, the top surface of the conductor 242$a$1, the top surface of the conductor 242$b$1, and the top surface of the insulator 222. In other words, the insulator 255 is formed in a sidewall shape to be in contact with a sidewall of the opening formed in the insulator 280 and the like. Note that the insulator 255 includes a projecting portion in contact with the top surface of the conductor 242$a$1, the top surface of the conductor 242$b$1, or the top surface of the insulator 222 to project toward the center of the opening beyond the other portion of the insulator 255.

The insulator 255 is formed in contact with the side surface of the conductor 242$a$2 and the side surface of the conductor 242$b$2, and is an inorganic insulator that protects the conductors 242$a$2 and 242$b$2. The insulator 255 is preferably an inorganic insulator that is less likely to be oxidized because it is exposed to an oxidation atmosphere. Furthermore, the insulator 255 is preferably an inorganic insulator that is less likely to oxidize the conductors 242$a$2 and 242$b$2 because it is in contact with the conductors 242$a$2 and 242$b$2. Therefore, for the insulator 255, an insulating material that can be used for the insulator 250$c$ having a barrier property against oxygen is preferably used. For example, silicon nitride can be used for the insulator 255.

With the insulator 255 described above, even when heat treatment is performed in an atmosphere containing oxygen after the separation of the conductor into the conductors 242$a$1 and 242$b$1 and before the formation of the insulator 250, the conductors 242$a$2 and 242$b$2 are not excessively oxidized.

The thickness of the insulator 255 is preferably greater than or equal to 0.5 nm and less than or equal to 20 nm, further preferably greater than or equal to 0.5 nm and less than or equal to 10 nm, further preferably greater than or equal to 0.5 nm and less than or equal to 3 nm. When the insulator 255 has a thickness in the above range, excessive oxidation of the conductors 242$a$2 and 242$b$2 can be prevented. Note that the insulator 255 at least partly has a region with the above thickness. Since the insulator 255 is provided in contact with the sidewall of the opening formed in the insulator 280 and the like, the insulator 255 is preferably formed by a method capable of depositing a film with good coverage, such as an ALD method. When the thickness of the insulator 255 is set excessively large, the time for forming the insulator 255 by an ALD method is long, which decreases the productivity; for this reason, the thickness of the insulator 255 is preferably in the above range. Here, the thickness of the insulator 255 corresponds to the thickness of a portion above the projecting portion of the insulator 255 in the A1-A2 direction.

The insulator 255 may have a stacked-layer structure of two or more layers. In that case, at least one of the stacked layers is the above-described inorganic insulator that is less likely to be oxidized. For example, a stacked-layer structure of an insulator 255$b$ and an insulator 255$a$ over the insulator 255$b$ as illustrated in FIG. 3C may be employed. The insulator 255$a$ can be regarded as being provided on the inner side of the insulator 255$b$. Here, a bottom surface of the insulator 255$a$ is in contact with the insulator 255$b$ in some cases. The inorganic insulator that is less likely to be oxidized may be used for the insulator 255$a$, and an insulator that can be used for the insulator 250$b$ (e.g., silicon oxide) may be used for the insulator 255$b$. The dielectric constant of the insulator 255$b$ is preferably lower than that of the insulator 255$a$. In this manner, the insulator 255 has a two-layer structure to have a large thickness, so that the distance between the conductor 260 and the conductor 242$a$ or 242$b$ can be increased and thus the parasitic capacitance can be reduced.

The insulator 255 functions as a mask at the time of separating the conductor into the conductors 242$a$1 and 242$b$1. Thus, as illustrated in FIG. 1B and the like, in the cross-sectional view of the transistor 200, an end portion of the projecting portion of the insulator 255 is preferably aligned with a side end portion of the conductor 242$a$1 or a side end portion of the conductor 242$b$1.

In the case where the side end portions are aligned or substantially aligned with each other in a cross-sectional view and the case where top surface shapes are the same or substantially the same, it can be said that outlines of stacked layers at least partly overlap with each other in a top view. For example, the case where a lower part of a side end portion of an upper layer is in contact with an upper part of a side end portion of a lower layer is also included in the expression. For another example, the case of patterning or partly patterning an upper layer and a lower layer with the use of the same mask pattern is included in the expression. For another example, the case where a lower layer is processed using an upper layer as a mask is also included in the expression. The expression "side end portions are aligned or substantially aligned with each other" or "top surface shapes are the same or substantially the same" also includes the case where the outlines do not completely overlap with each other; for instance, a part of the upper layer may be positioned on the inner side or the outer side of the lower layer.

Figure 2B:
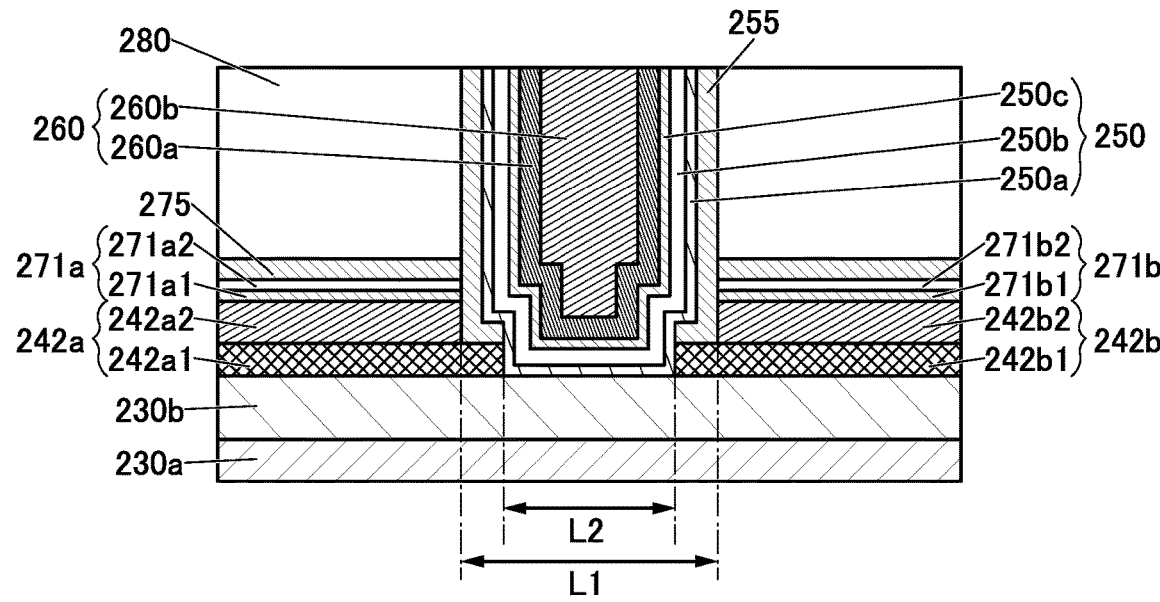

Here, a part of the conductor 242$a$1 having a top surface on which the insulator 255 is formed to extend beyond the conductor 242$a$2 toward the conductor 260 side. Similarly, a part of the conductor 242$b$1 having a top surface on which the insulator 255 is formed to extend beyond the conductor 242$b$2 toward the conductor 260 side. As illustrated in FIG. 2B, in a cross-sectional view of the transistor 200 in the channel length direction, the distance L2 between conductors 242$a$1 and 242$b$1 is smaller than the distance L1 between the conductors 242$a$2 and 242$b$2. Here, a difference between the distance L1 and the distance L2 can be twice or more times the thickness of the insulator 255.

Since the distance L2 between the conductors 242$a$1 and 242$b$1 is preferably short because the distance L2 reflects the channel length of the transistor 200. For example, the distance L2 is preferably less than or equal to 60 nm, less than or equal to 50 nm, less than or equal to 40 nm, less than or equal to 30 nm, less than or equal to 20 nm, or less than or equal to 10 nm, and greater than or equal to 1 nm or greater than or equal to 5 nm. For example, the distance L2 is preferably greater than or equal to 1 nm and less than or equal to 20 nm. With such a structure, the distance between the source and the drain can be shortened and the channel length can be shortened in accordance with the distance. Accordingly, the on-state current of the transistor 200 is increased and the subthreshold swing value (sometimes referred to as the S value) is reduced, so that the frequency characteristics can be improved. Here, the S value refers to the amount of change in a gate voltage in a subthreshold region, which is required for changing drain current by one digit at a constant drain voltage. By miniaturization of the semiconductor device in this manner, the semiconductor device can have improved operation speed.

As illustrated in FIG. 4A, a depression is sometimes formed in a portion of the oxide 230b that is exposed from the conductors 242a1 and 242b1. In other words, in a top surface of the oxide 230b, the level of a region sandwiched between the conductors 242a1 and 242b1 is lower than the level of a region overlapping with the conductor 242al and the level of a region overlapping with the conductor 242b1 in some cases.

In the transistor 200 illustrated in FIG. 2A, the side surface of the conductor 242a1 and the side surface of the conductor 242b1, which face to each other, and the side surface of the conductor 242a2 and the side surface of the conductor 242b2, which face to each other, are perpendicular or substantially perpendicular to the top surface of the oxide 230b; however, the present invention is not limited to this structure. For example, as illustrated in FIG. 4B, the facing side surfaces of the conductors 242a1 and 242b1 and the facing side surfaces of the conductors 242a2 and 242b2 may have tapered shapes. In that case, the side surfaces of the insulators 271a, 271b, 275, and 280 have tapered shapes in some cases.

The taper angles of the conductors 242a1 and 242b1 may be sharper than the taper angles of the conductors 242a2 and 242b2.

As illustrated in FIG. 4C, an upper portion of the side surface of the insulator 255 has a tapered shape in some cases. Furthermore, as illustrated in FIG. 4C, an upper portion of the insulator 280 has a tapered shape that continues to or substantially continues to the tapered shape of the side surface of the insulator 255 in some cases. As illustrated in FIG. 4C, an upper portion of the insulator 255 and an upper portion of the insulator 280 have curved surfaces in some cases. Here, the insulator 250a is sometimes in contact with the tapered shapes of the upper portions of the insulators 255 and 280. In that case, when the upper portions of the insulators 255 and 280 have curved surfaces, the insulator 250a can be formed with good coverage.

As illustrated in FIG. 4D, the transistor 200 may have the combined structures illustrated in FIGS. 4A to 4C. That is, in some cases, the oxide 230b includes a depression in a part exposed from the conductors 242a1 and 242b1, the side surfaces of the conductors 242a1 and 242b1 have tapered shapes, the side surfaces of the conductors 242a2 and 242b2 have tapered shapes, and the upper portion of the side surface of the insulator 255 has a tapered shape.

The insulators 271a and 271b function as an etching stopper at the time of processing the conductors 242a2 and 242b2, and are inorganic insulators that protect the conductors 242a2 and 242b2. Furthermore, the insulators 271a and 271b are preferably inorganic insulators that are less likely to oxidize the conductors 242a2 and 242b2 because the insulators 271a and 271b are in contact with the conductors 242a2 and 242b2. Thus, as illustrated in FIG. 2A, the insulator 271a preferably has a stacked-layer structure of an insulator 271a1 and an insulator 271a2 over the insulator 271a1 and the insulator 271b preferably has a stacked-layer structure of an insulator 271b1 and an insulator 271b2 over the insulator 271b1. Here, the nitride insulator that can be used as the insulator 250c is preferably used for the insulators 271a1 and 271b1, in which case the conductors 242a2 and 242b2 are less likely to be oxidized. The oxide insulator that can be used as the insulator 250b is preferably used as the insulators 271a2 and 271b2 so that the insulators 271a2 and 271b2 function as an etching stopper.

Here, the insulator 271a1 is in contact with atop surface of the conductor 242a2 and a part of the insulator 275, and the insulator 271b1 is in contact with a top surface of the conductor 242b2 and another part of the insulator 275. The insulator 271a2 is in contact with a top surface of the insulator 271a1 and a bottom surface of the insulator 275, and the insulator 271b2 is in contact with atop surface of the insulator 271b1 and another bottom surface of the insulator 275. For example, silicon nitride can be used for the insulators 271a1 and 271b1, and silicon oxide can be used for the insulators 271a2 and 271b2.

An insulator to be the insulators 271a and 271b functions as a mask for a conductor to be the conductors 242a and 242b, and thus the conductors 242a and 242b do not have a curved surface between the side surface and the top surface. Accordingly, an end portion at the intersection of the side surface and the top surface of each of the conductors 242a and 242b is angular. The cross-sectional area of each of the conductors 242a and 242b is larger in the case where the end portion at the intersection of the side surface and the top surface of each of the conductors 242a and 242b is angular than in the case where the end portion is rounded. Furthermore, when nitride insulator that is less likely to oxidize metal is used for the insulators 271a1 and 271b1, excessive oxidation of the conductors 242a and 242b can be prevented. The resistance of the conductors 242a and 242b is reduced in the above manner, so that the on-state current of the transistor can be increased.

As illustrated in FIGS. 1B and 1C, the conductor 260 is provided in the opening formed in the insulators 280 and 275. The conductor 260 is formed in the opening to cover the top surface of the insulator 222, the side surface of the insulator 224, the side surface of the oxide 230a, the side surface of the oxide 230b, and the top surface of the oxide 230b, with the insulator 250 positioned therebetween. The top surface of the conductor 260 is positioned to be substantially aligned with the uppermost portions of the insulators 250 and 255 and the top surface of the insulator 280.

Note that the sidewall of the opening in which the conductor 260 and the insulator 250 are formed may be perpendicular or substantially perpendicular to the top surface of the insulator 222 or may have a tapered shape. The sidewall with a tapered shape can improve the coverage with the insulators 255 and 250 and the like formed in the opening in the insulator 280, so that the number of defects such as voids can be reduced.

The conductor 260 functions as the first gate electrode of the transistor 200. Here, the conductor 260 is preferably provided to extend in the channel width direction as illustrated in FIGS. 1A and 1C. With such a structure, the conductor 260 functions as a wiring when a plurality of transistors are provided.

In the case where the above structure is employed, a curved surface may be provided between the side and top surfaces of the oxide 230b in a cross-sectional view in the channel width direction of the transistor 200, as illustrated in FIG. 1C. In other words, the end portion of the side surface and the end portion of the top surface may be curved (rounded).

The radius of curvature of the curved surface is preferably greater than 0 nm and less than the thickness of the oxide 230b in a region overlapping with the conductors 242a and 242b, or less than half of the length of a region of the top surface of the oxide 230b that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230b with the insulator 250 and the conductor 260.

Note that in this specification and the like, a transistor structure in which a channel formation region is electrically surrounded by at least the electric field of the first gate electrode is referred to as a surrounded channel (S-channel) structure. The S-channel structure disclosed in this specification and the like is different from a Fin structure or a planar structure. The S-channel structure disclosed in this specification and the like can be regarded as a kind of the Fin structure. In this specification and the like, the Fin structure refers to a structure in which at least two surfaces (specifically, two surfaces, three surfaces, four surfaces, or the like) of a channel are covered with a gate electrode. With the use of the Fin structure or the S-channel structure, a transistor with high resistance to a short-channel effect, i.e., a transistor in which a short-channel effect is less likely to occur, can be obtained.

When the transistor 200 has the above S-channel structure, the channel formation region can be electrically surrounded. Since the S-channel structure is a structure with the electrically surrounded channel formation region, the S-channel structure is, in a sense, equivalent to a gate all around (GAA) structure or a lateral gate all around (LGAA) structure. When the transistor 200 has any of an S-channel structure, a GAA structure, and an LGAA structure, the channel formation region formed at the interface between the oxide 230 and the gate insulator or in the vicinity thereof can correspond to the whole of bulk in the oxide 230. Consequently, the density of current flowing in the transistor can be improved, so that the on-state current or the field-effect mobility of the transistor can be increased.

In this embodiment, the insulator 224 is provided to have an island shape. Accordingly, as illustrated in FIG. 1C, at least a part of a bottom surface of the conductor 260 can be at a lower position than that at a bottom surface of the oxide 230b. Thus, the conductor 260 can be provided to face a top surface and a side surface of the oxide 230b, so that an electric field of the conductor 260 can be applied to the top surface and the side surface of the oxide 230b. When the insulator 224 with an island shape is provided in this manner, the transistor 200 can have an S-channel structure.

Note that although FIG. 1C illustrates a transistor with an S-channel structure as the transistor 200, the semiconductor device of one embodiment of the present invention is not limited to this. For example, a transistor structure that can be employed in one embodiment of the present invention is one or more selected from a planar structure, a Fin-type structure, and a GAA structure.

FIG. 1B and the like illustrate the conductor 260 having a two-layer structure. Here, the conductor 260 preferably includes the conductor 260a and the conductor 260b over the conductor 260a. For example, the conductor 260a is preferably positioned so as to cover bottom and side surfaces of the conductor 260b. In that case, a conductive material that is less likely to be oxidized or a conductive material having a function of preventing diffusion of oxygen is preferably used for the conductor 260a.

The conductor 260a is preferably formed using a conductive material having a function of inhibiting diffusion of impurities such as hydrogen atoms, hydrogen molecules, water molecules, nitrogen atoms, nitrogen molecules, nitrogen oxide molecules, and copper atoms. Alternatively, the conductor 260a is preferably formed using a conductive material having a function of inhibiting diffusion of oxygen (e.g., at least one of oxygen atoms and oxygen molecules).

When the conductor 260a has a function of inhibiting diffusion of oxygen, the conductivity of the conductor 260b can be prevented from being lowered because of oxidization of the conductor 260b due to oxygen in the insulator 280 and the like. As the conductive material having a function of inhibiting diffusion of oxygen, for example, titanium, titanium nitride, tantalum, tantalum nitride, ruthenium, or ruthenium oxide is preferably used.

The conductor 260b is preferably formed using a conductor having high conductivity. For example, a conductive material containing tungsten, copper, or aluminum as its main component can be used for the conductor 260b. The conductor 260b may have a stacked-layer structure, for example, a stacked-layer structure of titanium or titanium nitride and the above conductive material.

In the transistor 200, the conductor 260 is formed in a self-aligned manner so as to fill an opening formed in the insulator 280 and the like. In this manner, the conductor 260 can be provided to overlap with a region between the conductor 242a1 and the conductor 242b1 without alignment.

The insulators 216 and 280 preferably have a lower dielectric constant than the insulator 222. In the case where a material with a low dielectric constant is used for the insulators, the parasitic capacitance between wirings can be reduced.

For example, each of the insulators 216 and 280 preferably includes one or more of silicon oxide, silicon oxynitride, silicon oxide to which fluorine is added, silicon oxide to which carbon is added, silicon oxide to which carbon and nitrogen are added, and porous silicon oxide.

Silicon oxide and silicon oxynitride are particularly preferable because of their thermal stability. Silicon oxide, silicon oxynitride, and porous silicon oxide are particularly preferable because a region containing oxygen that is released by heating can be easily formed in these materials.

Each of the top surfaces of the insulator 216 and the insulator 280 may be planarized.

The concentration of impurities such as water or hydrogen in the insulator 280 is preferably reduced. For example, the insulator 280 preferably includes an oxide containing silicon such as silicon oxide or silicon oxynitride.

<Materials for Semiconductor Device>

Materials that can be used for the semiconductor device are described below. Note that the layers included in the semiconductor device may have a single-layer structure or a stacked-layer structure.

<<Substrate>>

As a substrate where the transistor is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Another example includes a semiconductor substrate in which an insulator region is provided in the above semiconductor substrate, such as a silicon on insulator (SOI) substrate. Examples of the conductor substrate include a graphite substrate, a metal substrate, an alloy substrate, and a conductive resin substrate. Examples of the substrate include a substrate including a metal nitride, a substrate including a metal oxide, an insulator substrate provided with a conductor or a semiconductor, a semiconductor substrate provided with a conductor or an insulator, and a conductor substrate provided with a semiconductor or an insulator. Alternatively, these substrates provided with one or more kinds of elements may be used. Examples of the element provided over the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current may arise because of a thin gate insulator. When a high-k material is used for the insulator functioning as a gate insulator, the voltage at the time of operation of the transistor can be reduced while the physical thickness is maintained. By contrast, when a material with a low dielectric constant is used for the insulator functioning as an interlayer film, parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

A transistor including a metal oxide can have stable electrical characteristics when surrounded by an insulator having a function of inhibiting transmission of oxygen and impurities such as hydrogen. The insulator having a function of inhibiting transmission of oxygen and impurities such as hydrogen can have, for example, a single-layer structure or a stacked-layer structure including one or more of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

The insulator functioning as a gate insulator preferably includes a region containing oxygen that is released by heating. For example, silicon oxide or silicon oxynitride that includes a region containing oxygen that is released by heating is provided in contact with the oxide 230 to compensate for the oxygen vacancies in the oxide 230.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. Examples of the conductor include tantalum nitride, titanium nitride, tungsten, a nitride containing titanium and aluminum, a nitride containing tantalum and aluminum, ruthenium oxide, ruthenium nitride, an oxide containing strontium and ruthenium, and an oxide containing lanthanum and nickel. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even when absorbing oxygen. Alternatively, a semiconductor having high electric conductivity, typified by polycrystalline silicon containing an impurity element such as phosphorus, or silicide such as nickel silicide may be used.

In the case where a stacked-layer structure of conductors is used, for example, a stacked-layer structure combining a material containing any of the metal elements and a conductive material containing oxygen, a stacked-layer structure combining a material containing any of the metal elements and a conductive material containing nitrogen, or a stacked-layer structure combining a material containing any of the metal elements, a conductive material containing oxygen, and a conductive material containing nitrogen may be employed.

When an oxide is used for the channel formation region of the transistor, the conductor functioning as the gate electrode preferably has a stacked-layer structure combining a material containing any of the above metal elements and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which the channel is formed. A conductive material containing any of the above metal elements and nitrogen may also be used. For example, a conductive material containing nitrogen, such as titanium nitride or tantalum nitride, may be used. One or more of indium tin oxide, indium oxide containing tungsten oxide, indium zinc oxide containing tungsten oxide, indium oxide containing titanium oxide, indium tin oxide containing titanium oxide, indium zinc oxide, and indium tin oxide to which silicon is added may be used. Indium gallium zinc oxide containing nitrogen may be used. With use of such a material, hydrogen contained in the metal oxide where the channel is formed can be captured in some cases. Hydrogen entered from a surrounding insulator or the like can also be captured in some cases.

<<Metal Oxide>>

As the oxide 230, a metal oxide functioning as a semiconductor (oxide semiconductor) is preferably used. A metal oxide that can be used for the oxide 230 of one embodiment of the present invention is described below.

A metal oxide preferably contains at least indium or zinc. In particular, indium and zinc are preferably contained. In addition, aluminum, gallium, yttrium, tin, antimony, or the like is preferably contained. Furthermore, one or more elements selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is In-M-Zn oxide, which contains indium, an element M, and zinc is considered. The element M is aluminum, gallium, yttrium, tin, or antimony. Other examples that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements can be used in combination as the element Min some cases. In particular, the element M is preferably one or more selected from gallium, aluminum, yttrium, and tin.

Note that in this specification and the like, a metal oxide containing nitrogen is also referred to as a metal oxide in some cases. In addition, a metal oxide containing nitrogen may be referred to as a metal oxynitride.

An In—Ga—Zn oxide is described below as an example of the metal oxide.

Amorphous (including a completely amorphous structure), c-axis-aligned crystalline (CAAC), nanocrystalline (nc), cloud-aligned composite (CAC), single-crystal, polycrystalline structures, and the like can be given as examples of a crystal structure of an oxide semiconductor.

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the maximum diameter of the crystal region may be approximately several tens of nanometers.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

In a material composition of a CAC-OS in an In—Ga—Zn oxide that contains In, Ga, Zn, and O, regions containing In as a main component (first regions) are observed in part of the CAC-OS and regions containing Ga as a main component (second regions) are observed in part thereof. These regions randomly exist to form a mosaic pattern. Thus, it is suggested that the CAC-OS has a structure in which metal elements are unevenly distributed.

The CAC-OS can be formed by a sputtering method under a condition where a substrate is intentionally not heated, for example. In the case of forming the CAC-OS by a sputtering method, one or more selected from an inert gas (typically, argon), an oxygen gas, and a nitrogen gas can be used as a deposition gas. The ratio of the flow rate of an oxygen gas to the total flow rate of the deposition gas during deposition is preferably as low as possible. For example, the flow-rate proportion of an oxygen gas in the total deposition gas is preferably higher than or equal to 0% and lower than 30%, further preferably higher than or equal to 0% and lower than or equal to 10%.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Thus, when the CAC-OS is used for a transistor, high on-state current ($I_{on}$), high field-effect mobility ($\mu$), and excellent switching operation can be achieved.

A transistor including a CAC-OS is highly reliable. Thus, the CAC-OS is suitably used in a variety of semiconductor devices typified by a display device.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<<Other Semiconductor Materials>>

A semiconductor material that has a band gap (a semiconductor material that is not a zero-gap semiconductor) may be used for a semiconductor layer of a transistor. For example, a single-element semiconductor such as silicon or a compound semiconductor such as gallium arsenide may be used.

For a semiconductor layer of a transistor, a transition metal chalcogenide functioning as a semiconductor is preferably used, for example. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$). The use of the transition metal chalcogenide for a semiconductor layer of a transistor can provide a semiconductor device with high on-state current.

<Example of Method of Manufacturing Semiconductor Device>

An example of a method of manufacturing the semiconductor device of one embodiment of the present invention is described with reference to FIGS. 5A to 5D to FIGS. 18A to 18D. Here, the case of manufacturing the semiconductor device illustrated in FIGS. 1A to 1D is described as an example.

Figure 14A:
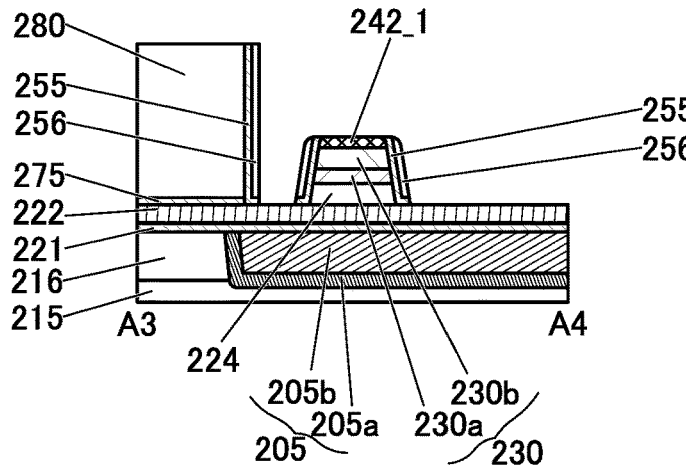
FIGS. 14A to 14C are cross-sectional views illustrating an example of a manufacturing method of a semiconductor device.
Figure 14B:
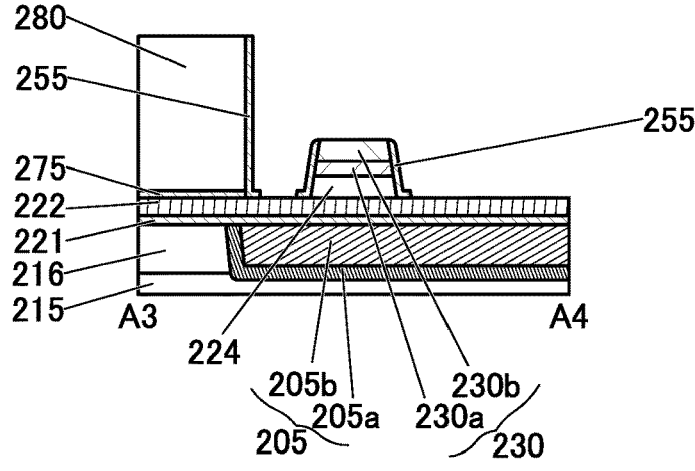
Figure 14C:
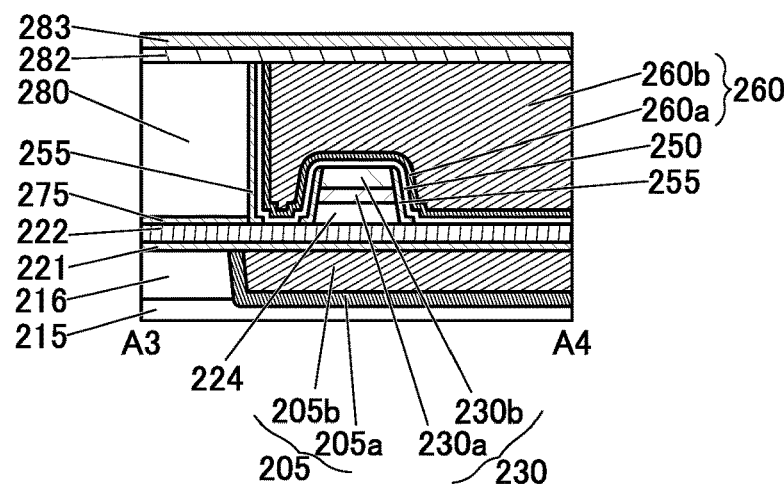
Figure 15A:
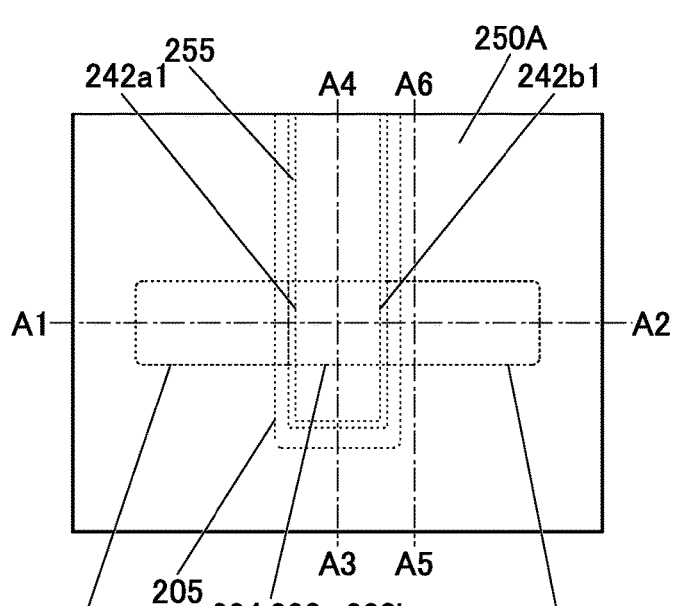
FIG. 15A is a plan view illustrating an example of a manufacturing method of a semiconductor device.
Figure 15C:
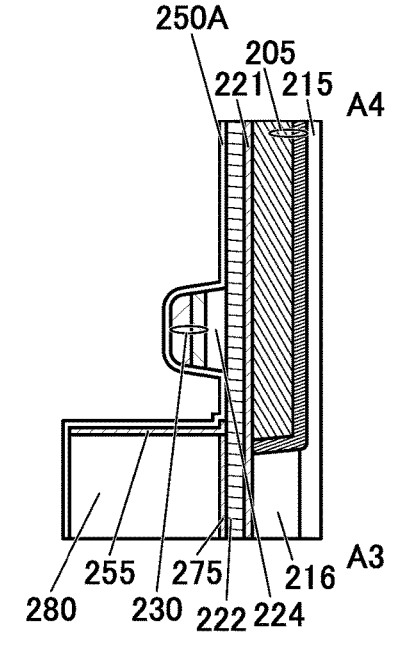
FIGS. 15B to 15D are cross-sectional views illustrating an example of a manufacturing method of a semiconductor device.
Figure 15B:
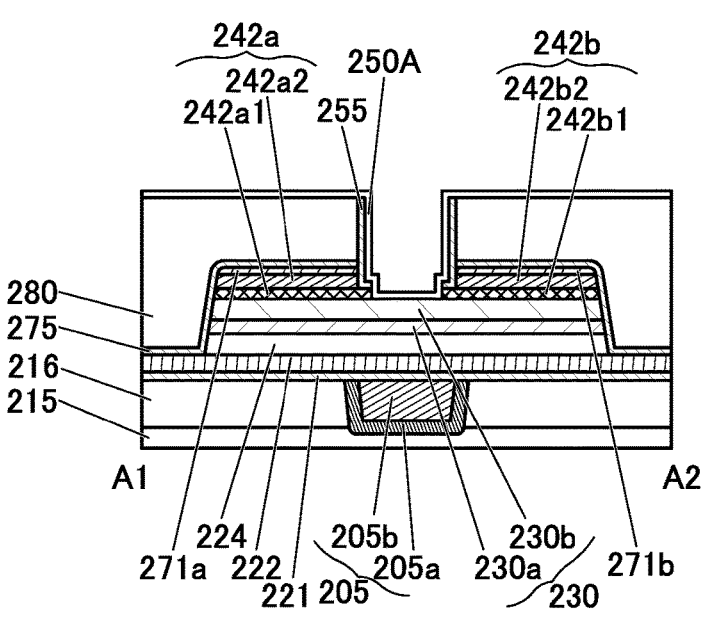
Figure 15D:
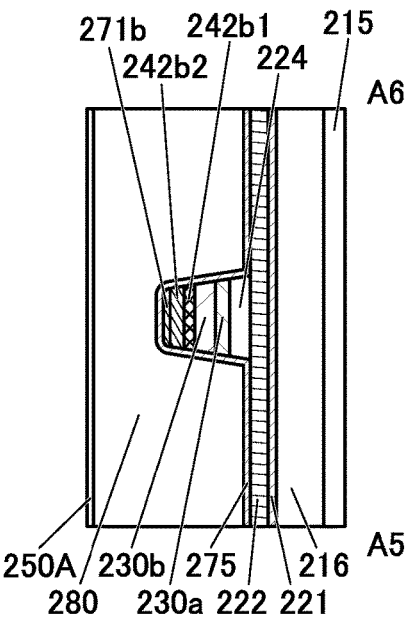
Figure 16A:
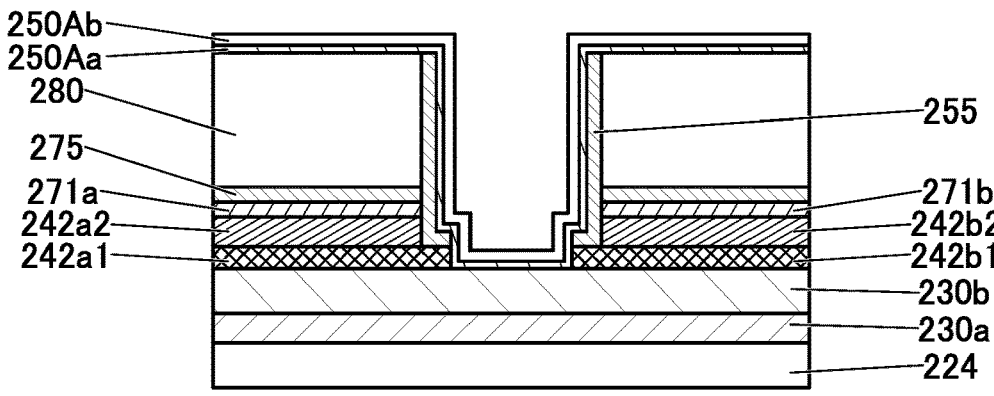
FIGS. 16A to 16C are cross-sectional views illustrating an example of a manufacturing method of a semiconductor device.
Figure 16B:
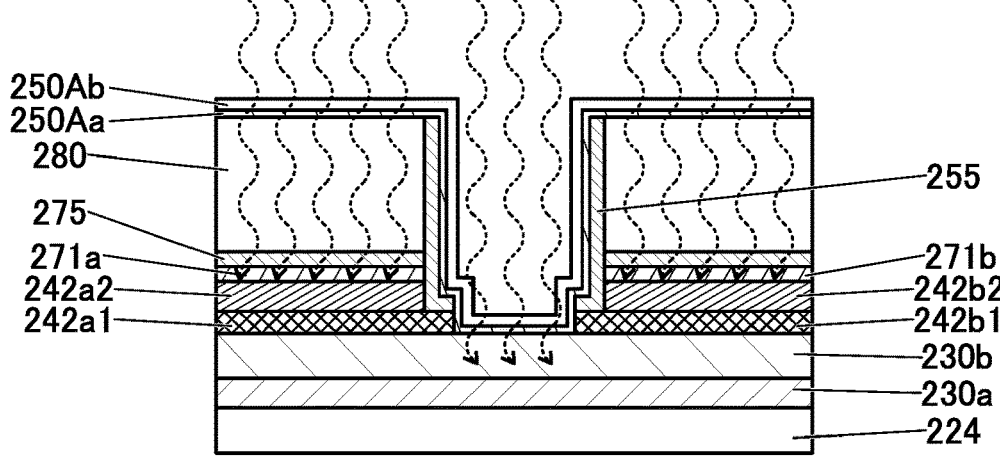
Figure 16C:
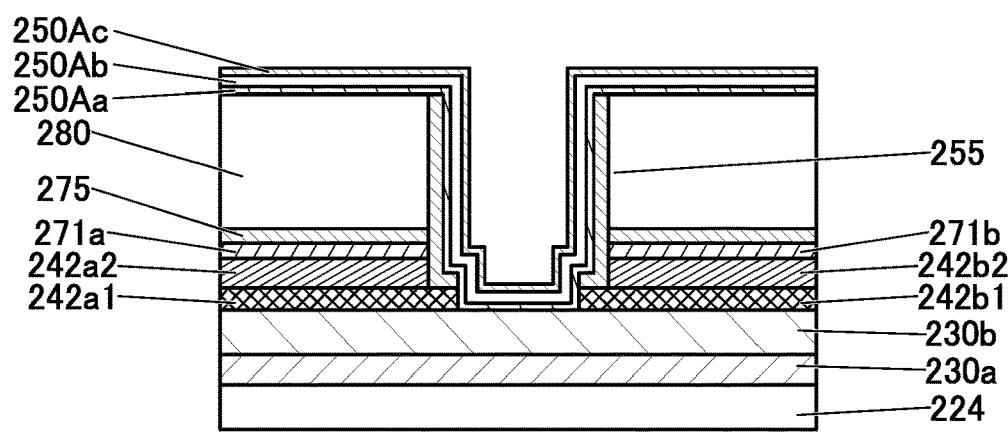
Figure 17A:
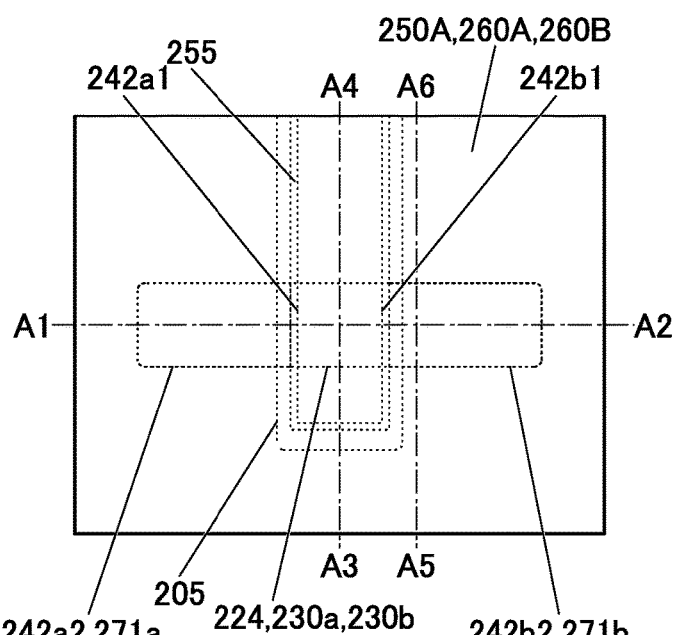
FIG. 17A is a plan view illustrating an example of a manufacturing method of a semiconductor device.
Figure 17C:
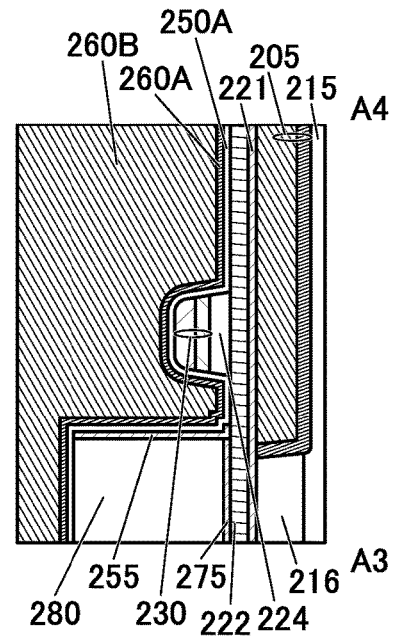
FIGS. 17B to 17D are cross-sectional views illustrating the example of a manufacturing method of a semiconductor device.
Figure 17B:
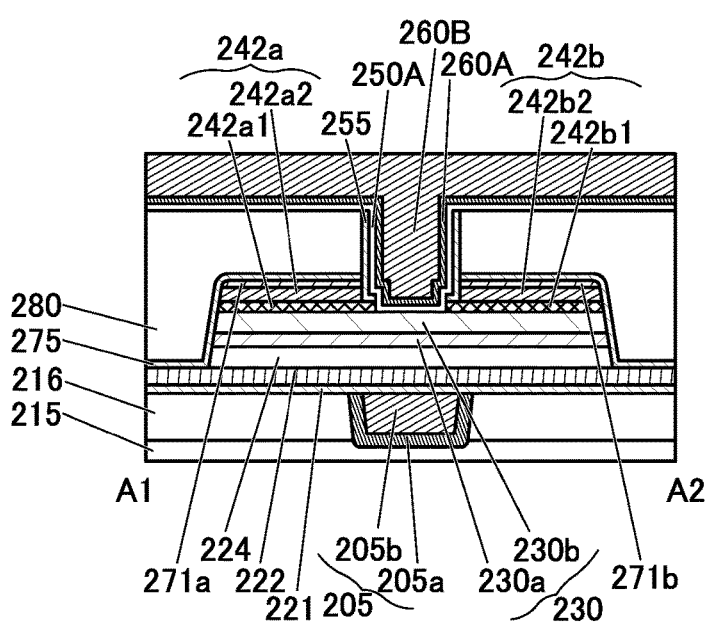
Figure 17D:
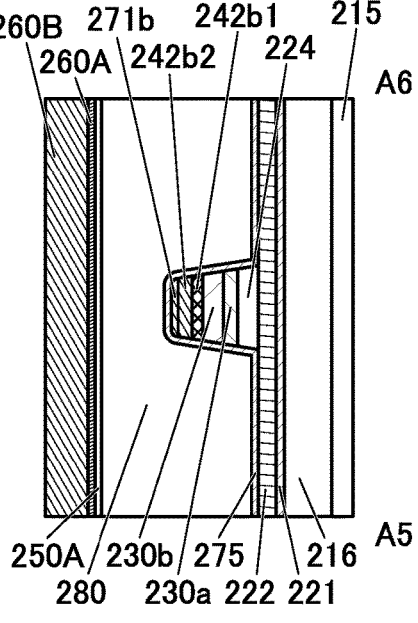
Figure 18A:
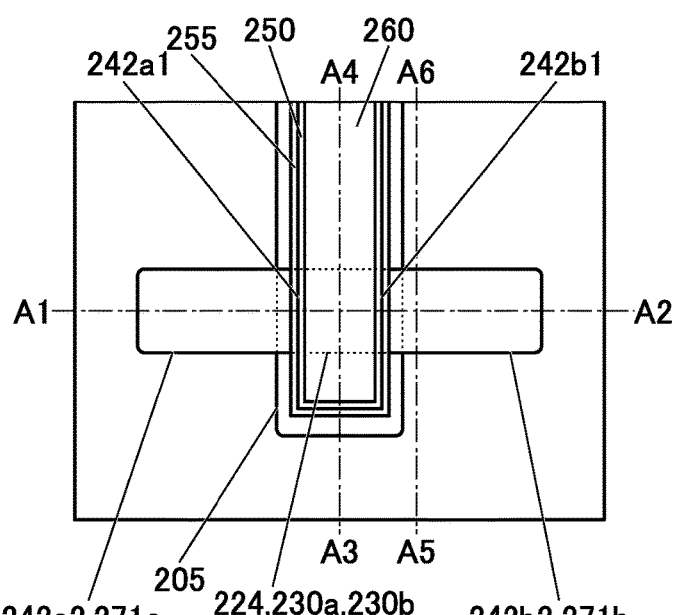
FIG. 18A is a plan view illustrating an example of a manufacturing method of a semiconductor device.
Figure 18C:
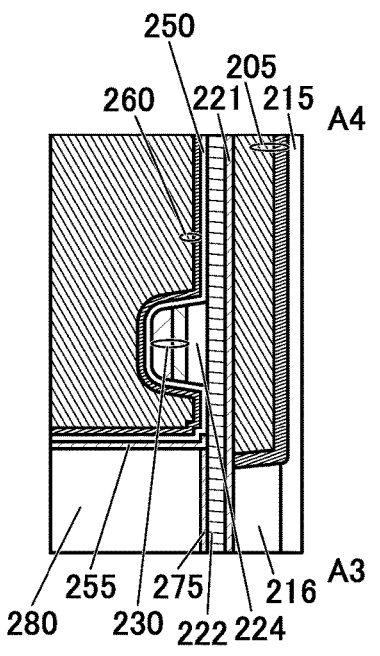
FIGS. 18B to 18D are cross-sectional views illustrating an example of a manufacturing method of a semiconductor device.
Figure 18B:
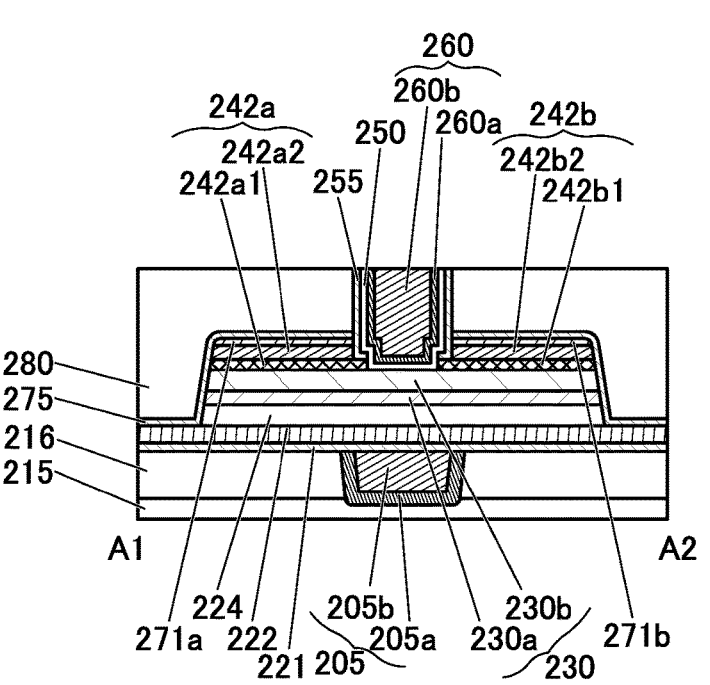
Figure 18D:
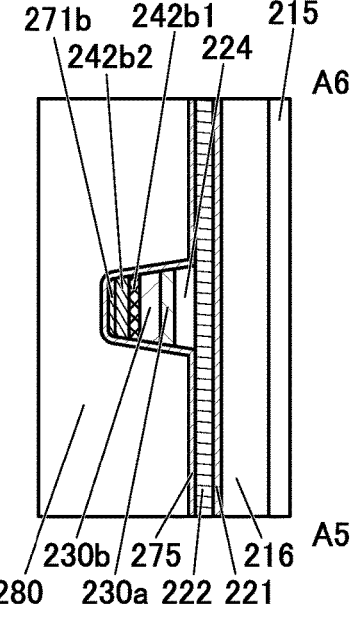

Note that FIG. 5A, FIG. 6A, FIG. 7A, FIG. 8A, FIG. 9A, FIG. 10A, FIG. 11A, FIG. 12A, FIG. 13A, FIG. 15A, FIG. 17A, and FIG. 18A are plan views. FIG. 5B, FIG. 6B, FIG. 7B, FIG. 8B, FIG. 9B, FIG. 10B, FIG. 11B, FIG. 12B, FIG. 13B, FIG. 15B, FIG. 17B, and FIG. 18B are cross-sectional views taken along the dashed-dotted lines A1-A2 in FIG. 5A, FIG. 6A, FIG. 7A, FIG. 8A, FIG. 9A, FIG. 10A, FIG. 11A, FIG. 12A, FIG. 13A, FIG. 15A, FIG. 17A, and FIG. 18A, which correspond to cross-sectional views in the channel length direction of the transistor 200. FIG. 5C, FIG. 6C, FIG. 7C, FIG. 8C, FIG. 9C, FIG. 10C, FIG. 11C, FIG. 12C, FIG. 13C, FIG. 15C, FIG. 17C, and FIG. 18C are cross-sectional views taken along the dashed-dotted lines A3-A4 in FIG. 5A, FIG. 6A, FIG. 7A, FIG. 8A, FIG. 9A, FIG. 10A, FIG. 11A, FIG. 12A, FIG. 13A, FIG. 15A, FIG. 17A, and FIG. 18A, which correspond to cross-sectional views in the channel width direction of the transistor 200. FIG. 5D, FIG. 6D, FIG. 7D, FIG. 8D, FIG. 9D, FIG. 10D, FIG. 11D, FIG. 12D, FIG. 13D, FIG. 15D, FIG. 17D, and FIG. 18D are cross-sectional views taken along the dashed-dotted lines A5-A6 in FIG. 5A, FIG. 6A, FIG. 7A, FIG. 8A, FIG. 9A, FIG. 10A, FIG. 11A, FIG. 12A, FIG. 13A, FIG. 15A, FIG. 17A, and FIG. 18A, which correspond to cross-sectional views in the channel width direction of the transistor 200. For simplification, some components are not illustrated in the plan views in FIG. 5A, FIG. 6A, FIG. 7A, FIG. 8A, FIG. 9A, FIG. 10A, FIG. 11A, FIG. 12A, FIG. 13A, FIG. 15A, FIG. 17A, and FIG. 18A. FIGS. 14A to 14C are cross-sectional views taken along the dashed-dotted lines A3-A4. Moreover, FIGS. 16A to 16C are cross-sectional enlarged views of the transistor 200 in the channel length direction.

In the following steps, an insulating material for forming an insulator, a conductive material for forming a conductor, or a semiconductor material for forming a semiconductor can be formed by a sputtering method, a chemical vapor deposition (CVD) method, a molecular beam epitaxy (MBE) method, a pulsed laser deposition (PLD) method, an ALD method, or the like as appropriate.

Examples of the sputtering method include an RF sputtering method in which a high-frequency power source is used for a sputtering power supply, a DC sputtering method in which a DC power source is used, and a pulsed DC sputtering method in which a voltage is applied while being changed in a pulsed manner. The RF sputtering method is mainly used in the case where an insulating film is formed, and the DC sputtering method is mainly used in the case where a metal conductive film is formed. The pulsed DC sputtering method is mainly used in the case where a compound such as an oxide, a nitride, or a carbide is deposited by a reactive sputtering method.

Note that CVD methods can be classified into a plasma enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method according to a source gas.

A high-quality film can be obtained at a relatively low temperature through a PECVD method. A thermal CVD method does not use plasma and thus causes less plasma damage to an object. For example, a wiring, an electrode, an element (e.g., a transistor or a capacitor), or the like included in a semiconductor device may be charged up by receiving charge from plasma. In that case, accumulated charge may break the wiring, electrode, element, or the like included in the semiconductor device. A thermal CVD method, which does not use plasma, does not cause such plasma damage, and thus can increase the yield of the semiconductor device. A thermal CVD method yields a film with few defects because of no plasma damage during film formation.

As the ALD method, a thermal ALD method, in which a precursor and a reactant react with each other only by a thermal energy, a plasma-enhanced ALD (PEALD) method, in which a reactant excited by plasma is used, and the like can be used.

Methods of CVD and ALD differ from a sputtering method by which particles ejected from a target or the like are deposited. Thus, a CVD method and an ALD method can provide good step coverage, almost regardless of the shape of an object. In particular, an ALD method allows excellent step coverage and excellent thickness uniformity and can be suitably used to cover a surface of an opening portion with a high aspect ratio, for example. Note that an ALD method has a relatively low deposition rate; hence, in some cases, an ALD method is preferably combined with another film formation method with a high deposition rate, such as a CVD method.

By a CVD method, a film with a certain composition can be formed by adjusting the flow rate ratio of the source gases. For example, a CVD method enables a film with a gradually-changed composition to be formed by changing the flow rate ratio of the source gases during film formation.

In the case where a film is formed while the flow rate ratio of the source gases is changed, as compared to the case where a film is formed using a plurality of deposition chambers, the time taken for the deposition can be shortened because the time taken for transfer and pressure adjustment is omitted. Hence, the productivity of the semiconductor device can be improved in some cases.

An ALD method, with which a plurality of different kinds of precursors are introduced at a time, enables formation of a film with desired composition. In the case where a plurality of different kinds of precursors are introduced, the cycle number of precursor deposition is controlled, whereby a film with desired composition can be formed.

First, a substrate (not illustrated) is prepared, and the insulator 215 is formed over the substrate (see FIGS. 5A to 5D). As described above, the insulator 215 can be formed with the same insulator as any one of the insulator 224, the insulator 282, and the insulator 283 or a stacked film including two or more thereof. The insulator 215 can be formed, for example, by a sputtering method, a CVD method, an MBE method, a PLD method, or an ALD method. A sputtering method which does not need to use a molecule containing hydrogen as a deposition gas is preferably used, in which case the hydrogen concentration in the insulator 215 can be reduced.

Next, the insulator 216 is formed over the insulator 215. The insulator 216 is preferably formed by a sputtering method. Since a molecule containing hydrogen is not used as a deposition gas in the sputtering method, the concentration of hydrogen in the insulator 216 can be reduced. Note that the insulator 216 can be formed by a CVD method, an MBE method, a PLD method, an ALD method, or the like as well as the sputtering method. In this embodiment, silicon oxide is deposited as the insulator 216 by a sputtering method.

The insulators 215 and 216 are preferably formed successively without exposure to the air. For example, a multi-chamber film formation apparatus is used. As a result, the amount of hydrogen in the formed insulators 215 and 216 can be reduced, and furthermore, entry of hydrogen in the films between film formation steps can be inhibited.

Then, an opening reaching the insulator 215 is formed in the insulator 216. Wet etching can be used for the formation of the opening; however, dry etching is preferable for microfabrication. The insulator 215 is preferably an insulator that functions as an etching stopper film when a groove is formed by etching of the insulator 216. For example, in the case where silicon oxide or silicon oxynitride is used as the insulator 216 in which the groove is to be formed, the insulator 215 is preferably silicon nitride, aluminum oxide, hafnium oxide, or the like.

After the formation of the opening, a conductive film to be the conductor 205*a* is formed. The conductive film to be the conductor 205*a* preferably contains a conductor that has a function of inhibiting transmission of oxygen. For example, tantalum nitride, tungsten nitride, or titanium nitride can be used. Alternatively, a stacked-layer film of the conductor that has a function of inhibiting transmission of oxygen and tantalum, tungsten, titanium, molybdenum, aluminum, copper, or a molybdenum-tungsten alloy can be used. The conductive film to be the conductor 205*a* can be formed by a sputtering method, a CVD method, an MBE method, a PLD method, an ALD method, or the like.

In this embodiment, titanium nitride is deposited as the conductive film to be the conductor 205*a*. When such a metal nitride is used for the layer under the conductor 205*b* described later, oxidation of the conductor 205*b* by the insulator 216 or the like can be inhibited. Furthermore, even when a metal that is easily diffused, such as copper, is used as the conductor 205*b*, the metal can be prevented from diffusing from the conductor 205*a*.

Next, a conductive film to be the conductor 205*b* is formed. The conductive film to be the conductor 205*b* can be formed using tantalum, tungsten, titanium, molybdenum, aluminum, copper, a molybdenum-tungsten alloy, or the like. The conductive film can be formed by a plating method, a sputtering method, a CVD method, an MBE method, a PLD method, an ALD method, or the like. In this embodiment, tungsten is deposited as the conductive film to be the conductor 205*b*.

Next, the conductive film to be the conductor 205*a* and the conductive film to be the conductor 205*b* are partly removed by CMP treatment to expose the insulator 216 (see FIGS. 5A to 5D). As a result, the conductors 205*a* and 205*b* remain only in the opening portion. Note that the insulator 216 is partly removed by the CMP treatment in some cases.

Next, the insulator 221 is formed over the insulator 216 and the conductor 205 (see FIGS. 6A to 6D).

An insulator having a barrier property against oxygen, hydrogen, and water is used as the insulator 221. The insulator 221 can be formed by a sputtering method, a CVD method, an MBE method, a PLD method, or an ALD method, for example. In this embodiment, silicon nitride is deposited as the insulator 221 by a PEALD method.

Next, the insulator 222 is formed over the insulator 221 (see FIGS. 6A to 6D).

The insulator 222 is preferably formed using an insulator containing an oxide of one or both of aluminum and hafnium. Note that as the insulator containing an oxide of one or both of aluminum and hafnium, aluminum oxide, hafnium oxide, or an oxide containing aluminum and hafnium (hafnium aluminate) is preferably used, for example. Alternatively, hafnium zirconium oxide is preferably used. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor into the transistor through the insulator 222 is inhibited, and accordingly oxygen vacancies are less likely to be generated in the oxide 230.

The insulator 222 can be formed by, for example, a sputtering method, a CVD method, an MBE method, a PLD method, or an ALD method. In this embodiment, hafnium oxide is formed as the insulator 222 by an ALD method.

Next, an insulating film 224*f* is formed over the insulator 222 (see FIGS. 6A to 6D). For the insulating film 224*f*, an insulator corresponding to the insulator 224 may be used.

The insulating film 224*f* can be formed by a sputtering method, a CVD method, an MBE method, a PLD method, or an ALD method, for example. In this embodiment, silicon oxide is deposited by a sputtering method as the insulating film 224*f*. Since a molecule containing hydrogen is not used as a deposition gas in the sputtering method, the hydrogen concentration in the insulating film 224*f* can be reduced. The hydrogen concentration in the insulating film 224*f* is preferably reduced in this manner because the insulating film 224*f* is in contact with the oxide 230*a* in a later step.

Note that heat treatment may be performed before the formation of the insulating film 224*f*. The heat treatment may be performed under a reduced pressure, and the insulating film 224*f* may be successively formed without exposure to the air. Such treatment can remove moisture and hydrogen adsorbed on the surface of the insulator 222 and reduce the moisture concentration and the hydrogen concentration in the insulator 222. The insulator 221 is provided in contact with a bottom surface of the insulator 222, whereby entry of moisture or impurities such as hydrogen from the component below the insulator 221, which is caused by the heat treatment, can be prevented. The temperature of the heat treatment is preferably higher than or equal to 100° C. and lower than or equal to 400° C. In this embodiment, the temperature of the heat treatment is 250° C.

Next, an oxide film 230*af* is formed over the insulating film 224*f* and an oxide film 230*bf* is formed over the oxide film 230*af* (see FIGS. 6A to 6D). Metal oxide corresponding to the oxide 230*a* may be used for the oxide film 230*af* and metal oxide corresponding to the oxide 230*b* may be used for the oxide film 230*bf*. It is preferable to form the oxide film 230*af* and the oxide film 230*bf* successively without exposure to the air. Film formation without exposure to the air prevents impurities or moisture from the air from attaching to the oxide films 230*af* and 230*bf*, so that the interface between the oxide films 230*af* and 230*bf* or the vicinity thereof can be kept clean.

Each of the oxide films 230*af* and 230*bf* can be formed by, for example, a sputtering method, a CVD method, an MBE method, a PLD method, or an ALD method. In this embodiment, the oxide films 230*af* and 230*bf* are formed by a sputtering method.

For example, in the case where the oxide films 230*af* and 230*bf* are formed by a sputtering method, oxygen or a mixed gas of oxygen and a noble gas is used as a sputtering gas. An increase in the proportion of oxygen in the sputtering gas can increase the amount of excess oxygen contained in the oxide film to be formed. Moreover, when the oxide films are formed by a sputtering method, a target of the In-M-Zn oxide can be used, for example.

In particular, in the formation of the oxide film 230*af*, part of oxygen contained in the sputtering gas is supplied to the insulating film 224*f* in some cases. Therefore, the proportion of oxygen in the sputtering gas may be preferably 70% or higher, further preferably 80% or higher, still further preferably 100%.

When the oxide film 230*bf* is formed by a sputtering method and the proportion of oxygen in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability. However, one embodiment of the present invention is not limited thereto. When the oxide film 230*bf* is formed by a sputtering method and the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility. In addition, when the oxide film is formed while the substrate is being heated, the crystallinity of the oxide film can be improved.

In this embodiment, the oxide film 230*af* is formed by a sputtering method using an oxide target having an atomic ratio of In:Ga:Zn=1:3:2 or 1:3:4. In addition, the oxide film 230*bf* is formed by a sputtering method using an oxide target having an atomic ratio of In:Ga:Zn=1:1:1, 1:1:1.2, 4:2:4.1, or 1:1:2. Note that each of the oxide films is preferably formed to have characteristics required for the oxide 230*a* and the oxide 230*b* by selecting the deposition conditions and the atomic ratios as appropriate.

Note that the insulating film 224*f* and the oxide films 230*af* and 230*bf* are preferably deposited by a sputtering method without exposure to the air. For example, a multi-chamber film formation apparatus is preferably used. In this manner, hydrogen can be prevented from entering the insulating film 224*f* and the oxide films 230*af* and 230*bf* during each of film formation steps.

Next, heat treatment is preferably performed. The heat treatment may be performed within a temperature range where the oxide film 230*af* and the oxide film 230*bf* do not become polycrystal. The temperature of the heat treatment is higher than or equal to 100° C., higher than or equal to 250° C., or higher than or equal to 350° C., and lower than or equal to 650° C., lower than or equal to 600° C., or lower than or equal to 550° C.

The heat treatment is performed in a nitrogen gas atmosphere, an inert gas atmosphere, or an atmosphere containing an oxidizing gas at 10 ppm or more, 1% or more, or 10% or more. For example, in the case where the heat treatment is performed in an atmosphere of mixing a nitrogen gas and an oxygen gas, the proportion of the oxygen gas is preferably approximately 20%. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is preferably 1 ppb or less, further preferably 0.1 ppb or less, still further preferably 0.05 ppb or less. The heat treatment using a highly purified gas can prevent the entry of moisture or the like into the oxide films 230*af* and 230*bf* and the like as much as possible.

In this embodiment, heat treatment at 450° C. for an hour is performed with a flow rate ratio of a nitrogen gas to an oxygen gas that is 4:1. With the heat treatment using the above-described oxygen gas, impurities such as carbon, hydrogen, and water in the oxide films 230*af* and 230*bf* can be reduced. Impurities in the film are reduced in the above manner, whereby the crystallinity of the oxide films 230*af* and 230*bf* can be improved and a dense structure can be obtained. Accordingly, the crystal region in the oxide films 230*af* and 230*bf* can be increased, and in-plane variation in the oxide films 230*af* and 230*bf* can be reduced. Thus, in-plane variation in electrical characteristics of the transistor 200 can be reduced.

By the heat treatment, hydrogen contained in the insulator 216, the insulating film 224*f*, the oxide film 230*af*, and the oxide film 230*bf* is absorbed by the insulator 222. In other words, hydrogen contained in the insulator 216, the insulating film 224*f*, the oxide film 230*af*, and the oxide film 230*bf* diffuses into the insulator 222. Accordingly, the hydrogen concentration in the insulator 222 increases, whereas the hydrogen concentrations in the insulator 216, the insulating film 224*f*, the oxide film 230*af*, and the oxide film 230*bf* decrease. Note that the insulator 221 is provided in contact with the bottom surface of the insulator 222, whereby entry of moisture or impurities such as hydrogen from the component below the insulator 221, which is caused by the heat treatment, can be prevented.

Specifically, the insulating film 224*f* (to be the insulator 224 later) functions as the second gate insulator of the transistor 200, and the oxide films 230*af* and 230*bf* (to be the oxides 230*a* and 230*b* later) function as the channel formation region of the transistor 200. Thus, the transistor 200 including the insulating film 224*f*, the oxide film 230*af*, and the oxide film 230*bf* with reduced hydrogen concentrations is preferable because of its favorable reliability.

Next, a conductive film 242_1*f* is formed over the oxide film 230*bf*, and a conductive film 242_2*f* is formed over the conductive film 242_1*f* (see FIGS. 6A to 6D). A conductor corresponding to the conductors 242*a*1 and 242*b*1 may be used for the conductive film 242_1*f*, and a conductor corresponding to the conductors 242*a*2 and 242*b*2 may be used for the conductive film 242_2*f*. After the formation of the oxide film 230*bf*, the conductive film 242_1*f* is formed over and in contact with the oxide film 230*bf* without interposing an etching step or the like, so that a top surface of the oxide film 230*bf* can be protected by the conductive film 242_1*f*. Thus, diffusion of impurities into the oxide 230 included in the transistor can be reduced, so that the electrical characteristics and reliability of the semiconductor device can be improved.

Each of the conductive films 242_1*f* and 242_2*f* can be formed by, for example, a sputtering method, a CVD method, an MBE method, a PLD method, or an ALD method.

In this embodiment, tantalum nitride is deposited for the conductive film 242_1*f* and tungsten is deposited for the conductive film 242_2*f* by a sputtering method. Note that heat treatment may be performed before the formation of the conductive film 242_1*f*. The heat treatment may be performed under a reduced pressure, and the conductive film 242_1*f* may be successively formed without exposure to the air. By such treatment, moisture and hydrogen adsorbed on the surface of the oxide 230*b* can be removed, and the moisture concentration and the hydrogen concentration in the oxides 230*a* and 230*b* can be reduced. The temperature of the heat treatment is preferably higher than or equal to 100° C. and lower than or equal to 400° C. In this embodiment, the temperature of the heat treatment is 250° C.

Next, an insulating film 271*f* is formed over the conductive film 242_1*f* (see FIG. 6A to FIG. 6D). The insulating film 271*f* can be formed by a sputtering method, a CVD method, an MBE method, a PLD method, an ALD method, or the like. The insulating film 271*f* is preferably an insulating film having a function of inhibiting the passage of oxygen. For example, a stacked-layer film of a silicon nitride film and a silicon oxide film over the silicon nitride film may be formed as the insulating film 271*f* by a sputtering method.

Here, in the case where the insulating film 271*f* is formed by stacking films, the films are preferably formed successively without exposure to the air. By the film formation without exposure to the air, an interface between the films of the insulating film 271*f* or the vicinity thereof can be kept clean. It is further preferable to form the components from the conductive film 242_1*f* to the insulating film 271*f* successively without exposure to the air.

Note that heat treatment may be performed before the formation of the insulating film 271*f*. The heat treatment may be performed under a reduced pressure, and the insulating film 271*f* may be successively formed without exposure to the air. Such treatment can remove moisture and hydrogen adsorbed on the surfaces of the conductive films 242_1*f* and 242_2*f* and reduce the moisture concentration and the hydrogen concentration in the conductive films 242_1*f* and 242_2*f*. The temperature of the heat treatment is preferably higher than or equal to 100° C. and lower than or equal to 400° C. In this embodiment, the temperature of the heat treatment is 250° C.

Next, by a lithography method, the insulating film 224$f$, the oxide films 230$af$ and 230$bf$, the conductive films 242_1$f$ and 242_2$f$, and the insulating film 271$f$ are processed into an island shape to form the insulator 224, the oxides 230$a$ and 230$b$, the conductors 242_1 and 2422, and the insulator 271 (see FIGS. 7A to 7D).

The processing can be performed by a dry etching method or a wet etching method. A dry etching method is suitable for microfabrication. The insulating film 224$f$, the oxide film 230$af$, the oxide film 230$bf$, the conductive film 242_1$f$, the conductive film 242_2$f$, and the insulating film 271$f$ may be processed under different conditions.

Here, it is preferable that the insulator 224, the oxides 230$a$ and 230$b$, the conductors 242_1 and 2422, and the insulator 271 be processed into an island shape at once. In that case, it is preferable that side end portions of the conductors 242_1 and 242_2 be aligned or substantially aligned with side end portions of the oxides 230$a$ and 230$b$. Furthermore, it is preferable that a side end portion of the insulator 224 be aligned or substantially aligned with a side end portion of the oxide 230. It is preferable that a side end portion of the insulator 271 be aligned or substantially aligned with the side end portion of the conductor 242_2. With such a structure, the number of steps for the semiconductor device of one embodiment of the present invention can be reduced. Therefore, a method of manufacturing a semiconductor device with high productivity can be provided.

The insulator 224, the oxide 230$a$, the oxide 230$b$, the conductor 242_1, the conductor 2422, and the insulator 271 are formed to at least partly overlap with the conductor 205. The insulator 222 is exposed in a region where the insulator 222 does not overlap with the insulator 224, the oxide 230$a$, the oxide 230$b$, the conductor 242_1, the conductor 2422, and the insulator 271.

Figure 7A:
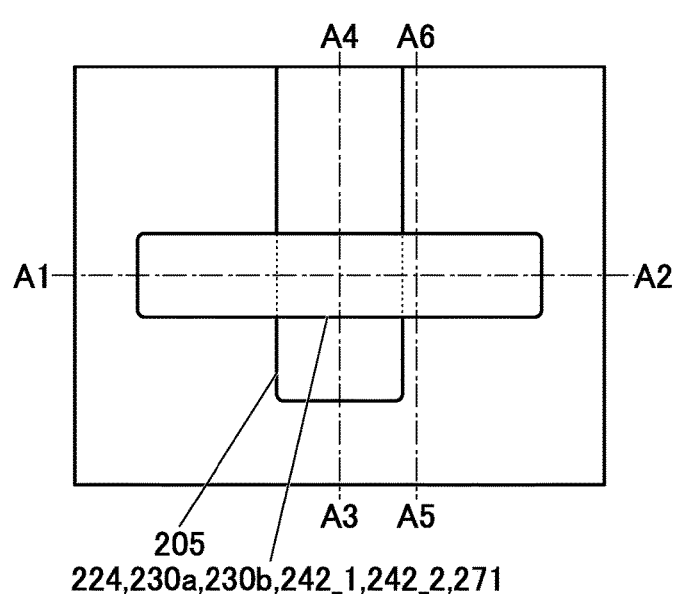
FIG. 7A is a plan view illustrating an example of a manufacturing method of a semiconductor device.
Figure 7C:
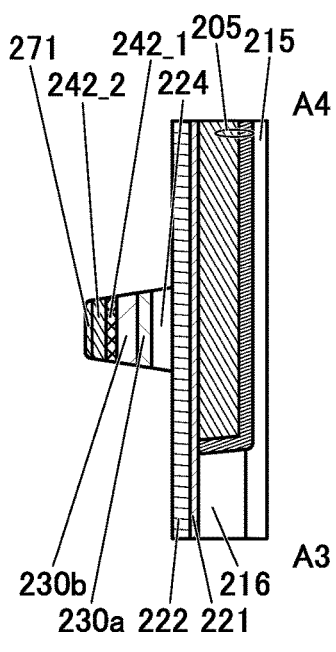
FIGS. 7B to 7D are cross-sectional views illustrating the example of a manufacturing method of a semiconductor device.
Figure 7B:
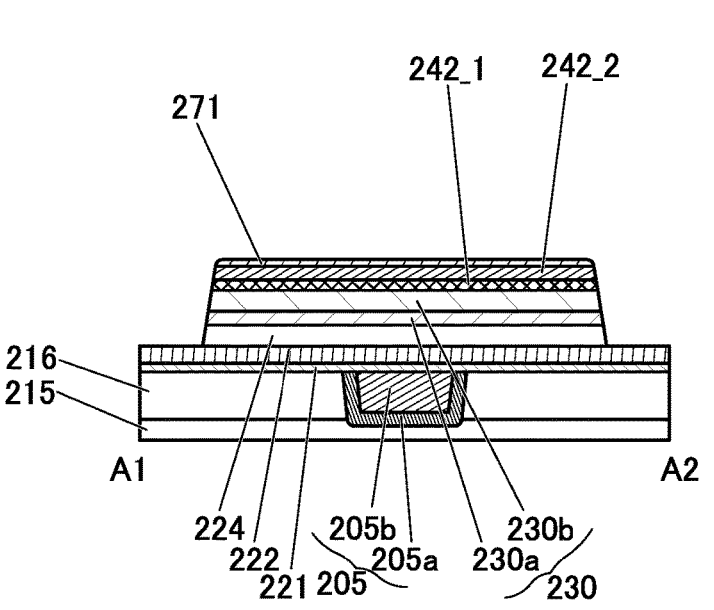
Figure 7D:
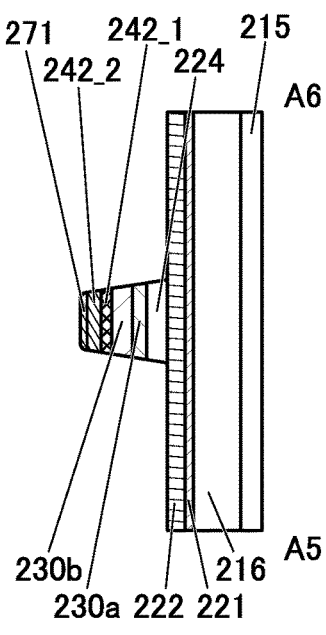
Figure 8A:
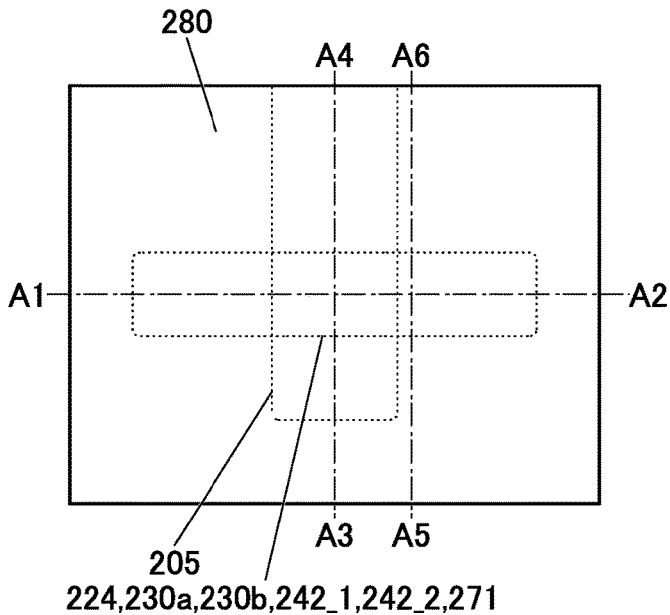
FIG. 8A is a plan view illustrating an example of a manufacturing method of a semiconductor device.
Figure 8C:
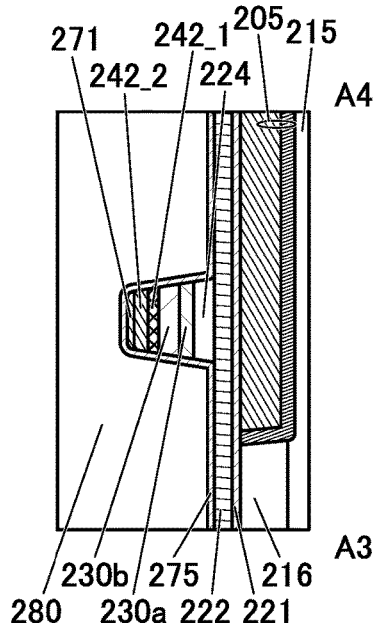
FIGS. 8B to 8D are cross-sectional views illustrating the example of a manufacturing method of a semiconductor device.
Figure 8B:
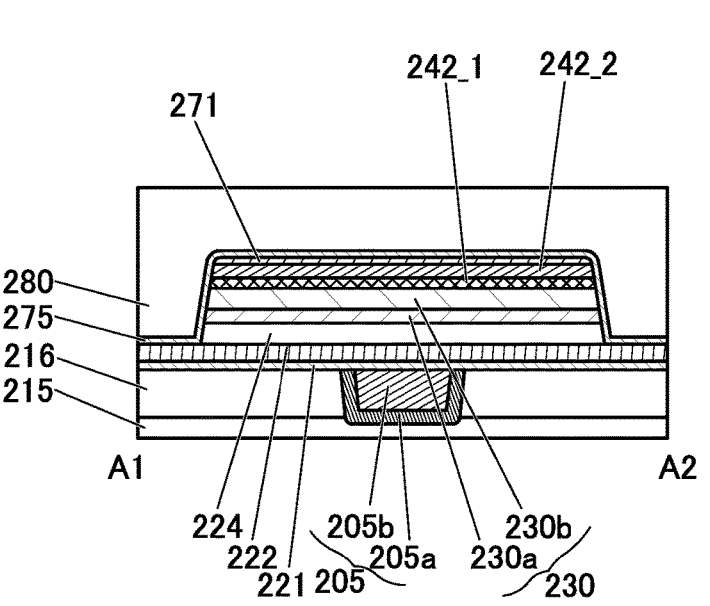
Figure 8D:
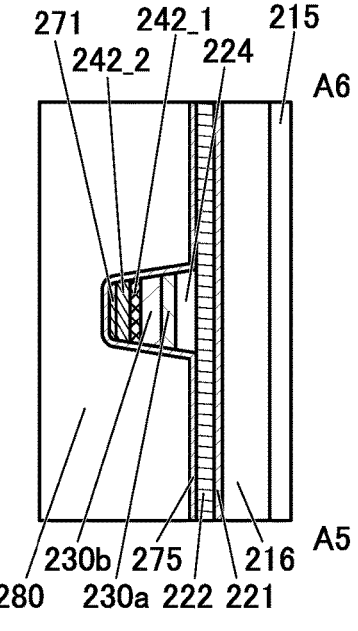
Figure 9A:
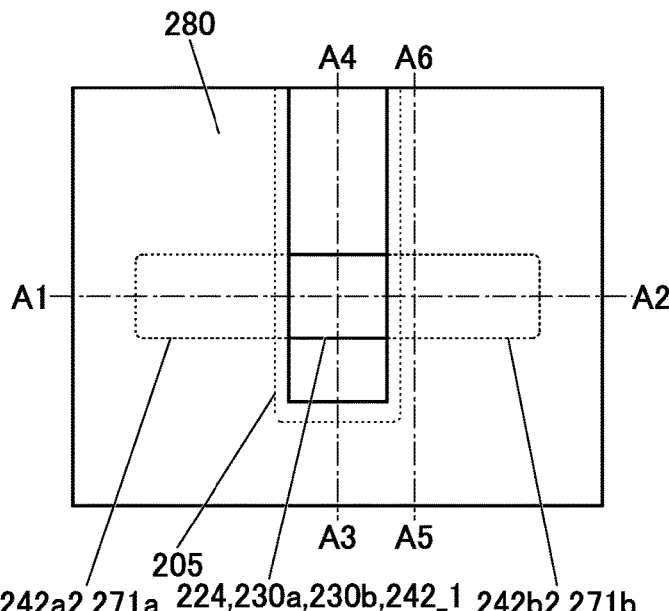
FIG. 9A is a plan view illustrating an example of a manufacturing method of a semiconductor device.
Figure 9C:
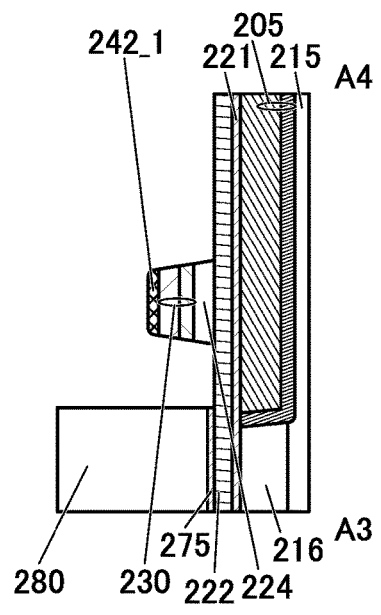
FIGS. 9B to 9D are cross-sectional views illustrating the example of a manufacturing method of a semiconductor device.
Figure 9B:
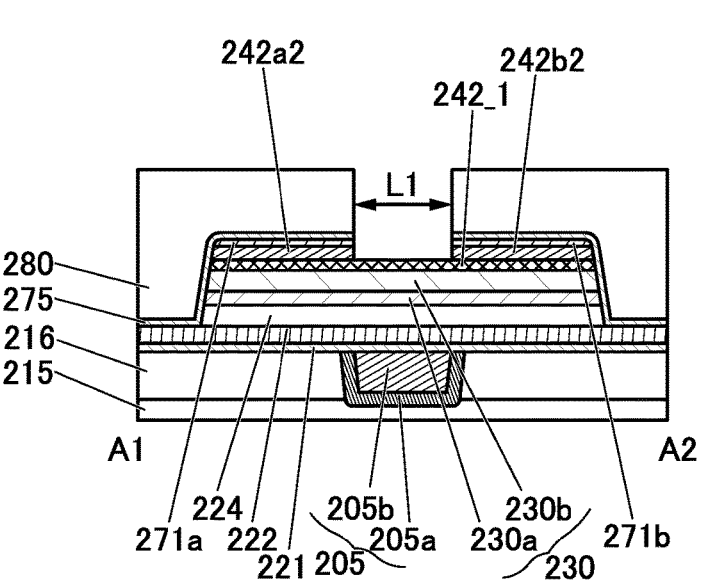
Figure 9D:
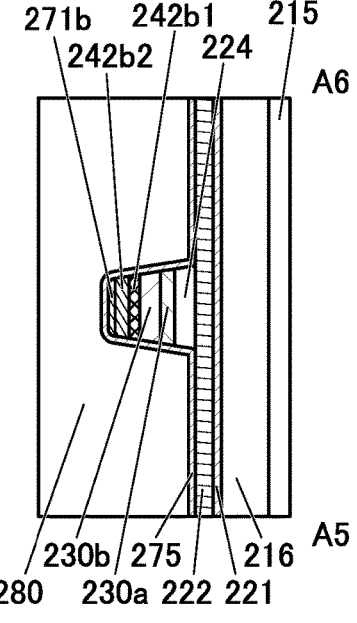
Figure 10A:
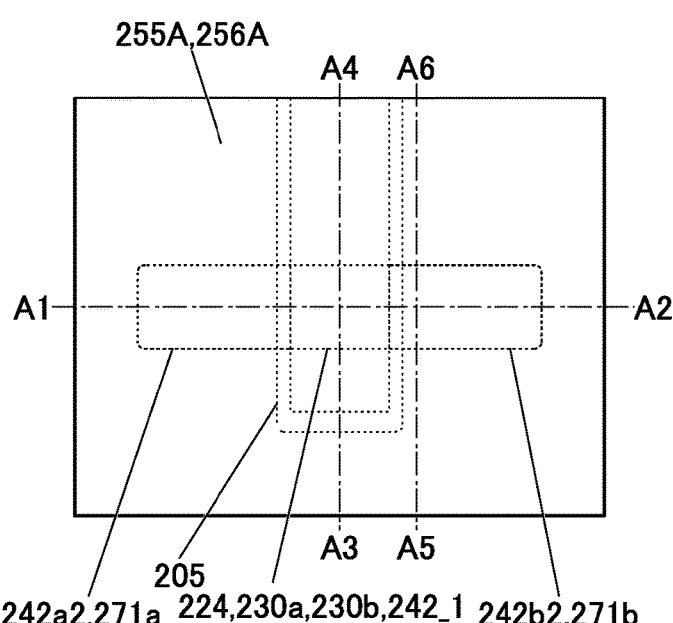
FIG. 10A is a plan view illustrating an example of a manufacturing method of a semiconductor device.
Figure 10C:
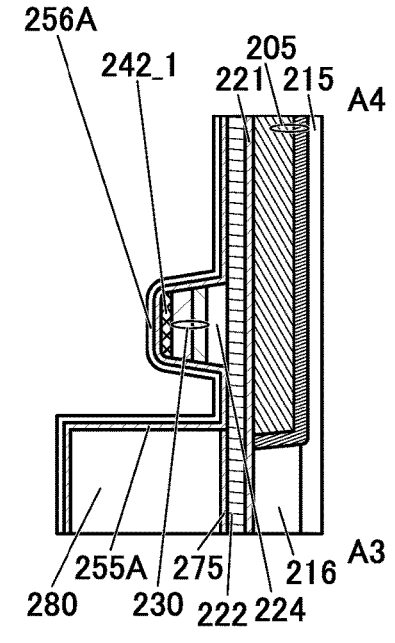
FIGS. 10B to 10D are cross-sectional views illustrating the example of a manufacturing method of a semiconductor device.
Figure 10B:
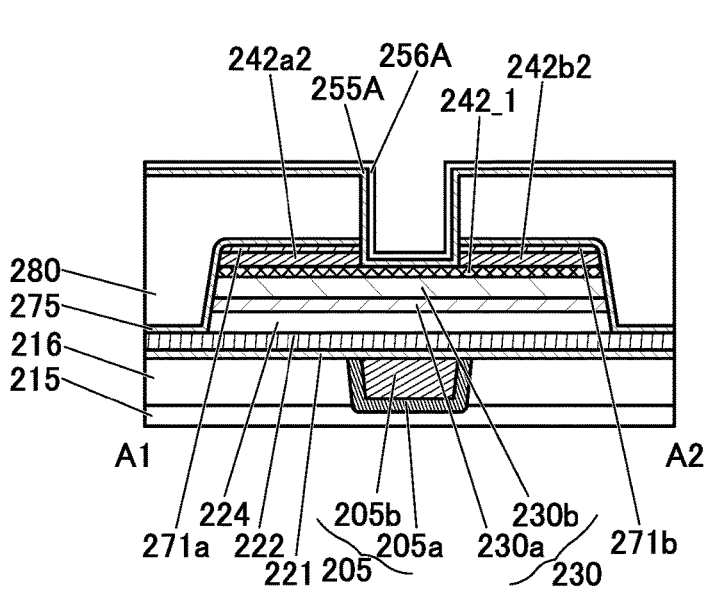
Figure 10D:
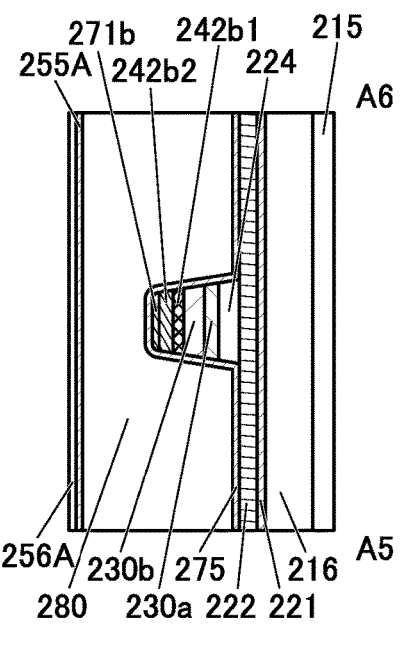

As illustrated in FIG. 7B, side surfaces of the insulator 224, the oxide 230$a$, the oxide 230$b$, the conductor 242_1, the conductor 2422, and the insulator 271 may have a tapered shape. The taper angle of the side surfaces of the insulator 224, the oxide 230$a$, the oxide 230$b$, the conductor 2421, the conductor 2422, and the insulator 271 may be, for example, greater than or equal to 60° and less than 90°. With such tapered side surfaces, the coverage with the insulator 275 and the like can be improved in a later step, so that the number of defects such as voids can be reduced.

Not being limited to the above, the insulator 224, the oxide 230$a$, the oxide 230$b$, the conductor 2421, the conductor 242_2, and the insulator 271 may have side surfaces that are perpendicular or substantially perpendicular to the top surface of the insulator 222. When the side surfaces are substantially perpendicular to the top surface of the insulator 222, a plurality of transistors can be provided with high density in a small area.

In the lithography method, first, a resist is exposed to light through a mask. Next, a region exposed to light is removed or left using a developing solution, so that a resist mask is formed. Then, etching is conducted with the resist mask, whereby a conductor, a semiconductor, an insulator, or the like can be processed into a desired shape. The resist mask can be formed, for example, by exposing the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is unnecessary in the case of using an electron beam or an ion beam in some cases.

To remove the resist mask which is no longer needed after the processing, dry etching treatment such as ashing using oxygen plasma (hereinafter referred to as oxygen plasma treatment in some cases) or wet etching treatment may be used. Alternatively, wet etching treatment may be performed after dry etching treatment, or dry etching treatment may be performed after wet etching treatment.

A hard mask formed of an insulator or a conductor may be used under the resist mask. In the case of using a hard mask, a hard mask with a desired shape can be formed in the following manner: an insulating film or a conductive film that is the material of the hard mask is formed over the insulating film 271$f$, a resist mask is formed thereover, and then the hard mask material is etched. The etching of the insulating film 271$f$ and the like may be performed after or without removal of the resist mask. In the latter case, the resist mask sometimes disappears during the etching. The hard mask may be removed by etching after the etching of the oxide film 230$bf$ and the like. The hard mask does not need to be removed when the hard mask material does not affect the following process or can be utilized in the following process.

A spin on carbon (SOC) film and a spin on glass (SOG) film may be formed between an object to be processed and the resist mask. Using the SOC film and the SOG film as masks can improve the adhesion between the object to be processed and the resist mask and the durability of a mask pattern. For example, the SOC film, the SOG film, and the resist mask are formed in this order over the object to be processed and lithography can be performed.

An etching gas containing halogen can be used as a dry etching gas; specifically, an etching gas containing one or more of fluorine, chlorine, and bromine can be used. For example, as the etching gas, a $C_4F_6$ gas, a $C_5F_6$ gas, a $C_4F_8$ gas, a $CF_4$ gas, a $SF_6$ gas, a $CHF_3$ gas, a $CH_2F_2$ gas, a $Cl_2$ gas, a $BCl_3$ gas, a $SiCl_4$ gas, a $BBr_3$ gas, or the like can be used alone or in combination. To the above etching gas, an oxygen gas, a carbon dioxide gas, a nitrogen gas, a helium gas, an argon gas, a hydrogen gas, a hydrocarbon gas, or the like can be added as appropriate. Depending on an object to be subjected to the dry etching, a gas containing a hydrocarbon gas or a hydrogen gas and not containing a halogen gas can be used as the etching gas. As the hydrocarbon used for the etching gas, one or more of methane ($CH_4$), ethane ($C_2H_6$), propane ($C_3H_8$), butane ($C_4H_{10}$), ethylene ($C_2H_4$), propylene ($C_3H_6$), acetylene ($C_2H_2$), and propyne ($C_3H_4$) can be used. The etching conditions can be set as appropriate depending on an object to be etched.

As a dry etching apparatus, a capacitively coupled plasma (CCP) etching apparatus including parallel plate electrodes can be used. The capacitively coupled plasma etching apparatus including parallel plate electrodes may have a structure in which a high-frequency voltage is applied to one of the parallel plate electrodes. Alternatively, different high-frequency voltages may be applied to one of the parallel plate electrodes. Further alternatively, high-frequency voltages with the same frequency may be applied to the parallel plate electrodes. Still further alternatively, high-frequency voltages with different frequencies may be applied to the parallel plate electrodes. A dry etching apparatus including a high-density plasma source can be used. As the dry etching apparatus including a high-density plasma source, an inductively coupled plasma (ICP) etching apparatus can be used, for example. The etching apparatus can be set as appropriate depending on an object to be etched.

In the above etching process, the insulator 271 can function as an etching stopper that protects the conductor 242_2. For example, a metallic hard mask over the insulator 271 in the above etching process makes it difficult to obtain the etching selectivity of the hard mask to the conductor 242_2 at the time of removing the hard mask in some cases. However, when the insulator 271 is formed over the conductor 242_2, the insulator 271 can function as an etching stopper that protects the conductor 242_2 in the etching for removing the hard mask. This can prevent formation of a curved surface between the side surface and a top surface of the conductor 2422, and the end portion at the intersection of the side surface and the top surface of each of the conductors 242a2 and 242b2 to be formed later is angular. The cross-sectional area of the conductor 242_2 is larger in the case where the end portion at the intersection of the side surface and the top surface of the conductor 2422 is angular than in the case where the end portion is rounded. Furthermore, when nitride insulator that is less likely to oxidize metal is used for the insulator 271, excessive oxidation of the conductor 242_2 can be prevented. Thus, the resistance of the conductors 242a2 and 242b2 is reduced, so that the on-state current of the transistor can be increased.

By processing the insulator 224 into an island shape, the insulator 275 can be provided in contact with the side surface of the insulator 224 and the top surface of the insulator 222 in a step to be described later. That is, the insulator 224 can be isolated from the insulator 280 by the insulator 275. Such a structure can prevent an excess amount oxygen and impurities such as hydrogen from entering the oxide 230 from the insulator 280 through the insulator 224.

By processing the insulator 224 into an island shape, in the case where the plurality of transistors 200 are provided, the insulator 224 having a size substantially the same as that of the transistors 200 is provided for one transistor 200. Accordingly, among the transistors 200, the amount of oxygen supplied from the insulator 224 to the oxide 230 is substantially the same. Therefore, variations in electrical characteristics of the transistors 200 in the substrate plane can be reduced. Note that the structure is not limited to this, and a structure in which like the insulator 222, the insulator 224 is not patterned can be employed.

Next, the insulator 275 is formed to cover the insulator 224, the oxide 230a, the oxide 230b, the conductor 242_1, the conductor 2422, and the insulator 271, and the insulator 280 is formed over the insulator 275 (see FIGS. 8A to 8D). The above-described insulators can be used as the insulators 275 and 280.

Here, the insulator 275 is preferably in contact with the top surface of the insulator 222.

As the insulator 280, an insulator having a flat top surface is preferably formed in the following manner: an insulating film to be the insulator 280 is formed and then the insulating film is subjected to CMP treatment. Note that silicon nitride may be deposited over the insulator 280 by a sputtering method, for example, and then subjected to CMP treatment until the insulator 280 is exposed.

Each of the insulator 275 and the insulator 280 can be formed by a sputtering method, a CVD method, an MBE method, a PLD method, or an ALD method.

The insulator 275 is preferably formed using an insulator having a function of inhibiting transmission of oxygen. For example, silicon nitride is preferably deposited by a PEALD method as the insulator 275. Alternatively, as the insulator 275, it is preferable that aluminum oxide be deposited by a sputtering method and silicon nitride be deposited thereover by a PEALD method. When the insulator 275 has such a stacked-layer structure, the function of inhibiting diffusion of impurities such as water or hydrogen and oxygen can be improved.

In this manner, the oxide 230a, the oxide 230b, the conductor 2421, and the conductor 242_2 can be covered with the insulator 275 having a function of inhibiting diffusion of oxygen. This structure can suppress direct diffusion of oxygen from the insulator 280 or the like into the insulator 224, the oxide 230a, the oxide 230b, the conductor 2421, and the conductor 242_2 in a later step.

Silicon oxide is preferably deposited by a sputtering method as the insulator 280. When an insulating film to be the insulator 280 is deposited by a sputtering method in an oxygen-containing atmosphere, the insulator 280 containing excess oxygen can be formed. Since a molecule containing hydrogen is not used as a deposition gas in the sputtering method, the concentration of hydrogen in the insulator 280 can be reduced. Note that heat treatment may be performed before the formation of the insulating film. The heat treatment may be performed under a reduced pressure, and the insulating film may be successively formed without exposure to the air. By such treatment, moisture and hydrogen adsorbed on the surface of the insulator 275 and the like can be removed, and the moisture concentrations and the hydrogen concentrations in the oxide 230a, the oxide 230b, and the insulator 224 can be reduced. The heat treatment can be performed with the above-described heat treatment conditions.

The insulator 280 may have a stacked-layer structure. For example, an insulator that functions as an etching stopper may be further provided over the silicon oxide film. As the insulator that functions as an etching stopper, the insulator that can be used as the insulator 283 or the like may be used as appropriate.

Next, the conductor 2422, the insulator 271, the insulator 275, and the insulator 280 are processed by lithography to form an opening reaching the conductor 242_1 and the insulator 222 (see FIGS. 9A to 9D). Here, the conductor 242_2 is divided into the conductors 242a2 and 242b2 and the insulator 271 is divided into the insulators 271a and 271b. The opening reaching the conductor 242_1 is formed in a region where the oxide 230b and the conductor 205 overlap with each other. In the cross-sectional view of the transistor 200 in the channel length direction, the opening has a width L1, which corresponds to the distance L1 between the conductors 242a2 and 242b2 illustrated in FIG. 2B. That is, the width of the opening is larger than the distance L2 between the conductors 242a1 and 242b1 illustrated in FIG. 2B.

The above-described method can be used as appropriate as the lithography. In order to process the opening in the insulator 280 finely, an electron beam or short-wavelength light such as EUV light is preferably used for the lithography.

For example, the SOC film, the SOG film, and the resist mask are formed in this order over the insulator 280 and lithography can be performed. A resist mask having an opening is formed using an electron beam or short-wavelength light such as EUV light, and the SOG film, the SOC film, the insulator 280, the insulator 275, the insulator 271, and the conductor 242_2 are processed with use of the resist mask.

The processing is preferably performed by dry etching. Dry etching makes anisotropic etching possible and thus is suitable for forming an opening with the width L1, which has a high aspect ratio, illustrated in FIG. 2B. Note that the above description can be referred to for the conditions and an apparatus for the dry etching. Etching treatment of the SOG film, the SOC film, the insulator 280, the insulator 275, the insulator 271, and the conductor 242_2 may be performed under different conditions.

In the etching of the SOG film, $CF_4$ can be used for an etching gas, for example. In the etching of the SOC film, $H_2$ and $N_2$ can be used as an etching gas, for example. In the case where silicon oxide is used for the insulator 280, $C_4F_8$, $C_4F_6$, $O_2$, and Ar can be used as an etching gas, for example. In the case where silicon nitride is used for the insulator 275, $CH_2F_2$, $O_2$, and Ar can be used as an etching gas, for example. In the case where a film formed by stacking silicon nitride and silicon oxide is used for the insulator 271, etching can be performed with an ICP etching apparatus using $CHF_3$ and $O_2$ as an etching gas, for example.

In the case where tungsten is used for the conductor 242_2 and tantalum nitride is used for the conductor 2421, etching can be performed with an ICP etching apparatus using $CF_4$, $Cl_2$, and $O_2$ as an etching gas, for example. Here, since the conductor 242_2 overlapping with the opening with the width L1 formed in the insulator 280 and the like is etched, the distance between the divided conductors 242$a$2 and 242$b$2 becomes L1.

This etching treatment needs to be stopped when the opening reaches the top surface of the conductor 242_1 in order that the conductors 242$a$1 and 242$b$1 between which the distance is L2 are formed under the conductors 242$a$2 and 242$b$2 in a later step. Therefore, in this step, etching is performed with an ICP etching apparatus under a condition that the etching rate of the conductor 242_2 with respect to the etching rate of the conductor 2421 (hereinafter referred to as etching selectivity of the conductor 242_2) is high.

When bias power applied to a lower electrode of the ICP etching apparatus is set low, ion incident energy can be reduced and the etching rate of the conductor 242_1 can be reduced. For example, the bias power applied to the lower electrode of the ICP etching apparatus is set lower than 50 W, preferably approximately 25 W or lower than or equal to 25 W. However, the present invention is not limited thereto, and the bias power applied to the lower electrode of the ICP etching apparatus can be set higher than or equal to 50 W. When the bias power is high, the depression formed on the side surfaces of the conductors 242$a$2 and 242$b$2 can be small. In that case, the bias power is set to 100 W, for example.

When $CF_4$, $Cl_2$, and $O_2$ are used as an etching gas, tungsten of the conductor 242_2 becomes a reaction product with high volatility, such as $WF_6$ or $WOCl$, and the etching rate of the conductor 242_2 is increased. In contrast, tantalum nitride on the surface of the conductor 242_1 becomes a reaction product with extremely low volatility, such as tantalum oxide or tantalum oxynitride, and etching is suppressed. Therefore, the flow rate ratio of an oxygen gas in the etching gas is preferably high. For example, the flow rate ratio of an oxygen gas in the etching gas is set to higher than or equal to 35%.

The etching of the conductor 2422 is performed under the above conditions; thus, the conductor 242_2 can be divided into the conductors 242$a$2 and 242$b$2 without excessive etching of the conductor 242_1. Accordingly, processing can be performed as designed even in a semiconductor device with a minute structure.

To remove the SOC film, dry etching treatment such as ashing using oxygen plasma or wet etching treatment may be used. Alternatively, wet etching treatment may be performed after dry etching treatment, or dry etching treatment may be performed after wet etching treatment.

The processing of the insulator 271 and the conductor 242_2 and removal of the SOC film can be performed successively without exposure to the air. For example, the processing may be performed with use of a multi-chamber etching apparatus without exposure to the air.

In the above manner, the conductor 2422, the insulator 271, the insulator 275, and the insulator 280 are processed to form the opening with the width L1.

Next, an insulating film 255A is formed to cover the insulator 280, the conductor 2421, and the insulator 222 (see FIGS. 10A to 10D). The insulating film 255A is an insulating film to be the insulator 255 in a later step, and the nitride insulator described above can be used, for example. The insulating film 255A can be formed by a sputtering method, a CVD method, an MBE method, a PLD method, an ALD method, or the like.

The insulating film 255A preferably has good coverage because the insulating film 255A is formed along the opening formed in the conductor 242$a$2, the conductor 242$b$2, the insulator 271, the insulator 275, and the insulator 280. Accordingly, the insulating film 255A is preferably formed by an ALD method or the like, which provides good coverage. As the insulating film 255A, for example, silicon nitride is preferably deposited by a PEALD method.

Next, an insulating film 256A is formed over the insulating film 255A (see FIGS. 10A to 10D). For the insulating film 256A, the above-described oxide insulator that can be used as the insulator 250$b$ or the like can be used. The insulating film 256A can be formed by a sputtering method, a CVD method, an MBE method, a PLD method, or an ALD method, for example.

In a manner similar to that of the insulating film 255A, the insulating film 256A preferably has good coverage because the insulating film 256A is formed along the opening formed in the conductor 242$a$2, the conductor 242$b$2, the insulator 271, the insulator 275, and the insulator 280. Accordingly, the insulating film 256A is preferably formed by an ALD method or the like, which provides good coverage. As the insulating film 256A, for example, silicon oxide is preferably deposited by a PEALD method. Note that the insulating film 255A and the insulating film 256A can be formed successively without exposure to the air. For example, the film formation may be performed with use of a multi-chamber film formation apparatus without exposure to the air.

Figure 11A:
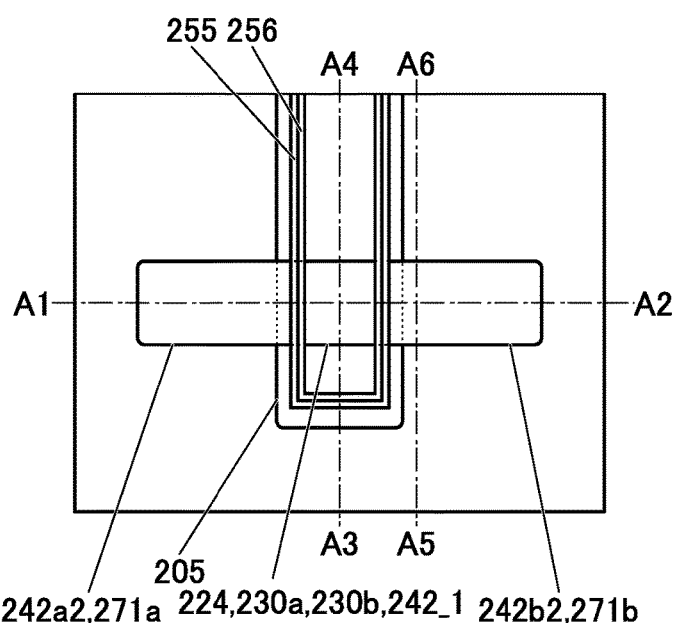
FIG. 11A is a plan view illustrating an example of a manufacturing method of a semiconductor device.
Figure 11C:
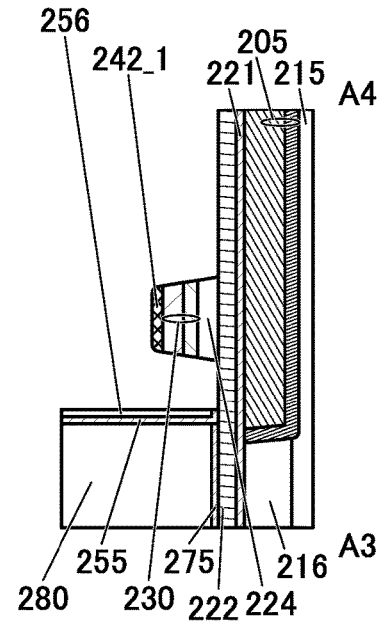
FIGS. 11B to 11D are cross-sectional views illustrating the example of a manufacturing method of a semiconductor device.
Figure 11B:
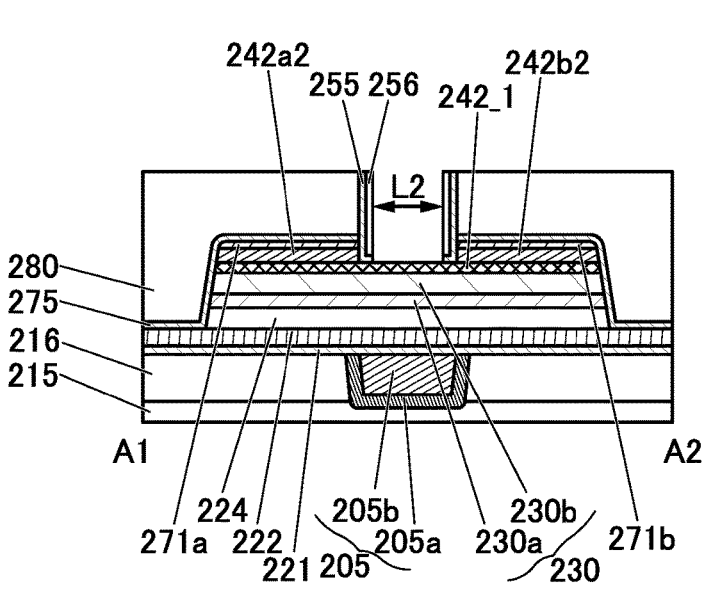
Figure 11D:
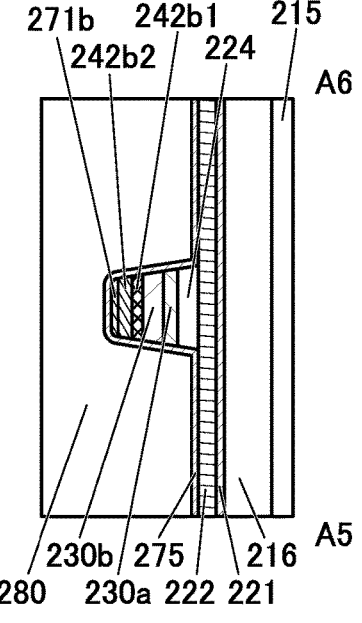
Figure 12A:
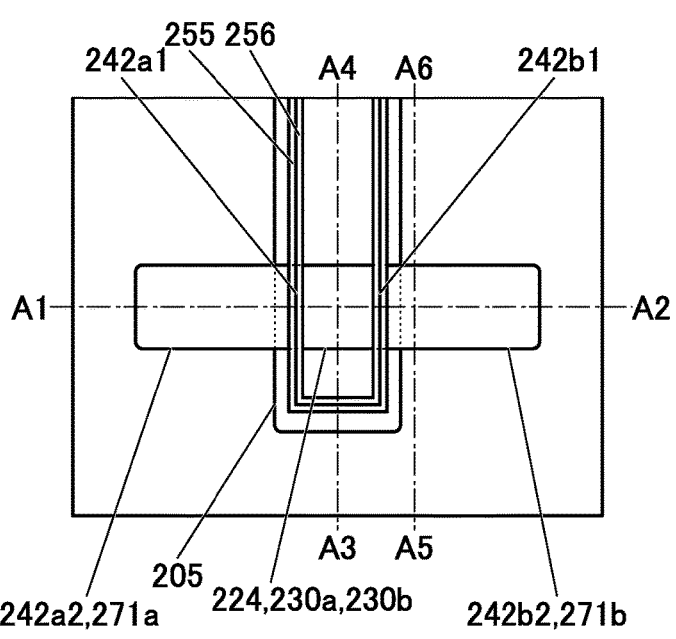
FIG. 12A is a plan view illustrating an example of a manufacturing method of a semiconductor device.
Figure 12C:
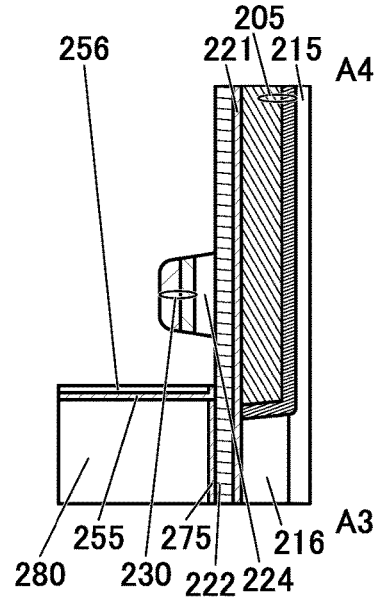
FIGS. 12B to 12D are cross-sectional views illustrating the example of a manufacturing method of a semiconductor device.
Figure 12B:
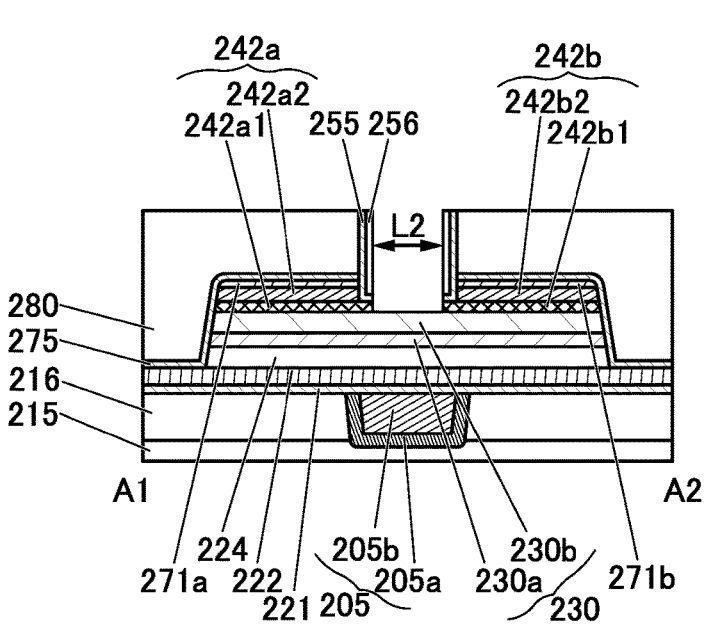
Figure 12D:
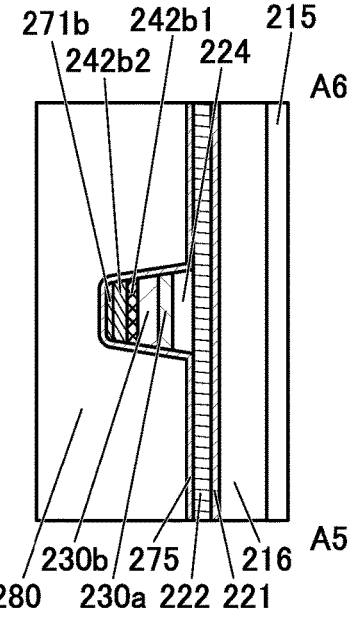
Figure 13A:
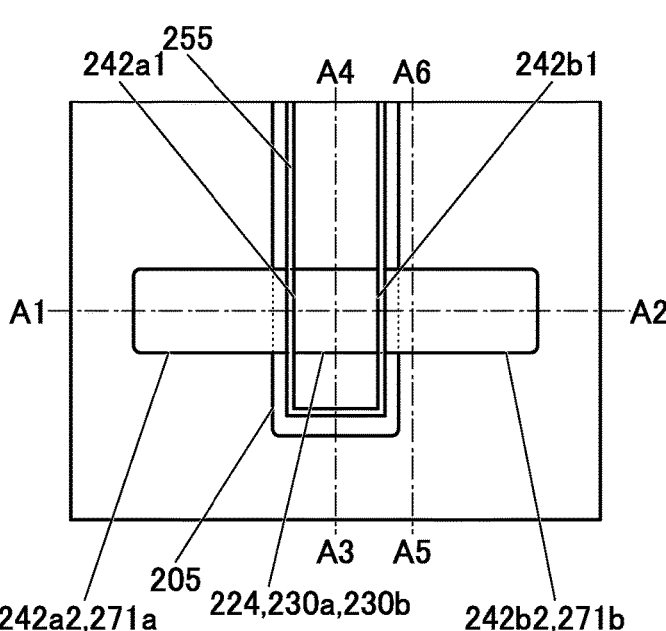
FIG. 13A is a plan view illustrating an example of a manufacturing method of a semiconductor device.
Figure 13C:
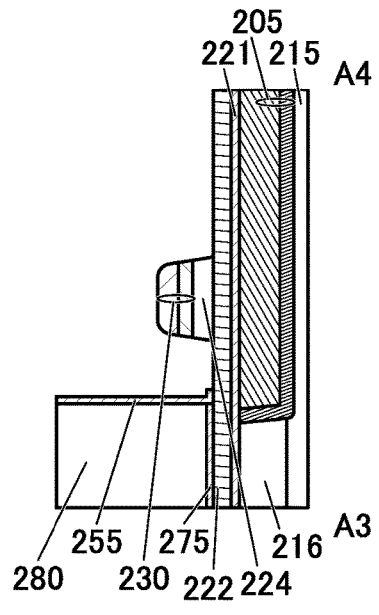
FIGS. 13B to 13D are cross-sectional views illustrating the example of a manufacturing method of a semiconductor device.
Figure 13B:
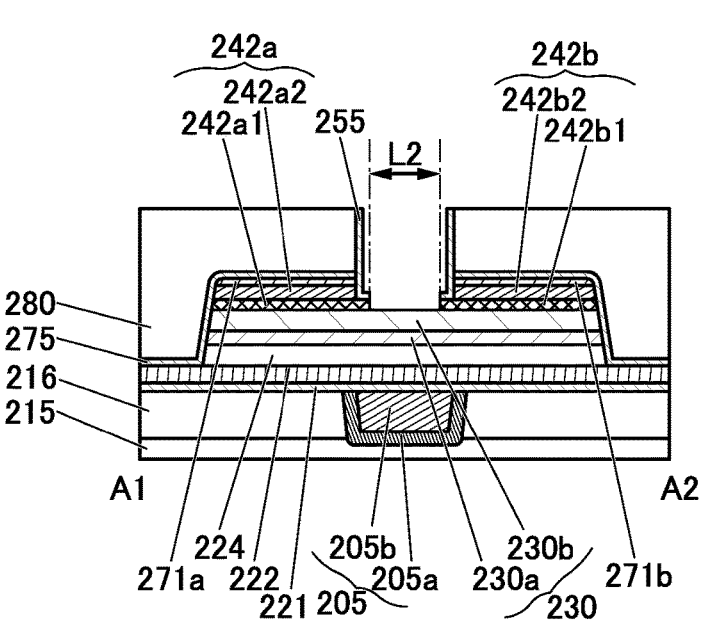
Figure 13D:
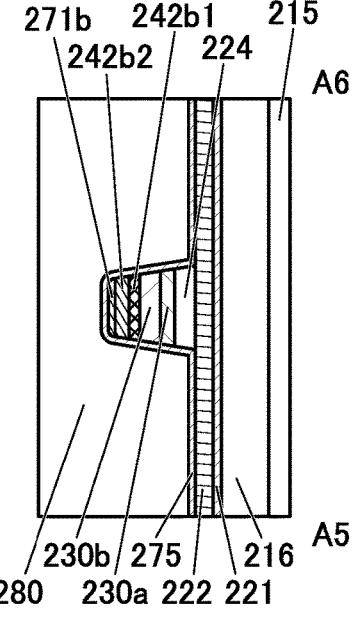

Next, a part of the insulating film 255A and a part of the insulating film 256A are removed by anisotropic etching, so that the insulator 255 and the insulator 256 in a sidewall shape are formed in contact with the sidewall of the opening (see FIGS. 11A to 11D). Thus, the insulator 255 is formed in contact with the side surfaces of the insulator 280, the insulator 275, the insulator 271$a$, the insulator 271$b$, the conductor 242$a$2, and the conductor 242$b$2, and the top surfaces of the conductor 242_1 and the insulator 222. As illustrated in FIGS. 11B and 11C, a projecting portion is formed in a portion of the insulator 255 in contact with the top surface of the conductor 242_1 or the top surface of the insulator 222. The projecting portion of the insulator 255 extends toward the center of the opening formed in the insulator 280 and the like, beyond the other portion of the insulator 255. That is, the insulator 255 has what is called an L-like shape in the cross-sectional view in the channel length direction.

The insulator 256 is formed to be positioned on the inner side of the insulator 255. As illustrated in FIGS. 11B and 11C, a bottom surface of the insulator 256 is in contact with a top surface of the projecting portion of the insulator 255, and one side surface of the insulator 256 is in contact with the side surface of the insulator 255. In a top view, the side surface of the insulator 256 is aligned or substantially aligned with the end portion of the projecting portion of the insulator 255.

In a cross-sectional view in the channel length direction, since the insulators 255 and 256 are formed in the opening with the width L1, the distance between the insulator 256 on the A1 side and the insulator 256 on the A2 side, which is regarded as L2, is shorter than L1. Here, the distance L2 can be regarded as the distance between the end portion of the projecting portion of the insulator 255 on the A1 side and the end portion of the projecting portion of the insulator 255 on the A2 side.

Dry etching is preferably employed for anisotropic etching of the insulating film 255A and the insulating film 256A. Note that the above description can be referred to for the conditions and an apparatus for the dry etching. In the case where silicon nitride is used for the insulating film 255A and silicon oxide is used for the insulating film 256A, etching can be performed with an ICP etching apparatus using $CHF_3$ and $O_2$ as an etching gas, for example.

An ion generated in the etching of the insulating films 255A and 256A might collide with a corner of the edge of the opening formed in the insulators 280 and 255. Thus, as illustrated in FIG. 4C, the corner is polished to have a tapered shape in some cases. The corner is likely to be removed when a gas that is easily ionized, such as argon, is contained in the etching gas or a bias voltage is applied to an electrode on the substrate side, for example.

Subsequently, the conductor 2421 exposed from the insulators 255 and 256 is removed by anisotropic etching to form the conductors 242a1 and 242b1 (see FIGS. 12A to 12D). In other words, the conductor 2421 is processed using the insulators 255 and 256 as masks, whereby the conductor 242_1 is divided into the conductors 242a1 and 242b1. By processing the conductor 2421 using the insulators 255 and 256 as masks in this manner, in a cross-sectional view of the transistor 200, the end portion of the projecting portion of the insulator 255 is aligned or substantially aligned with the side end portions of the conductors 242a1 and 242b1. Thus, in the cross-sectional view in the channel length direction, the distance between the conductors 242a1 and 242b1 also becomes L2.

Dry etching is preferably employed for the anisotropic etching. Note that the above description can be referred to for the conditions and an apparatus for the dry etching. In the case where tantalum nitride is used for the conductor 242_1, etching can be performed with an ICP etching apparatus using $Cl_2$ and Ar as an etching gas, for example.

As described above, the insulators 255 and 256 are formed over the conductor 2421 by anisotropic etching, and the conductor 242_1 is divided using the insulators 255 and 256 as masks, whereby the insulators 255 and 256 which function as masks can be formed in a self-aligned manner. Accordingly, the numbers of masks and steps can be reduced in the process of manufacturing the semiconductor device of this embodiment. Therefore, a method of manufacturing a semiconductor device with high productivity can be provided.

By the above method, the opportunity for exposure of the island-shaped oxide 230 to a dry etching atmosphere can be only during the processing of the conductor 242_1. In other words, at the time of forming the insulators 255 and 256, exposure of the top surface of the island-shaped oxide 230 to a dry etching atmosphere can be prevented. This can reduce dry etching damage (e.g., damage due to ion collision) to the oxide 230b functioning as the channel formation region of the transistor 200. By reducing the bias power from the middle of the dry etching of the conductor 2421, damage to the oxide 230 can be further reduced. However, as illustrated in FIG. 4A, a depression is formed in a portion of the oxide 230 exposed from the conductors 242a1 and 242b1 in some cases.

Note that ashing treatment using oxygen plasma may be performed after the processing of the conductor 242_1. Such oxygen plasma treatment can remove impurities generated by the etching and diffusing into the oxide 230 or the like. The impurities are generated by a component of the object processed by the above etching and a component contained in a gas or the like used for the etching. Examples of the impurities include chlorine, fluorine, tantalum, silicon, and hafnium. In particular, when a chlorine gas is used in the processing of the conductor 242_1 as in the above-described etching, the oxide 230 is exposed to the atmosphere containing the chlorine gas, in which case chlorine attached to the oxide 230 is preferably removed. Removal of impurities attached to the oxide 230 in this manner can improve the electrical characteristics and reliability of the transistor.

At least a part of the insulator 255 might be oxidized by the oxygen plasma treatment. In other words, the insulator 255 might contain oxygen. In that case, a region of the insulator 255 which has a high oxygen concentration is observed through composition analysis performed on the insulator 255 by SIMS or the like. After oxidation of the insulator 255 proceeds and the transistor 200 is formed, at least a part of the insulator 255 becomes silicon oxynitride or silicon nitride oxide in some cases.

The processing of the insulating films 255A and 256A and the conductor 242_1 and the oxygen plasma treatment can be performed successively without exposure to the air. For example, the processing may be performed with use of a multi-chamber etching apparatus without exposure to the air.

Next, the insulator 256 is preferably subjected to isotropic etching to be selectively removed (see FIGS. 13A to 13D). As the isotropic etching, for example, wet etching is performed. Here, in the isotropic etching, it is preferable that an etching rate of the insulator 256 be sufficiently higher than that of the insulator 255. Furthermore, it is preferable that the etching rate of the insulator 256 be sufficiently higher than that of the oxide 230.

By the isotropic etching in the above manner, the insulator 255 can be left while the insulator 256 is removed. Thus, the projecting portion of the insulator 255, a part of the conductor 242a1, and a part of the conductor 242b1 extend in the opening formed in the insulator 280 and the like.

When the insulator 280 has a stacked-layer structure and an insulator functioning as an etching stopper is deposited on its top surface as described above, the top surface of the insulator 280 can be prevented from being etched in the isotropic etching.

Although an example where the insulator 256 is removed after the processing of the conductor 242_1 is described above, the present invention is not limited to this example. For example, the insulators 255 and 256 are formed and the insulator 256 is removed by the isotropic etching, and then the conductor 242_1 can be processed. In this manner, the top surface of the oxide 230b can be prevented from being exposed to the isotropic etching of the insulator 256. Thus, damage to the oxide 230b, which functions as the channel formation region of the transistor 200, caused by the isotropic etching (e.g., damage caused by etchant) can be reduced. At the time of formation of the insulators 255 and 256, the insulator 255 is formed to have an L-like shape in the cross-sectional view; thus, the insulator 255 with the L-like shape may be used as a mask for the processing of the conductor 242_1.

In the above manner, the conductors 242a1 and 242b1 having oxidation resistance can be formed below the conductors 242a2 and 242b2 having high conductivity, and the insulator 255 having oxidation resistance can be formed in contact with the side surfaces of the conductors 242a2 and 242b2. With this structure, the conductors 242a2 and 242b2 having high conductivity can be used as the source electrode and the drain electrode of the transistor 200, so that frequency characteristics of the transistor 200 and operation speed of the semiconductor device can be improved. Furthermore, the conductors 242a1 and 242b1 can be formed to extend beyond the conductors 242a2 and 242b2 to the same extent as the projecting portion of the insulator 255; accordingly, the distance between the source and the drain can be shortened, which can shorten the channel length. Hence, the transistor 200 can have a high on-state current, a low S value, and improved frequency characteristics.

In order to remove the impurities attached to the surface of the oxide 230b in the etching step, cleaning treatment may be performed. Examples of the cleaning method include wet cleaning using a cleaning solution (also can be referred to as wet etching treatment), plasma treatment using plasma, and cleaning by heat treatment, and any of these cleanings may be performed in combination as appropriate. The cleaning treatment sometimes makes the groove deeper.

The wet cleaning may be performed using an aqueous solution in which one or more of ammonia water, oxalic acid, phosphoric acid, and hydrofluoric acid are diluted with carbonated water or pure water; pure water; or carbonated water, for example. Alternatively, ultrasonic cleaning using such an aqueous solution, pure water, or carbonated water may be performed. Further alternatively, such cleaning methods may be performed in combination as appropriate.

In the step of FIG. 11C, in the cross-sectional view in the channel width direction in FIG. 14A, a part of the insulator 255 is formed in contact with the side surface of the insulator 224, a side surface of the oxide 230, a side surface of the conductor 242_1, and the top surface of the insulator 222 and the insulator 256 is formed over the insulator 255 in some cases. In that case, in the step of FIG. 13C, as illustrated in FIG. 14B, in the cross-sectional view in the channel width direction, a part of the insulator 255 is formed in contact with the side surface of the insulator 224, the side surface of the oxide 230, the side surface of the conductor 2421, and the top surface of the insulator 222 in some cases. Moreover, as illustrated in FIG. 14C, in the transistor 200, a part of the insulator 255 is formed in contact with the side surface of the oxide 230 and the side surface of the insulator 224 in some cases. At this time, in the transistor 200, the insulator 250 is in contact with neither the side surface of the oxide 230 nor the side surface of the insulator 224.

Note that in this specification and the like, in some cases, an aqueous solution in which hydrofluoric acid is diluted with pure water is referred to as diluted hydrofluoric acid, and an aqueous solution in which ammonia water is diluted with pure water is referred to as diluted ammonia water. The concentration, temperature, and the like of the aqueous solution are adjusted as appropriate in accordance with an impurity to be removed, the structure of a semiconductor device to be cleaned, or the like. The concentration of ammonia in the diluted ammonia water is preferably higher than or equal to 0.01% and lower than or equal to 5%, further preferably higher than or equal to 0.1% and lower than or equal to 0.5%. The concentration of hydrogen fluoride in the diluted hydrofluoric acid is preferably higher than or equal to 0.01 ppm and lower than or equal to 100 ppm, further preferably higher than or equal to 0.1 ppm and lower than or equal to 10 ppm.

A frequency greater than or equal to 200 kHz is preferably used for the ultrasonic cleaning, and a frequency greater than or equal to 900 kHz is further preferably used. Damage to the oxide 230b and the like can be reduced with this frequency.

The cleaning treatment may be performed plural times, and the cleaning solution may be changed in every cleaning treatment. For example, the first cleaning treatment may use diluted hydrofluoric acid or diluted ammonia water and the second cleaning treatment may use pure water or carbonated water.

In this embodiment, as the cleaning, wet cleaning is performed with use of diluted ammonia water. The cleaning treatment allows removing impurities that are attached onto the surfaces of the oxides 230a and 230b and the like or diffused into the oxides 230a and 230b and the like. Furthermore, the crystallinity of the oxides 230a and 230b and the like can be improved.

After the etching or the cleaning, heat treatment is preferably performed. The temperature of the heat treatment is preferably higher than or equal to 100° C., higher than or equal to 250° C., or higher than or equal to 350° C. and lower than or equal to 650° C., lower than or equal to 600° C., lower than or equal to 550° C., or lower than or equal to 400° C. The heat treatment is performed in a nitrogen gas atmosphere, an inert gas atmosphere, or an atmosphere containing an oxidizing gas at 10 ppm or more, 1% or more, or 10% or more. The heat treatment is preferably performed in an atmosphere containing oxygen. For example, it is preferable that the flow rate ratio of a nitrogen gas to an oxygen gas be 4:1 and the heat treatment be performed at a temperature of 350° C. for an hour. This supplies oxygen to the oxides 230a and 230b, and reduces oxygen vacancies. In addition, the crystallinity of the oxide 230b can be improved by the heat treatment. Furthermore, hydrogen remaining in the oxides 230a and 230b reacts with supplied oxygen, so that the hydrogen can be removed as $H_2O$ (dehydration). This can inhibit recombination of hydrogen remaining in the oxides 230a and 230b with oxygen vacancies and formation of VoH. Accordingly, a transistor including the oxide 230 can have favorable electrical characteristics and high reliability. In addition, variations in electrical characteristics of transistors formed over the same substrate can be reduced. The heat treatment may be performed under a reduced pressure. Alternatively, the heat treatment may be performed in such a manner that heat treatment is performed in an oxygen atmosphere, and then another heat treatment is successively performed in a nitrogen atmosphere without exposure to the air. Note that although an example where heat treatment is performed after the removal of the insulator 256 is described in this embodiment, the present invention is not limited to this example. The insulator 256 can be removed after the heat treatment.

Here, as described above, the insulator 255, which includes an inorganic insulator that is less likely to be oxidized, is in contact with the side surface of the conductor 242a2 and the side surface of the conductor 242b2. This can prevent the conductors 242a2 and 242b2 from being excessively oxidized by the heat treatment even when a tungsten film or the like that is relatively easily oxidized is used for the conductors 242a2 and 242b2.

In the case where heat treatment is performed in a state where the oxide 230b is in contact with the conductors 242a and 242b, the sheet resistance is sometimes reduced in each of a region of the oxide 230b which overlaps with the conductor 242a and a region of the oxide 230b which overlaps with the conductor 242b. The carrier concentration is sometimes increased. Thus, the resistance of each of the region of the oxide 230b which overlaps with the conductor 242a and the region of the oxide 230b which overlaps with the conductor 242b can be lowered in a self-aligned manner.

Next, an insulating film 250A to be the insulator 250 is formed to fill the opening formed in the insulator 280 and the like (see FIGS. 15A to 15D). Here, the insulating film 250A is in contact with the insulator 280, the insulator 255, the conductor 242a1, the conductor 242b1, the insulator 222, the insulator 224, the oxide 230a, and the oxide 230b. Since the projecting portions of the insulator 255, the part of the conductor 242a1, and the part of the conductor 242b1 extend in the opening formed in the insulator 280 and the like, the shape of the insulating film 250A is reflected by the shapes of the projecting portions of the insulator 255, the part of the conductor 242a1, and the part of the conductor 242b1.

The insulating film 250A can be formed by a sputtering method, a CVD method, an MBE method, a PLD method, an ALD method, or the like. For example, the insulating film 250A is preferably formed by an ALD method. Like the above-described insulator 250, the insulating film 250A is preferably formed to have a small thickness, and an unevenness of the thickness needs to be reduced. In the ALD method, a precursor and a reactant (such as oxidizer) are alternately introduced to deposit a film, and the film thickness can be adjusted by the number of repetition times of the sequence of the gas introduction; thus, accurate control of the film thickness is possible. In addition, the insulating film 250A needs to be formed on the bottom surface and the side surface of the opening so as to have good coverage. One atomic layer can be deposited at a time on the bottom and side surfaces of the opening by the ALD method, whereby the insulating film 250A can be formed in the opening with good coverage.

When the insulating film 250A is deposited by an ALD method, ozone ($O_3$), oxygen ($O_2$), water ($H_2O$), or the like is used as the oxidizer. When an oxidizer without hydrogen, such as ($O_3$) or ($O_2$), is used, the amount of hydrogen diffusing into the oxide 230b can be reduced.

The insulator 250 can have a stacked-layer structure as illustrated in FIG. 2A and the like. A method of forming the insulating film 250A in the case where the insulator 250 has a three-layer structure of an insulator 250a, an insulator 250b, and an insulator 250c as in FIG. 2A will be described below with reference to FIGS. 16A to 16C. The insulating film 250A in FIGS. 16A to 16C includes an insulating film 250Aa, an insulating film 250Ab over the insulating film 250Aa, and an insulating film 250Ac over the insulating film 250Ab.

First, the insulating film 250Aa to be the insulator 250a is formed to fill the opening formed in the insulator 280 and the like, and the insulating film 250Ab is formed over the insulating film 250Aa (see FIG. 16A). In this embodiment, aluminum oxide is deposited for the insulating film 250Aa by a thermal ALD method and silicon oxide is deposited for the insulating film 250Ab by a PEALD method.

Next, microwave treatment is preferably performed in an atmosphere containing oxygen (see FIG. 16B). Here, the microwave treatment refers to, for example, treatment using an apparatus including a power source that generates high-density plasma with use of a microwave. Note that in this specification and the like, a microwave refers to an electromagnetic wave having a frequency from 300 MHz to 300 GHz, inclusive in some cases.

The microwave treatment is preferably performed with a microwave treatment apparatus including a power source for generating high-density plasma using microwaves, for example. Here, the frequency of the microwave treatment apparatus is preferably set to greater than or equal to 300 MHz and less than or equal to 300 GHz, further preferably greater than or equal to 2.4 GHz and less than or equal to 2.5 GHz, for example, 2.45 GHz. Oxygen radicals at a high density can be generated with high-density plasma. The electric power of the power source that applies microwaves of the microwave treatment apparatus is preferably set to higher than or equal to 1000 W and lower than or equal to 10000 W, further preferably higher than or equal to 2000 W and lower than or equal to 5000 W. A power source may be provided to the microwave treatment apparatus to apply RF to the substrate side. Furthermore, application of RF to the substrate side allows oxygen ions generated by the high-density plasma to be efficiently introduced into the oxide 230b.

The microwave treatment is preferably performed under a reduced pressure, and the pressure is preferably higher than or equal to 10 Pa and lower than or equal to 1000 Pa, further preferably higher than or equal to 300 Pa and lower than or equal to 700 Pa. The treatment temperature is preferably lower than or equal to 750° C., further preferably lower than or equal to 500° C., and can be approximately 250° C., for example. The oxygen plasma treatment can be followed successively by heat treatment without exposure to the air. The heat treatment temperature is preferably, for example, higher than or equal to 100° C. and lower than or equal to 750° C., further preferably higher than or equal to 300° C. and lower than or equal to 500° C.

Furthermore, the microwave treatment can be performed using an oxygen gas and an argon gas, for example. Here, the oxygen flow rate ratio ($O_2/O_2+Ar$) is higher than 0% and lower than or equal to 100%. The oxygen flow rate ratio ($O_2/O_2+Ar$) is preferably higher than 0% and lower than or equal to 50%. The oxygen flow rate ratio ($O_2/O_2+Ar$) is further preferably higher than or equal to 10% and lower than or equal to 40%. The oxygen flow rate ratio ($O_2/O_2+Ar$) is still further preferably higher than or equal to 10% and lower than or equal to 30%. The carrier concentration in the oxide 230b can be reduced by thus performing the microwave treatment in an atmosphere containing oxygen. In addition, the carrier concentrations in the oxide 230b can be prevented from being excessively reduced by preventing an excessive amount of oxygen from being introduced into the chamber in the microwave treatment.

The microwave treatment in an atmosphere containing oxygen converts an oxygen gas into plasma using a high-frequency wave such as microwave or RF, and applies the oxygen plasma to a region of the oxide 230b that is between the conductor 242a and the conductor 242b. By the effects of plasma, microwave, and the like, VoH in the region can be divided into oxygen vacancies and hydrogen, and hydrogen can be removed from the region. Here, in the case of the structure illustrated in FIG. 2A and the like, an insulating film (e.g., aluminum oxide) having a function of capturing or fixing hydrogen is preferably used as the insulating film 250Aa. With such a structure, hydrogen generated by the microwave treatment can be captured or fixed in the insulating film 250Aa. In this manner, the amount of VoH contained in the channel formation region can be reduced. As a result, oxygen vacancies and VoH in the channel formation region can be reduced to lower the carrier concentration. In addition, oxygen radicals generated by the oxygen plasma can be supplied to oxygen vacancies formed in the channel formation region, thereby further reducing oxygen vacancies and lowering the carrier concentration in the channel formation region.

Oxygen supplied into the channel formation region has a variety of forms such as an oxygen atom, an oxygen molecule, an oxygen ion, and an oxygen radical (also referred to as O radical which is an atom, a molecule or an ion having an unpaired electron). The oxygen supplied to the channel formation region preferably has one or more of the above forms. An oxygen radical is particularly preferable. In addition, the insulator 250 can have improved film quality, which increases the reliability of the transistor.

In contrast, the oxide 230b includes a region overlapping with the conductor 242a or 242b. The region can function as a source region or a drain region. Here, the conductors 242a and 242b preferably function as a blocking film preventing the effect of the microwave, the high-frequency wave such as RF, the oxygen plasma, or the like in the microwave treatment in an atmosphere containing oxygen. Therefore, the conductors 242a and 242b preferably have a function of blocking an electromagnetic wave greater than or equal to 300 MHz and less than or equal to 300 GHz, for example, greater than or equal to 2.4 GHz and less than or equal to 2.5 GHz.

Since the conductors 242a and 242b prevents the effect of the microwave, the high-frequency wave such as RF, the oxygen plasma, or the like, the effect does not reach the region of the oxide 230b which overlaps with the conductor 242a or 242b. Hence, a reduction in VoH and supply of an excessive amount of oxygen do not occur in the source and drain regions, preventing a decrease in carrier concentration.

The insulator 255 having a barrier property against oxygen is provided in contact with the side surfaces of the conductors 242a2 and 242b2. The insulating films 250Aa and 250Ab are provided to cover the conductors 242a1 and 242b1 and the insulator 255. Thus, formation of oxide films on the side surfaces of the conductors 242a and 242b by the microwave treatment can be inhibited.

In the above manner, oxygen vacancies and VoH can be selectively removed from the channel formation region in the oxide semiconductor, whereby the channel formation region can be an i-type or substantially i-type region. Furthermore, supply of an excess amount of oxygen to the regions functioning as the source region and the drain region can be inhibited and the conductivity (low-resistance regions) before the microwave treatment can be maintained. As a result, a change in the electrical characteristics of the transistor can be inhibited, and thus variation in the electrical characteristics of the transistors in the substrate plane can be inhibited.

In the microwave treatment, thermal energy is directly transmitted to the oxide 230b in some cases owing to an electromagnetic interaction between the microwave and a molecule in the oxide 230b. The oxide 230b might be heated by this thermal energy. Such heat treatment is sometimes referred to as microwave annealing. When microwave treatment is performed in an atmosphere containing oxygen, an effect equivalent to that of oxygen annealing might be obtained. In the case where hydrogen is contained in the oxide 230b, it is probable that the thermal energy is transmitted to the hydrogen in the oxide 230b and the hydrogen activated by the energy is released from the oxide 230b.

The microwave treatment improves the film quality of the insulating films 250Aa and 250Ab, thereby inhibiting diffusion of hydrogen, water, impurities, and the like. Accordingly, hydrogen, water, impurities, and the like can be inhibited from diffusing into the oxides 230b and 230a and the like through the insulator 250 in the following step such as formation of a conductive film to be the conductor 260 or the following treatment such as heat treatment. By improving the film quality of the insulator 250 as described above, the reliability of the transistor can be improved.

Next, the insulating film 250Ac is formed over the insulating film 250Ab (see FIG. 16C). In this embodiment, silicon nitride is deposited for the insulating film 250Ac by a PEALD method. In this manner, the insulating film 250A including the insulating films 250Aa to 250Ac can be formed.

Although an example in which microwave treatment is performed after the formation of the insulating film 250Ab is described above, the present invention is not limited to this example. After the formation of the insulating film 250Ac, the microwave treatment can be performed. Alternatively, before the formation of the insulating film 250Aa, the microwave treatment can be performed.

After the microwave treatment, heat treatment may be performed with the reduced pressure being maintained. Such treatment enables hydrogen in the insulating film and the oxides 230a and 230b to be removed efficiently. Some hydrogen may be gettered by the conductors 242a and 242b. Alternatively, the step of performing microwave treatment and then performing heat treatment with the reduced pressure being maintained may be repeated a plurality of cycles. The repetition of the heat treatment enables hydrogen in the insulating film and the oxides 230a and 230b to be removed more efficiently. Note that the temperature of the heat treatment is preferably higher than or equal to 300° C. and lower than or equal to 500° C. The microwave treatment, i.e., the microwave annealing may also serve as the heat treatment. The heat treatment is not necessarily performed in the case where the oxide 230b and the like are sufficiently heated by the microwave annealing.

In the case where the insulator 250 has a stacked-layer structure of the insulator 250a and the insulator 250c as illustrated in FIG. 3A, the insulating film 250Ab is not formed in the above process. In the case where the insulator 250 has a stacked-layer structure of the insulators 250a, 250b, 250c, and 250d as illustrated in FIG. 3B, the following steps may be performed: an insulating film to be the insulator 250d is formed after the microwave treatment in FIG. 16B, the microwave treatment is performed again, and then the insulating film 250Ac is formed. Here, hafnium oxide can be deposited by a thermal ALD method as the insulating film to be the insulator 250d. As described above, the microwave treatment in an atmosphere containing oxygen may be performed multiple times (at least two or more times).

Next, a conductive film 260A to be the conductor 260a and a conductive film 260B to be the conductor 260b are formed in this order (see FIGS. 17A to 17D). Each of the conductive films 260A and 260B can be formed by a sputtering method, a CVD method, an MBE method, a PLD method, a plating method, or an ALD method. In this embodiment, titanium nitride is deposited by an ALD method as the conductive film 260A, and tungsten is deposited by a CVD method as the conductive film 260B.

Then, the insulating film 250A, the conductive film 260A, and the conductive film 260B are polished by CMP treatment until the insulator 280 is exposed. That is, portions of the insulating film 250A, the conductive film 260A, and the conductive film 260B exposed from the opening are removed. Thus, the insulator 250 and the conductor 260 (the conductors 260a and 260b) are formed in the opening overlapping with the conductor 205 (see FIGS. 18A to 18D).

Thus, the insulator 250 is in contact with the insulator 255, the conductor 242a1, the conductor 242b1, the oxide 230, the insulator 224, and the insulator 222 in the opening. The conductor 260 is positioned to fill the opening with the insulator 250 positioned therebetween. In this manner, the transistor 200 is formed.

Note that in the case where the insulator 280 has a stacked-layer structure and an insulator functioning as an etching stopper is provided on its top surface, the insulator functioning as an etching stopper is preferably removed by the CMP treatment. This can prevent the insulator functioning as an etching stopper from inhibiting addition of oxygen to the insulator 280, which is performed in a later step.

Next, the insulator 282 is formed over the insulator 255, the insulator 250, the conductor 260, and the insulator 280. The insulator 282 can be formed by a sputtering method, a CVD method, an MBE method, a PLD method, an ALD method, or the like. The insulator 282 is preferably formed by a sputtering method. Since a molecule containing hydrogen is not used as a deposition gas in the sputtering method, the concentration of hydrogen in the insulator 282 can be reduced.

Forming the insulator 282 in an atmosphere containing oxygen by a sputtering method can provide oxygen to the insulator 280 during the formation. Thus, excess oxygen can be contained in the insulator 280. The formation of the insulator 282 is preferably performed while the substrate is heated. Here, as described above, when part of the insulator 255 is oxidized, oxygen that has been supplied to the insulator 280 is diffused into the oxide 230b through the insulator 255 and the insulator 250, so that a suitable amount of oxygen can be supplied to the oxide 230b.

In this embodiment, as the insulator 282, aluminum oxide is deposited by a sputtering method using an aluminum target in an atmosphere containing an oxygen gas. The amount of oxygen implanted into a layer below the insulator 282 can be controlled depending on the amount of the RF power applied to the substrate in a sputtering method. For example, as the RF power is lower, the amount of oxygen implanted to a layer below the insulator 282 decreases, and the amount of oxygen is easily saturated even when the thickness of the insulator 282 is small. As the RF power is higher, the amount of oxygen implanted to the layer below the insulator 282 increases. With low RF power, the amount of oxygen implanted to the insulator 280 can be reduced. The insulator 282 may have a two-layer structure. In that case, for example, the layer below the insulator 282 is formed while RF power is not applied to the substrate and the layer above the insulator 282 is formed while RF power is applied to the substrate.

Note that the RF frequency is preferably 10 MHz or higher. The typical frequency is 13.56 MHz. The higher the RF frequency is, the less damage to the substrate can be.

Note that heat treatment may be performed before the formation of the insulator 282. The heat treatment may be performed under a reduced pressure, and the insulator 282 may be successively formed without exposure to the air. Such treatment can remove moisture and hydrogen adsorbed on the surface of the insulator 280 and reduce the moisture concentration and the hydrogen concentration in the insulator 280. The temperature of the heat treatment is preferably higher than or equal to 100° C. and lower than or equal to 400° C. In this embodiment, the temperature of the heat treatment is 250° C.

Next, an insulator 283 is formed over the insulator 282. The insulator 283 can be formed by a sputtering method, a CVD method, an MBE method, a PLD method, an ALD method, or the like. The insulator 283 is preferably formed by a sputtering method. Since a molecule containing hydrogen is not used as a deposition gas in the sputtering method, the concentration of hydrogen in the insulator 283 can be reduced. In this embodiment, silicon nitride is deposited as the insulator 283 by a sputtering method.

Here, it is preferable to form the insulators 282 and 283 successively without exposure to the air. Film formation without exposure to the air can prevent attachment of impurities or moisture from the air onto the insulators 282 and 283, so that an interface between the insulators 282 and 283 and the vicinity of thereof can be kept clean.

Heat treatment may be performed after the formation of the insulator 283. The temperature of the heat treatment is preferably higher than or equal to 100° C. and lower than or equal to 400° C. By the heat treatment, hydrogen contained in the insulators 280 and 250 and the oxide 230 is absorbed by the insulator 282. In other words, hydrogen contained in the insulators 280 and 250 and the oxide 230 diffuses into the insulator 282. Accordingly, the hydrogen concentration in the insulator 282 increases, whereas the hydrogen concentrations in the insulators 280 and 250 and the oxide 230 decrease. Note that the insulator 283 is provided in contact with a top surface of the insulator 282, whereby entry of moisture or impurities such as hydrogen from the component above the insulator 283, which is caused by the heat treatment, can be prevented. By the heat treatment, hydrogen contained in the insulator 216, the insulator 224, and the oxide 230 is absorbed by the insulator 222. In other words, hydrogen contained in the insulator 216, the insulator 224, and the oxide 230 diffuses into the insulator 222. Accordingly, the hydrogen concentration in the insulator 222 increases, whereas the hydrogen concentrations in the insulator 216, the insulator 224, and the oxide 230 decrease. Note that the insulator 221 is provided in contact with the bottom surface of the insulator 222, whereby entry of moisture or impurities such as hydrogen from the component below the insulator 221, which is caused by the heat treatment, can be prevented.

Through the above steps, the semiconductor device illustrated in FIGS. 1A to 1D can be manufactured.

The semiconductor device of this embodiment has a structure in which each of conductors over an oxide semiconductor has a two-layer structure, a conductor that is less likely to be oxidized is used for the lower layer, a conductor with high conductivity is used for the upper layer, and the conductor, which functions as an electrode or a wiring, is in contact with a top surface of the oxide semiconductor. The conductor functions as the source electrode and the drain electrode of an OS transistor. The semiconductor device of this embodiment is miniaturized by setting the distance between conductors in the lower layer of the source electrode and the drain electrode to be shorter than the distance between conductors in the upper layer of the source electrode and the drain electrode, so that the frequency characteristics and the operation speed of the semiconductor device can be improved. In the semiconductor device of this embodiment, an insulator functioning as a protection film is provided in contact with side surfaces of the conductors in the upper layer of the source electrode and the drain electrode. Thus, excessive oxidation of the conductors in the upper layer of the source electrode and the drain electrode can be prevented.

The semiconductor device of this embodiment includes an OS transistor. Since the off-state current of an OS transistor is low, a semiconductor device or a storage device with low power consumption can be achieved. Since an OS transistor has high frequency characteristics, a semiconductor device or a storage device that can operate at high speed can be achieved. With use of an OS transistor, a semiconductor device with favorable electrical characteristics, a semiconductor device with a small variation in electrical characteristics of transistors, a semiconductor device with high on-state current, or a semiconductor device or a storage device with high reliability can be achieved.

This embodiment can be combined with any of the other embodiments as appropriate. In this specification, in the case where a plurality of structure examples are shown in one embodiment, the structure examples can be combined as appropriate.

Embodiment 2

In this embodiment, the comparison between the OS transistor described in Embodiment 1 and a transistor including silicon in a channel formation region (also referred to as a Si transistor) will be described.

[OS Transistor]

An oxide semiconductor having a low carrier concentration is preferably used for the OS transistor. For example, the carrier concentration in a channel formation region of an oxide semiconductor is lower than or equal to $1 \times 10^{18}$ cm$^{-3}$, preferably lower than $1 \times 10^{17}$ cm$^{-3}$, further preferably lower than $1 \times 10^{16}$ cm$^{-3}$, still further preferably lower than $1 \times 10^{13}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and accordingly has a low density of trap states in some cases. Charge trapped by the trap states in the oxide semiconductor takes along time to disappear and might behave like fixed charge. A transistor whose channel formation region is formed in an oxide semiconductor having a high density of trap states has unstable electrical characteristics in some cases.

In order to obtain stable electrical characteristics of the transistor, reducing the concentration of impurities in the oxide semiconductor is effective. In order to reduce the impurity concentration in the oxide semiconductor, the impurity concentration in a film that is adjacent to the oxide semiconductor is preferably reduced. As examples of the impurity, hydrogen, nitrogen, and the like are given. Note that an impurity in an oxide semiconductor refers to, for example, elements other than the main components of the oxide semiconductor. For example, an element with a concentration lower than 0.1 atomic % is regarded as an impurity.

When impurities and oxygen vacancies are in a channel formation region of an oxide semiconductor in an OS transistor, electrical characteristics of the OS transistor easily vary and the reliability thereof might worsen. In some cases, the OS transistor has a defect that is an oxygen vacancy in the oxide semiconductor into which hydrogen enters (hereinafter sometimes referred to as VoH), which generates an electron serving as a carrier. When VoH is formed in the channel formation region, the donor concentration in the channel formation region is increased in some cases. As the donor concentration in the channel formation region increases, the threshold voltage might vary. Accordingly, when the channel formation region in the oxide semiconductor includes oxygen vacancies, the transistor tends to have normally-on characteristics (a channel is generated even when no voltage is applied to a gate electrode and a current flows through the transistor). Therefore, the impurities, oxygen vacancies, and VoH are preferably reduced as much as possible in the channel formation region of the oxide semiconductor.

The band gap of the oxide semiconductor is preferably larger than the band gap of silicon (typically 1.1 eV), further preferably larger than or equal to 2 eV, still further preferably larger than or equal to 2.5 eV, yet still further preferably larger than or equal to 3.0 eV. With use of an oxide semiconductor having a larger band gap than silicon, the off-state current (also referred to as Ioff) of the transistor can be reduced.

In a Si transistor, a short-channel effect (also referred to as SCE) appears as miniaturization of the transistor proceeds. Thus, it is difficult to miniaturize the Si transistor. One factor that causes the short-channel effect is a small band gap of silicon. On the other hand, an OS transistor includes an oxide semiconductor that is a semiconductor material having a large band gap, and thus can suppress the short-channel effect. In other words, the OS transistor does not cause or hardly causes the short-channel effect.

The short-channel effect refers to degradation of electric characteristics which becomes obvious along with miniaturization of a transistor (a decrease in channel length). Specific examples of the short-channel effect are a decrease in threshold voltage, an increase in S value, an increase in leakage current, and the like.

The characteristic length is widely used as an indicator of resistance to a short-channel effect. The characteristic length is an indicator of curving of potential in a channel formation region. As the characteristic length is shorter, the potential rises more sharply, which means that the resistance to a short-channel effect is high.

The OS transistor is an accumulation-type transistor and the Si transistor is an inversion-type transistor. Accordingly, the OS transistor has a shorter characteristic length between the source region and the channel formation region and a shorter characteristic length between the drain region and the channel formation region than the Si transistor has. Therefore, the OS transistor has higher resistance to a short-channel effect than the Si transistor. That is, the OS transistor is more suitable than the Si transistor in the case where a transistor with a short channel length is formed.

Even in the case where the carrier concentration in the oxide semiconductor is decreased until the channel formation region becomes an i-type or substantially i-type region, the conduction band minimum of the channel formation region in a transistor with a short channel is decreased due to the conduction band lowering (CBL) effect; thus, there is a possibility that a difference in energy of the conduction band minimum between the channel formation region and the source region or the drain region is as small as 0.1 eV or more and 0.2 eV or less. Accordingly, the OS transistor can be regarded as having an $n^+/n^-/n^+$ accumulation-type junction-less transistor structure or an n$^+$/n$^-$/n$^+$ accumulation-type non-junction transistor structure in which the channel formation region becomes an n$^-$ region and the source and drain regions become n$^+$ regions in the OS transistor.

The above-described structure enables the OS transistor to have favorable electrical characteristics even when a semiconductor device is miniaturized or highly integrated. For example, favorable electrical characteristics can be obtained even when the gate length of the OS transistor is less than or equal to 20 nm, less than or equal to 15 nm, less than or equal to 10 nm, less than or equal to 7 nm, or less than or equal to 6 nm and greater than or equal to 1 nm, greater than or equal to 3 nm, or greater than or equal to 5 nm. In contrast, it is sometimes difficult for the Si transistor to have a gate length less than or equal to 20 nm or less than or equal to 15 nm because of a short-channel effect. Therefore, the OS transistor can be suitably used as a transistor having a short channel length as compared with the Si transistor. Note that the gate length refers to the length of a gate electrode in a direction in which carriers move inside a channel formation region during operation of the transistor and to the width of a bottom surface of the gate electrode in a plan view of the transistor.

Miniaturization of the OS transistor can improve the frequency characteristics of the transistor. Specifically, the cutoff frequency of the transistor can be improved. When the gate length of the OS transistor is within the above range, the cutoff frequency of the transistor can be greater than or equal to 50 GHz, preferably greater than or equal to 100 GHz, further preferably greater than or equal to 150 GHz at room temperature, for example.

As described above, the OS transistor is advantageous over the Si transistor in that the off-state current is low and a transistor with a short channel length can be formed.

The configurations, structures, methods, and the like described in this embodiment can be used in an appropriate combination with any of the configurations, structures, methods, and the like described in the other embodiments and the like.

Embodiment 3

In this embodiment, storage devices including the transistor of one embodiment of the present invention will be described with reference to FIG. 19 to FIGS. 25A to 25C.

In this embodiment, a configuration example of a storage device including a memory cell including the transistor described in the above embodiment will be described. In this embodiment, a configuration example of a storage device provided with a layer including stacked memory cells and a layer including a functional circuit having functions of amplifying and outputting data potential retained in the memory cell will be described.

[Configuration Example of Storage Device]

Figure 19:
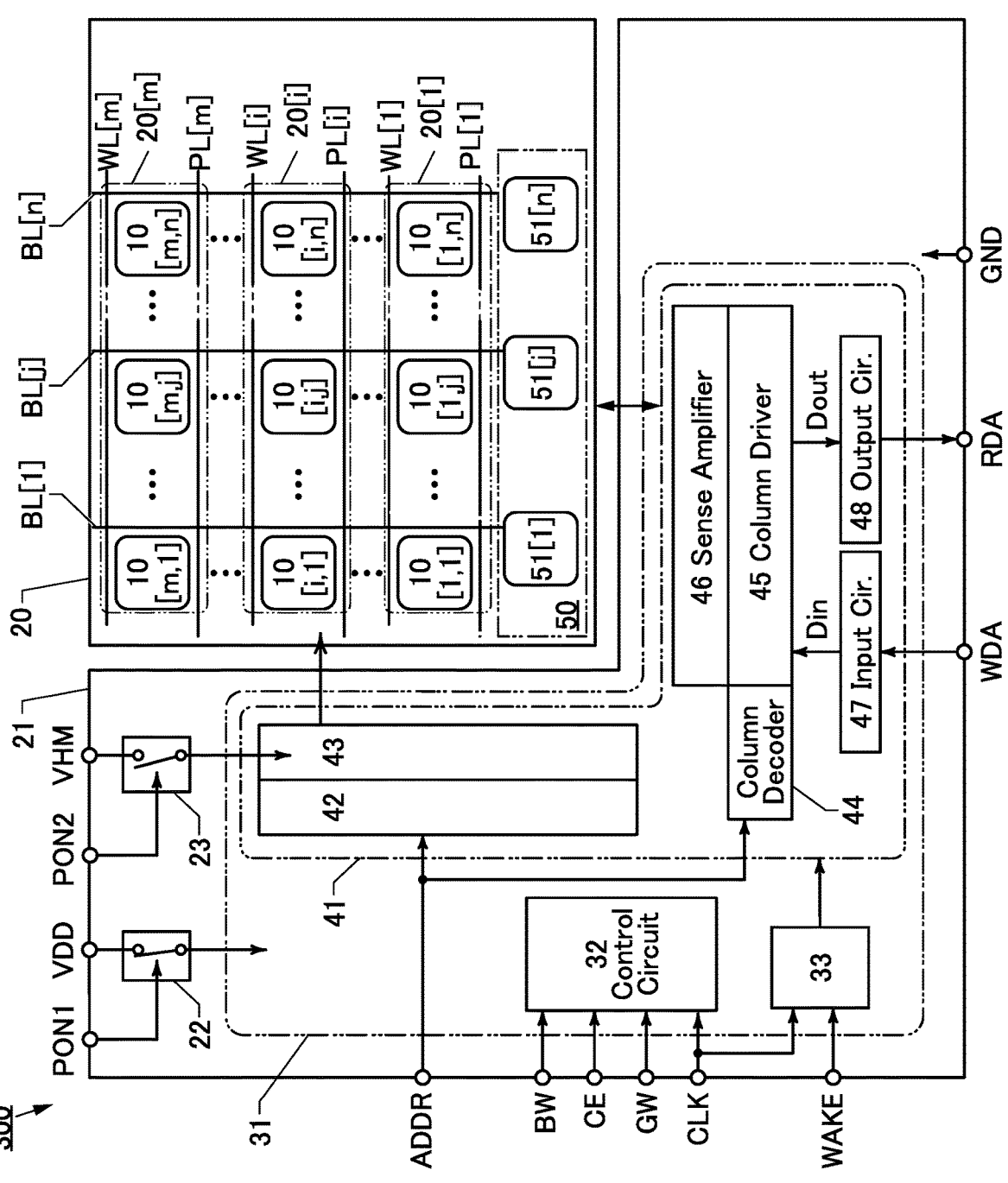
FIG. 19 is a block diagram illustrating an example of a storage device.

FIG. 19 is a block diagram of a storage device of one embodiment of the present invention.

A storage device 300 illustrated in FIG. 19 includes a driver circuit 21 and a memory array 20. The memory array 20 includes a plurality of memory cells 10 and a functional layer 50 including a plurality of functional circuits 51.

FIG. 19 illustrates an example in which the memory array 20 includes the plurality of memory cells 10 arranged in a matrix of m rows and n columns (each of m and n is an integer greater than or equal to 2). In the example illustrated in FIG. 19, the functional circuit 51 is provided for each wiring BL functioning as a bit line and the functional layer 50 includes n functional circuit 51 which are provided for n wirings BL.

In FIG. 19, the memory cell 10 in the first row and the first column is referred to as a memory cell 10[1,1], and the memory cell 10 in the m-th row and the n-th column is referred to as a memory cell 10[m,n]. In this embodiment and the like, a given row is denoted as an i-th row in some cases. A given column is denoted as a j-th column in some cases. Thus, i is an integer greater than or equal to 1 and less than or equal to m, and j is an integer greater than or equal to 1 and less than or equal to n. In this embodiment and the like, the memory cell 10 in the i-th row and the j-th column is referred to as a memory cell 10[i,j]. Note that in this embodiment and the like, "i+α" (α is a positive or negative integer) is not below 1 and does not exceed m. Similarly, "j+α" is not below 1 and does not exceed n.

The memory array 20 includes m wirings WL extending in the row direction, m wirings PL extending in the row direction, and n wirings BL extending in the column direction. In this embodiment and the like, a first (first row) wiring WL is referred to as a wiring WL[1] and an m-th (m-th row) wiring WL is referred to as a wiring WL[m]. Similarly, a first (first row) wiring PL is referred to as a wiring PL[1] and an m-th (m-th row) wiring PL is referred to as a wiring PL[m]. Similarly, a first (first column) wiring BL is referred to as a wiring BL[1] and an n-th (n-th column) wiring BL is referred to as a wiring BL[n].

The plurality of memory cells 10 provided in the i-th row are electrically connected to the wiring WL in the i-th row (wiring WL[i]) and the wiring PL in the i-th row (wiring PL[i]). The plurality of memory cells 10 provided in the j-th column are electrically connected to the wiring BL in the j-th column (wiring BL[j]).

A dynamic oxide semiconductor random access memory (DOSRAM, registered trademark) can be used for the memory array 20. A DOSRAM is a RAM including a 1T1C memory cell (a memory cell including one transistor and one capacitor), in which an access transistor is an OS transistor. An OS transistor has an extremely low current that flows between a source and a drain in an off state, that is, an extremely low leakage current. A DOSRAM can retain electric charges corresponding to data stored in a capacitor for along time by turning off an access transistor (a non-conduction state). For this reason, the refresh operation frequency of a DOSRAM can be lower than that of a DRAM formed with a transistor including silicon in its channel formation region (a Si transistor). As a result, low power consumption can be achieved. An OS transistor has high frequency characteristics and thus can perform reading and writing of a storage device at high speed. Thus, a storage device that can operate at high speed can be provided.

The memory array 20 illustrated in FIG. 19 can be provided by stacking a plurality of memory arrays 20[1] to 20[m]. The memory arrays 20[1] to 20[m] included in the memory array 20 are provided in a direction perpendicular to a surface of substrate on which the driver circuit 21 is provided, in which case the memory density of the memory cells 10 can be increased.

The wiring BL functions as a bit line for writing and reading data. The wiring WL functions as a word line for controlling on/off (conduction and non-conduction states) of an access transistor serving as a switch. The wiring PL has a function of a constant potential line connected to a capacitor. Note that a wiring CL (not illustrated) can be additionally provided as a wiring having a function of supplying a backgate potential to a backgate of an OS transistor serving as the access transistor. The wiring PL may also has a function of supplying the backgate potential.

The memory cell 10 included in each of the memory arrays 20[1] to 20[*m*] is connected to the functional circuit 51 through the wiring BL. The wiring BL can be provided in a direction perpendicular to a surface of the substrate provided with the driver circuit 21. Since the wiring BL extended from the memory cells 10 included in the memory arrays 20[1] to 20[*m*] is provided in the direction perpendicular to the surface of the substrate, the length of the wiring between the memory array 20 and the functional circuit 51 can be shortened. Accordingly, signal propagation distance between two circuits connected to the bit line can be shortened, and resistance and parasitic capacitance of the bit line can be significantly reduced, so that power consumption and signal delays can be reduced. Moreover, even when the capacitance of the capacitors included in the memory cell 10 is reduced, the storage device can be operated.

The functional circuit 51 has functions of amplifying a data potential retained in the memory cell 10 and outputting the data potential to the sense amplifier 46 included in the driver circuit 21 through a wiring GBL (not illustrated) described later. With this structure, a slight difference in the potential of the wiring BL is amplified at the time of data reading. Like the wiring BL, the wiring GBL can be provided in the direction perpendicular to the surface of the substrate provided with the driver circuit 21. Since the wiring BL and the wiring GBL extended from the memory cells 10 included in the memory arrays 20[1] to 20[*m*] are provided in the direction perpendicular to the surface of the substrate, the length of the wiring between the functional circuit 51 and the sense amplifier 46 can be shortened. Accordingly, signal propagation distance between two circuits connected to the wiring GBL can be shortened, and resistance and parasitic capacitance of the wiring GBL can be significantly reduced, so that power consumption and signal delays can be reduced.

The wiring BL is provided in contact with the semiconductor layer of the transistor included in the memory cell 10. Alternatively, the wiring BL is provided in contact with the region functioning as the source or the drain of the semiconductor layer of the transistor included in the memory cell 10. Alternatively, the wiring BL is provided in contact with the conductor provided in contact with the region functioning as the source or the drain of the semiconductor layer of the transistor included in the memory cell 10. That is, the wiring BL is a wiring for electrically connecting the source or the drain of the transistor included in the memory cell 10 in each layer of the memory arrays 20 to the functional circuit 51 in the vertical direction.

The memory array 20 can be provided over the driver circuit 21 to overlap with the driver circuit 21. When the driver circuit 21 and the memory array 20 are provided to overlap with each other, the signal propagation distance between the driver circuit 21 and the memory array 20 can be shortened. Accordingly, resistance and parasitic capacitance between the driver circuit 21 and the memory array 20 are reduced, so that power consumption and signal delays can be reduced. In addition, the storage device 300 can be downsized.

The functional circuit 51 can be freely provided on a circuit or the like that is formed using Si transistors in a manner similar to that of the memory arrays 20[1] to 20[*m*] when the functional circuit 51 is formed with an OS transistor like the transistor included in the memory cell 10 of DOSRAM, whereby integration can be easily performed. With the configuration in which a signal is amplified by the functional circuit 51, a circuit in a subsequent stage, such as the sense amplifier 46, can be downsized, so that the storage device 300 can be downsized.

The driver circuit 21 includes a PSW 22 (power switch), a PSW 23, and a peripheral circuit 31. The peripheral circuit 31 includes a peripheral circuit 41, a control circuit 32, and a voltage generation circuit 33.

In the storage device 300, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signal BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 32.

The control circuit 32 is a logic circuit having a function of controlling the entire operation of the storage device 300. For example, the control circuit performs a logical operation on the signal CE, the signal GW, and the signal BW to determine an operation mode (e.g., a writing operation or a reading operation) of the storage device 300. Alternatively, the control circuit 32 generates a control signal for the peripheral circuit 41 so that the operation mode is executed.

The voltage generation circuit 33 has a function of generating a negative voltage. The signal WAKE has a function of controlling the input of the signal CLK to the voltage generation circuit 33. For example, when an H-level signal is supplied as the signal WAKE, the signal CLK is input to the voltage generation circuit 33, and the voltage generation circuit 33 generates a negative voltage.

The peripheral circuit 41 is a circuit for writing and reading data to/from the memory cells 10. The peripheral circuit 41 outputs signals for controlling the functional circuits 51. The peripheral circuit 41 includes a row decoder 42, a column decoder 44, a row driver 43, a column driver 45, an input circuit 47 (Input Cir.), an output circuit 48 (Output Cir.), and a sense amplifier 46.

The row decoder 42 and the column decoder 44 have a function of decoding the signal ADDR. The row decoder 42 is a circuit for specifying a row to be accessed, and the column decoder 44 is a circuit for specifying a column to be accessed. The row driver 43 has a function of selecting the wiring WL specified by the row decoder 42. The column driver 45 has a function of writing data to the memory cells 10, a function of reading data from the memory cells 10, a function of retaining the read data, and the like.

The input circuit 47 has a function of retaining the signal WDA. Data retained by the input circuit 47 is output to the column driver 45. Data output from the input circuit 47 is data (Din) to be written to the memory cells 10. Data (Dout) read from the memory cells 10 by the column driver 45 is output to the output circuit 48. The output circuit 48 has a function of retaining Dout. In addition, the output circuit 48 has a function of outputting Dout to the outside of the storage device 300. Data output from the output circuit 48 is the signal RDA.

The PSW 22 has a function of controlling supply of VDD to the peripheral circuit 31. The PSW 23 has a function of controlling supply of VHM to the row driver 43. Here, in the storage device 300, a high power supply voltage is VDD and a low power supply voltage is GND (a ground potential). In addition, VHM is a high power supply voltage used to set a word line at a high level and is higher than VDD. The on/off of the PSW 22 is controlled by the signal PON1, and the on/off of the PSW 23 is controlled by the signal PON2. The number of power domains to which VDD is supplied is one in the peripheral circuit 31 in FIG. 19 but can be more than one. In this case, a power switch is provided for each power domain.

Figure 20A:
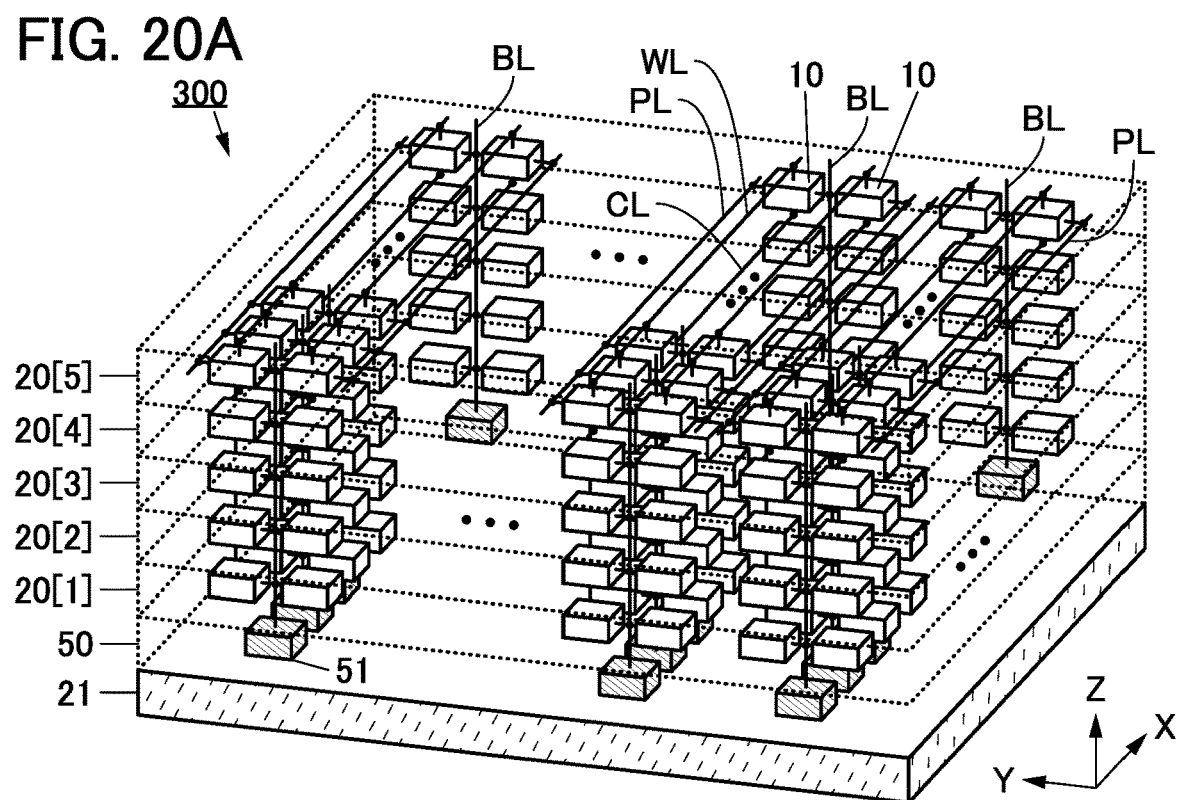
FIGS. 20A and 20B are a schematic view and a circuit diagram, respectively, illustrating an example of a storage device.

The memory array 20 includes the memory arrays 20[1] to 20[m] (m is an integer greater than or equal to 2) and the functional layer 50, and the memory arrays 20[1] to 20[m] can be provided as stacked layers over the driver circuit 21. Stacking the memory arrays 20 in layers can increase the memory density of the memory cell 10. FIG. 20A is a perspective view of the storage device 300 which includes the functional layer 50 and five layers (m=5) of the memory arrays 20[1] to 20[5], which overlap with each other, over the driver circuit 21.

In FIG. 20A, the memory array 20 in the first layer is denoted as the memory array 20[1], the memory array 20 in the second layer is denoted as the memory array 20[2], and the memory array 20 in the fifth layer is denoted as the memory array 20[5]. FIG. 20A also illustrates the wiring WL, the wiring PL, and the wiring CL extended in the X direction and the wiring BL extended in the Z direction (a direction perpendicular to the surface of the substrate provided with a driver circuit). For easy viewing, some parts of the wirings WL and PL included in each of the memory arrays 20 are omitted.

Figure 20B:
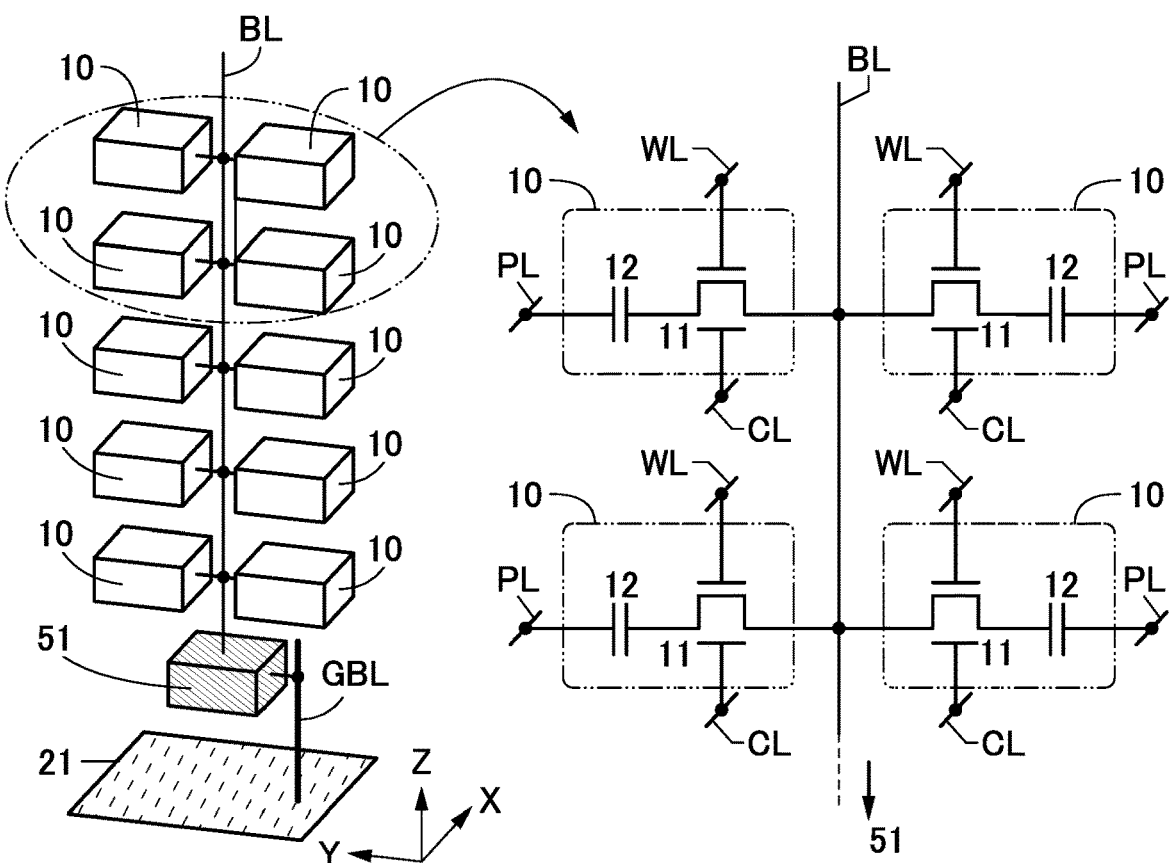

FIG. 20B is a schematic view illustrating a configuration example of the functional circuit 51, which is connected to the wiring BL, and the memory cells 10, which are included in the memory arrays 20[1] to 20[5] and are connected to the wiring BL, illustrated in FIG. 20A. FIG. 20B also illustrates the wiring GBL provided between the functional circuit 51 and the driver circuit 21. Note that a configuration in which a plurality of memory cells (memory cells 10) are electrically connected to one wiring BL is also referred to as "memory string". In the drawings, the wiring GBL are represented by a bold line in some cases for increasing visibility.

FIG. 20B illustrates an example of a circuit configuration of the memory cells 10 connected to the wiring BL. The memory cell 10 includes a transistor 11 and a capacitor 12. As for the transistor 11, the capacitor 12, and the wirings (e.g., the wirings BL and WL), for example, the wiring BL[1] and the wiring WL[1] are referred to as the wiring BL and the wiring WL, respectively, in some cases. Here, the transistor 11 corresponds to the transistor 200 described in Embodiment 1.

In the memory cell 10, one of a source and a drain of the transistor 11 is electrically connected to the wiring BL. The other of the source and the drain of the transistor 11 is electrically connected to one electrode of the capacitor 12. The other electrode of the capacitor 12 is connected to the wiring PL. A gate of the transistor 11 is connected to the wiring WL. The backgate of the transistor 11 is connected to the wiring CL.

The wiring PL supplies a constant potential for holding the potential of the capacitor 12. The wiring CL supplies a constant potential for controlling the threshold voltage of the transistor 11. The wiring PL and the wiring CL may have the same potential. In that case, the number of wirings connected to the memory cell 10 can be reduced by connecting the two wirings.

Figures 21A, 21B:
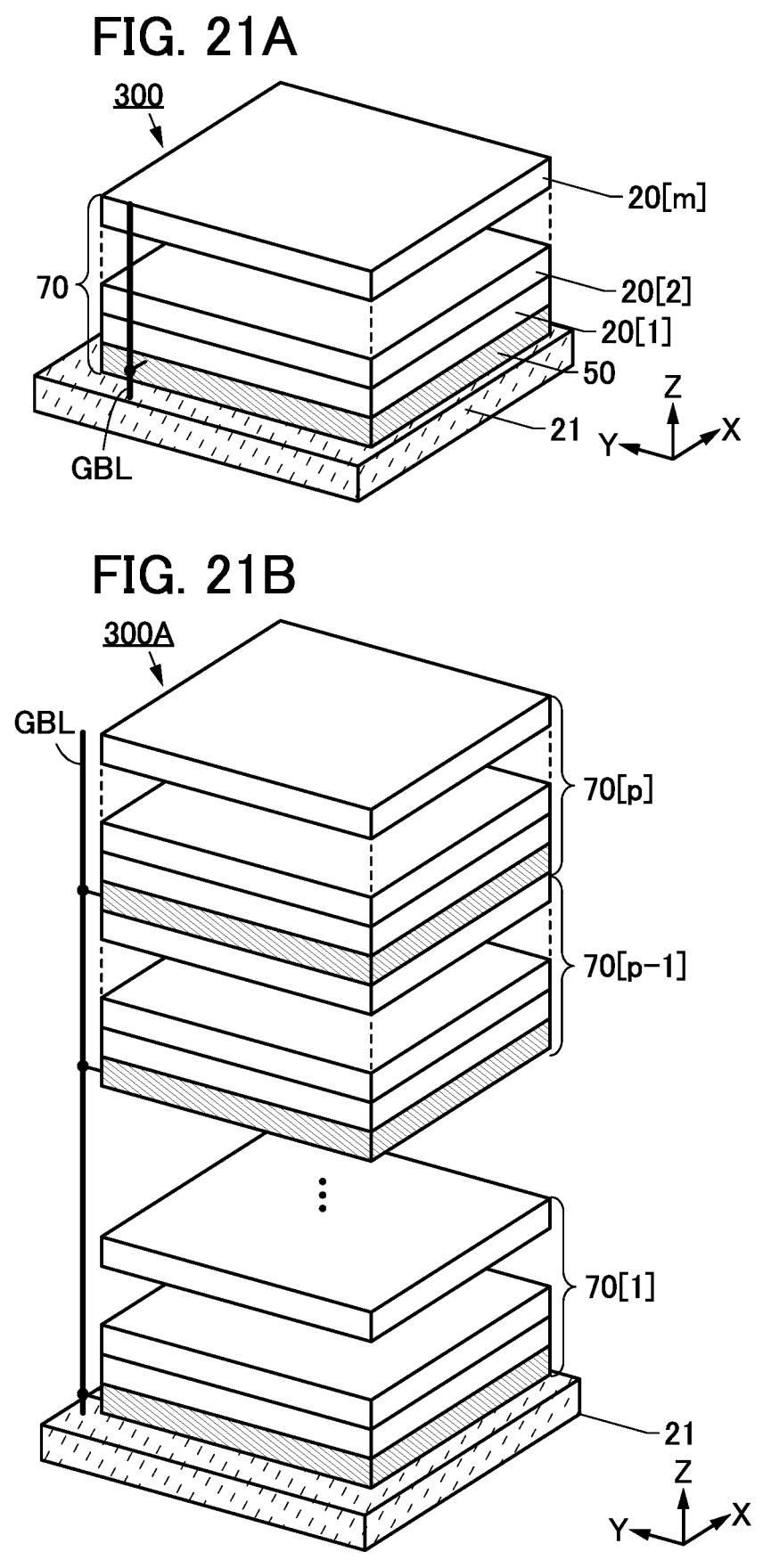

The wiring GBL illustrated in FIG. 20B is provided to electrically connect the driver circuit 21 and the functional layer 50. FIG. 21A is a schematic view of the storage device 300 in which the functional circuit 51 and the memory arrays 20[1] to 20[m] are regarded as a repeating unit 70. Note that although FIG. 21A illustrates one wiring GBL, the wiring GBL is provided as appropriate depending on the number of functional circuits 51 provided in the functional layer 50.

The wiring GBL is provided in contact with a semiconductor layer of a transistor included in the functional circuit 51. Alternatively, the wiring GBL is provided in contact with a region functioning as a source or a drain of the semiconductor layer of the transistor included in the functional circuit 51. Alternatively, the wiring GBL is provided in contact with a conductor provided in contact with the region functioning as the source or the drain of the semiconductor layer of the transistor included in the functional circuit 51. That is, the wiring GBL can be regarded as a wiring for electrically connecting the driver circuit 21 and one of the source and the drain of the transistor included in the functional circuit 51 in the functional layer 50 in the vertical direction.

The repeating unit 70 including the functional circuit 51 and the memory arrays 20[1] to 20[m] may have a stacked-layer structure. A storage device 300A of one embodiment of the present invention can include repeating units 70[1] to 70[p] (p is an integer greater than or equal to 2) as illustrated in FIG. 21B. The wiring GBL is connected to the functional layer 50 included in the repeating unit 70. The wiring GBL is provided as appropriate depending on the number of functional circuits 51.

In one embodiment of the present invention, OS transistors are provided in stacked layers and a wiring functioning as a bit line is provided in the direction perpendicular to the surface of the substrate provided with the driver circuit 21. When the wiring extending from the memory array 20 and functioning as a bit line is provided in the direction perpendicular to the surface of the substrate, the length of the wiring between the memory array 20 and the driver circuit 21 can be shortened. Thus, parasitic capacitance of the bit line can be significantly reduced.

In one embodiment of the present invention, the functional layer 50 including the functional circuit 51 having functions of amplifying a data potential held in the memory cell 10 and outputting the amplified potential is provided in a layer where the memory array 20 is provided. With this structure, a slight difference in the potential of the wiring BL functioning as a bit line can be amplified at the time of data reading and the sense amplifier 46 included in the driver circuit 21 can be driven. A circuit such as a sense amplifier can be downsized, leading to a reduction in size of the storage device 300. Moreover, even when the capacitance of the capacitor 12 included in the memory cell 10 is reduced, the storage device 300 can be operated.

Figure 25A:
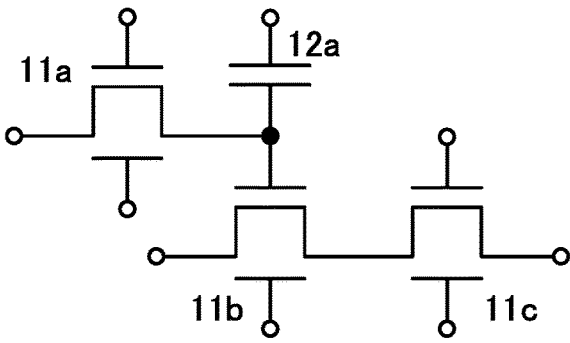
FIGS. 25A to 25C are circuit diagrams illustrating examples of storage devices.

Although an example in which the memory cell 10 has a 1T1C (one transistor and one capacitor) structure is described above, the present invention is not limited to this example. For example, as illustrated in FIG. 25A, a 3T1C memory cell may be used for a storage device. The memory cell illustrated in FIG. 25A includes a transistor 11a, a transistor 11b, a transistor 11c, and a capacitor 12a. Here, the transistors 11a, 11b, and 11c can have the same structure as the transistor 11, and the capacitor 12a can have the same structure as the capacitor 12. A RAM with such a structure is sometimes referred to as a nonvolatile oxide semiconductor RAM (NOSRAM) (registered trademark).

As illustrated in FIG. 25A, one of a source and a drain of the transistor 11*a* is electrically connected to one electrode of the capacitor 12*a* and a first gate of the transistor 11*b*. One of a source and a drain of the transistor 11*b* is electrically connected to one of a source and a drain of the transistor 11*c*. For a first gate, the other of the source and the drain, and a second gate of the transistor 11*a*, the other of the source and the drain and a second gate of the transistor 11*b*, a first gate, the other of the source and the drain, and a second gate of the transistor 11*c*, and the other electrode of the capacitor 12*a*, wirings may be provided as appropriate. The structure of the storage device can be changed as appropriate depending on these wirings.

Figure 25B:
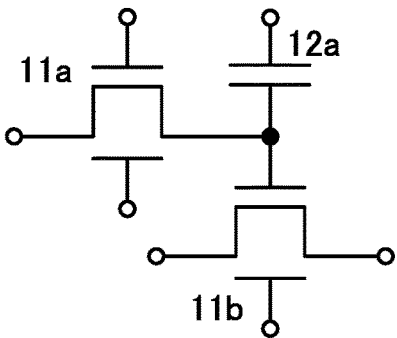

Alternatively, as illustrated in FIG. 25B, a 2T1C memory cell including the transistors 11*a* and 11*b* and the capacitor 12*a* without including the transistor 11*c* may be employed.

Figure 25C:
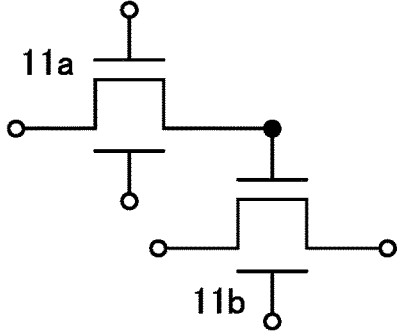

In the case where the parasitic capacitance of each of the transistors 11*a* and 11*b* is sufficiently high, the capacitor 12*a* may be omitted as illustrated in FIG. 25C. In that case, the memory cell is formed only with the transistors 11*a* and 11*b*.

[Configuration Examples of Memory Array 20 and Functional Circuit 51]

Figure 22:
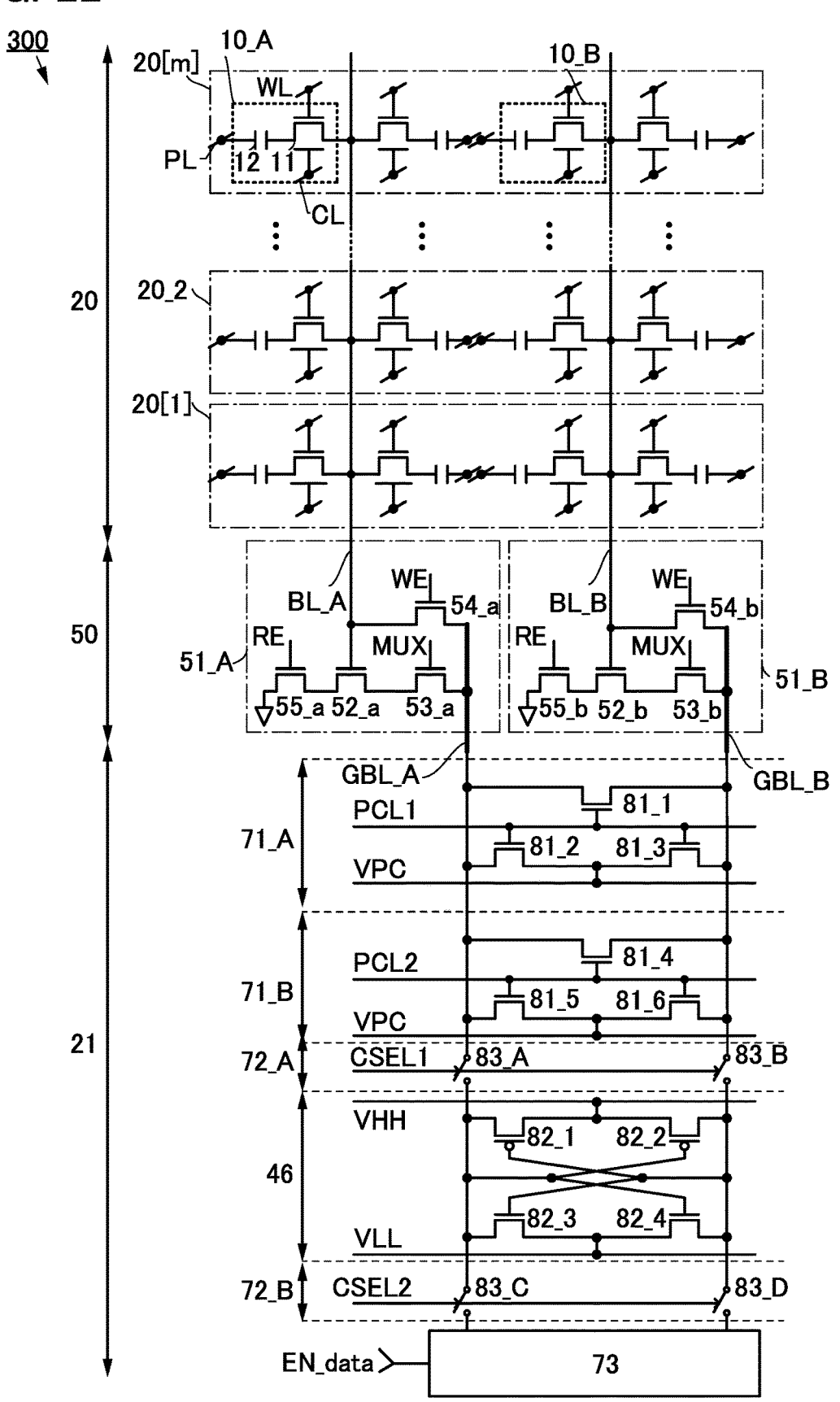
FIG. 22 is a circuit diagram illustrating an example of a storage device.

A configuration example of the functional circuit 51 described with reference to FIG. 19 to FIGS. 21A and 21B and a configuration example of the sense amplifier 46 included in the memory array 20 and the driver circuit 21 will be described with reference to FIG. 22. FIG. 22 illustrates different wirings BL (a wiring BL_A and a wiring BL_B) connected to the memory cells 10 (a memory cell 10_A and a memory cell 10_B) connected to the functional circuits 51 (a functional circuit 51_A and a functional circuit 51_B) connected to the wirings GBL (a wiring GBL_A and a wiring GBL_B) connected to the driver circuit 21. FIG. 22 also illustrates, as components of the driver circuit 21, a pre-charge circuit 71_A, a pre-charge circuit 71_B, a switch circuit 72_A, a switch circuit 72_B, and a write/read circuit 73 in addition to the sense amplifier 46.

As components of the functional circuits 51_A and 51_B, transistors 52_*a*, 52_*b*, 53_*a*, 53_*b*, 54_*a*, 54_*b*, 55_*a*, and 55_*b* are illustrated. The transistors 52_*a*, 52_*b*, 53_*a*, 53_*b*, 54_*a*, 54_*b*, 55_*a*, and 55_*b* illustrated in FIG. 22 are OS transistors like the transistor 11 included in the memory cell 10 is an OS transistor. The functional layer 50 including the functional circuits 51 can be stacked over the driver circuit 21 like the memory arrays 20[1] to 20[*m*] are stacked.

The wiring BL_A is connected to a gate of the transistor 52_*a*, and the wiring BL_B is connected to a gate of the transistor 52_*b*. Ones of sources and drains of the transistors 53_*a* and 54_*a* are connected to the wiring GBL_A. Ones of sources and drains of the transistors 53_*b* and 54_*b* are connected to the wiring GBL_B. The wirings GBL_A and GBL_B are provided in the perpendicular direction in a manner similar to that of the wirings BL_A and BL_B and connected to the transistors included in the driver circuit 21. As illustrated in FIG. 22, a selection signal MUX, a control signal WE, or a control signal RE is supplied to gates of the transistors 53_*a*, 53_*b*, 54_*a*, 54_*b*, 55_*a*, and 55_*b*.

Transistors 81_1 to 81_6 and 82_1 to 82_4 included in the sense amplifier 46, the pre-charge circuit 71_A, and the pre-charge circuit 71_B illustrated in FIG. 22 are Si transistors. Switches 83_A to 83_D included in the switch circuit 72_A and the switch circuit 72_B can also be Si transistors. Either sources or drains of the transistors 53_*a*, 53_*b*, 54_*a*, and 54_*b* are connected to the transistors or switches included in the precharge circuit 71_A, the precharge circuit 71_B, the sense amplifier 46, and the switch circuit 72_A.

The pre-charge circuit 71_A includes n-channel transistors 81_1 to 81_3. The pre-charge circuit 71_A is a circuit for precharging the wirings BL_A and BL_B with an intermediate potential VPC corresponding to a potential VDD/2 between a high power supply potential (VDD) and a low power supply potential (VSS) in accordance with a pre-charge signal supplied to a pre-charge line PCL1.

The pre-charge circuit 71_B includes n-channel transistors 81_4 to 81_6. The pre-charge circuit 71_B is a circuit for precharging the wirings GBL_A and GBL_B with an intermediate potential VPC corresponding to a potential VDD/2 between VDD and VSS in accordance with a pre-charge signal supplied to a pre-charge line PCL2.

The sense amplifier 46 includes p-channel transistors 82_1 and 82_2 and n-channel transistors 82_3 and 824, which are connected to a wiring VHH or a wiring VLL. The wiring VHH and the wiring VLL are wirings having a function of supplying VDD or VSS. The transistors 82_1 to 82_4 are transistors that form an inverter loop. The potentials of the wiring BL_A and the wiring BL_B precharged by selecting the memory cells 10_A and 10_B are changed, and the potentials of the wiring GBL_A and the wiring GBL_B are set to VDD or VSS in accordance with the changes. The potentials of the wiring GBL_A and the wiring GBL_B can be output to the outside through the switch 83_C, the switch 83_D, and the write/read circuit 73. The wirings BL_A and BL_B and the wirings GBL_A and GBL_B each correspond to a bit line pair. Data signal writing of the write/read circuit 73 is controlled in accordance with a signal EN_data.

The switch circuit 72_A is a circuit for controlling electrical continuity between the sense amplifier 46 and each of the wiring GBL_A and the wiring GBL_B. The on and off of the switch circuit 72_A are switched under the control of a switch signal CSEL1. In the case where the switches 83_A and 83_B are n-channel transistors, the switches 83_A and 83_B are turned on when the switch signal CSEL1 is at a high level and the switches 83_A and 83_B are turned off when the switch signal CSEL1 is at a low level. The switch circuit 72_B is a circuit for controlling electrical continuity between the write/read circuit 73 and the bit line pair connected to the sense amplifier 46. The on and off of the switch circuit 72_B are switched under the control of a switch signal CSEL2. The switches 83_C and 83_D may operate in a manner similar to that of the switches 83_A and 83_B.

As illustrated in FIG. 22, the storage device 300 can be configured to connect the memory cell 10, the functional circuit 51, and the sense amplifier 46 through the wiring BL and the wiring GBL which are provided in the vertical direction which is the shortest length. Although the number of functional layers 50 including transistors included in the functional circuit 51 is increased, the load of the wiring BL is reduced, whereby the writing time can be shortened and data reading can be facilitated.

As illustrated in FIG. 22, transistors included in the functional circuits 51_A and 51_B are controlled in accordance with the control signals WE and RE and the selection signal MUX. Each of the transistors can output the potential of the wiring BL through the wiring GBL to the driver circuit 21 in accordance with the control signal and the selection signal. The functional circuits 51_A and 51_B can function as a sense amplifier formed with OS transistors. With this structure, a slight difference in the potential of the wiring BL is amplified at the time of reading, and the sense amplifier 46 formed with Si transistors can be driven.

<Structure Example of Memory Cell>

A structure example of the memory cell 10 used in the above-mentioned storage device will be described with reference to FIG. 23.

Figure 23:
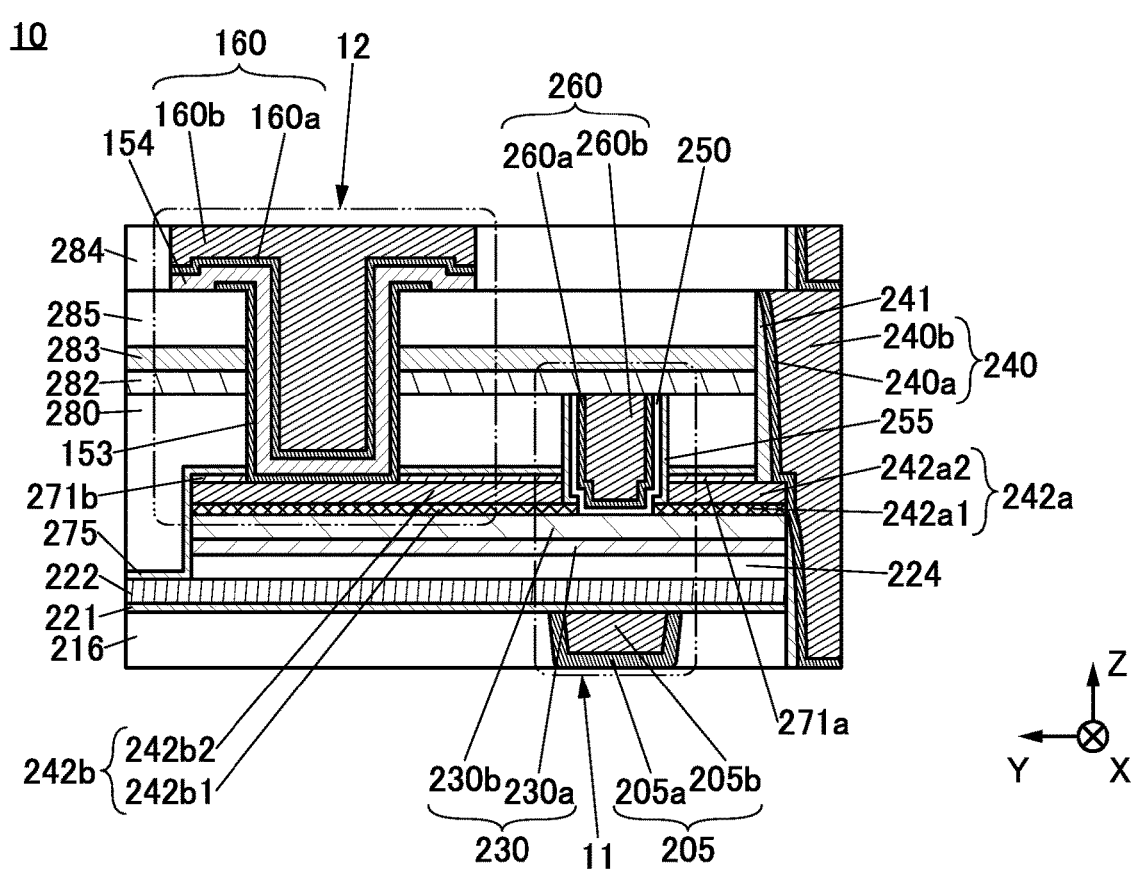
FIG. 23 is a cross-sectional view illustrating an example of a storage device.

In FIG. 23, the X direction is parallel to the channel width direction of a transistor, the Y direction is perpendicular to the X direction, and the Z direction is perpendicular to the X direction and the Y direction.

As illustrated in FIG. 23, the memory cell 10 includes the transistor 11 and the capacitor 12. The insulator 285 is provided over the transistor 11, and the insulator 284 is provided over the insulator 285. An insulator that can be used as the insulator 216 may be used as the insulator 285 and the insulator 284. Note that the transistor 11 has the same structure as the transistor 200 described in the above embodiment, and the same components may be denoted by the same reference numerals. The above embodiment can be referred to for the details of the transistor 200. A conductor 240 is provided in contact with the one of the source and the drain of the transistor 11 (the conductor 242a). The conductor 240 extends in the Z direction and functions as the wiring BL.

The capacitor 12 includes a conductor 153 over the conductor 242b, an insulator 154 over the conductor 153, and a conductor 160 (a conductor 160a and a conductor 160b) over the insulator 154.

At least parts of the conductor 153, the insulator 154, and the conductor 160 are positioned in the opening formed in the insulators 271b, 275, 280, 282, 283, and 285. End portions of the conductor 153, the insulator 154, and the conductor 160 are positioned at least over the insulator 282, and preferably positioned over the insulator 285. The insulator 154 is provided to cover the end portions of the conductor 153. Thus, the conductor 153 and the conductor 160 can be electrically insulated from each other.

The deeper the depth of the opening formed in the insulators 271b, 275, 280, 282, 283, and 285 is (i.e., the larger the thickness of at least one of the insulators 271b, 275, 280, 282, 283, and 285 is), the larger the electrostatic capacitance of the capacitor 12 can be. Increasing the electrostatic capacitance per unit area of the capacitor 12 enhances miniaturization and integration of the semiconductor device.

The conductor 153 includes a region functioning as the one electrode (a lower electrode) of the capacitor 12. The insulator 154 includes a region functioning as a dielectric of the capacitor 12. The conductor 160 includes a region functioning as the other electrode (an upper electrode) of the capacitor 12. The capacitor 12 forms a metal-insulator-metal (MIM) capacitor.

The conductor 242b provided over the oxide 230 functions as a wiring electrically connected to the conductor 153 of the capacitor 12.

Each of the conductors 153 and 160 included in the capacitor 12 can be formed with a conductor that can be used for the conductor 205 or the conductor 260. Each of the conductors 153 and 160 is preferably formed by a deposition method capable of depositing a film with good coverage, such as an ALD method or a CVD method. Titanium nitride or tantalum nitride deposited by an ALD method or a CVD method can be used for the conductor 153, for example.

The top surface of the conductor 242b2 is in contact with a bottom surface of the conductor 153. Here, the contact resistance between the conductor 153 and the conductor 242b can be reduced when the conductor 242b2 is formed with a conductive material with high conductivity.

Titanium nitride deposited by an ALD method or a CVD method can be used as the conductor 160a, and tungsten deposited by a CVD method can be used as the conductor 160b. Note that in the case where the adhesion of tungsten to the insulator 154 is sufficiently high, a single-layer film of tungsten formed by a CVD method may be used as the conductor 160.

For the insulator 154 included in the capacitor 12, a high dielectric constant (high-k) material (material with a high dielectric constant) is preferably used. The insulator 154 is preferably formed by a film formation method that offers good coverage such as an ALD method or a CVD method.

As an insulator of the high dielectric constant (high-k) material, an oxide, an oxynitride, a nitride oxide, or a nitride containing one or more metal elements selected from aluminum, hafnium, zirconium, gallium, and the like can be used, for example. The above-described oxide, oxynitride, nitride oxide, and nitride may contain silicon. Insulators each formed of any of the above-described materials can be stacked to be used as the insulator 154.

As examples of the insulator of the high dielectric constant (high-k) material, aluminum oxide, hafnium oxide, zirconium oxide, an oxide containing aluminum and hafnium, an oxynitride containing aluminum and hafnium, an oxide containing silicon and hafnium, an oxynitride containing silicon and hafnium, an oxide containing silicon and zirconium, an oxynitride containing silicon and zirconium, an oxide containing hafnium and zirconium, an oxynitride containing hafnium and zirconium are given. Using such a high-k material allows the insulator 154 to be thick enough to inhibit a leakage current and a sufficiently high capacitance of the capacitor 12 to be ensured.

It is preferable to use stacked insulators each formed of any of the above-described materials. A stacked-layer structure including a high dielectric constant (high-k) material and a material having higher dielectric strength than the high dielectric constant (high-k) material is preferably used. For example, as the insulator 154, an insulator in which zirconium oxide, aluminum oxide, and zirconium oxide are stacked in this order can be used. An insulator in which zirconium oxide, aluminum oxide, zirconium oxide, and aluminum oxide are stacked in this order can be used, for example. An insulator in which hafnium zirconium oxide, aluminum oxide, hafnium zirconium oxide, and aluminum oxide are stacked in this order can be used, for example. The stacking of such an insulator having relatively high dielectric strength, such as aluminum oxide, can increase the dielectric strength and inhibit electrostatic breakdown of the capacitor 12.

The deeper the depth of the opening formed in the insulators 271b, 275, 280, 282, 283, and 285 is (i.e., the larger the thickness of at least one of the insulators 271b, 275, 280, 282, 283, and 285 is), the larger the electrostatic capacitance of the capacitor 12 can be. Here, the insulators 271b, 275, 282, and 283 function as barrier insulators, and thus the thicknesses thereof are preferably set in accordance with barrier properties required by the semiconductor device. Since the thickness of the conductor 260 functioning as a gate electrode is determined in accordance with the thickness of the insulator 280, the thickness of the insulator 280 is preferably set in accordance with the thickness of the conductor 260 required by the semiconductor device.

Thus, the electrostatic capacitance of the capacitor 12 is preferably set by adjusting the thickness of the insulator 285. For example, the thickness of the insulator 285 is set within the range from 50 nm to 250 nm inclusive, and the depth of the opening is set greater than or equal to 150 nm and less than or equal to 350 nm. When the capacitor 12 is formed within the above range, the capacitor 12 can have adequate electrostatic capacitance, and the height of one layer can be prevented from being excessively large in a semiconductor device in which a plurality of memory cells are stacked in layers. Note that capacitors in memory cells in each layer of stacked layers may have different electrostatic capacitance. In the case of this structure, the insulators 285 provided in the layers of the memory cells may have different thicknesses, for example.

In the opening formed in the insulator 285 and the like, where the capacitor 12 is formed, a sidewall of the opening may be perpendicular or substantially perpendicular to the top surface of the insulator 222 or may have a tapered shape. The tapered shape of the sidewall can improve the coverage with the conductor 153 and the like provided in the opening formed in the insulator 285 and the like; as a result, the number of defects such as voids can be reduced.

The conductor 242a provided over the oxide 230 functions as a wiring electrically connected to the conductor 240. For example, in FIG. 23, a top surface and a side end portion of the conductor 242a are electrically connected to the conductor 240 extending the Z direction. Specifically, in FIG. 23, the top surface and the side end portion of the conductor 242a2 and the side end portion of the conductor 242a1 are in contact with the conductor 240.

When the conductor 240 is directly in contact with at least one of the top surface and the side end portion of the conductor 242a, a separate electrode for connection does not need to be provided, so that the area occupied by memory arrays can be reduced. In addition, the integration degree of the memory cell can be increased and the storage capacity of the storage device can be increased. Note that the conductor 240 is preferably in contact with a part of the top surface and the side end portion of the conductor 242a. When the conductor 240 is in contact with two or more surfaces of the conductor 242a, the contact resistance between the conductor 240 and the conductor 242a can be reduced. In particular, as illustrated in FIG. 23, the conductor 240 is in contact with part of the top surface and a side end portion of the conductor 242a2 with high conductivity, so that the contact resistance between the conductor 240 and the conductor 242a can be further reduced.

The conductor 240 is provided in an opening formed in the insulator 216, the insulator 221, the insulator 222, the insulator 275, the insulator 280, the insulator 282, the insulator 283, the insulator 285, and the insulator 284.

The conductor 240 preferably has a stacked-layer structure of a conductor 240a and a conductor 240b. For example, as illustrated in FIG. 23, the conductor 240 can have a structure in which the conductor 240a is provided in contact with an inner wall of the opening and the conductor 240b is provided inside the conductor 240a. That is, the conductor 240a is positioned closer to the insulators 216, 221, 222, 275, 280, 282, 283, 285, and 284 than the conductor 240b is. The conductor 240a is in contact with the top surface and the side end portion of the conductor 242a.

For the conductor 240a, a conductive material having a function of inhibiting the passage of impurities such as water and hydrogen is preferably used. The conductor 240a can have a single-layer structure or a stacked-layer structure including one or more of tantalum, tantalum nitride, titanium, titanium nitride, ruthenium, and ruthenium oxide, for example. Thus, impurities such as water and hydrogen can be inhibited from entering the oxide 230 through the conductor 240.

The conductor 240 also functions as a wiring and thus is preferably formed using a conductor having high conductivity. For example, a conductive material containing tungsten, copper, or aluminum as its main component can be used for the conductor 240b.

For example, it is preferable to use tantalum nitride for the conductor 240a and and tungsten for the conductor 240b. In that case, the conductor 240a serves as a conductor containing titanium and nitrogen, and the conductor 240b serves as a conductor containing tungsten.

Note that the conductor 240 may have a single-layer structure or a stacked-layer structure of three or more layers.

As illustrated in FIG. 23, an insulator 241 is preferably provided in contact with a side surface of the conductor 240. Specifically, the insulator 241 is provided in contact with inner walls of the opening formed in the insulators 216, 221, 222, 275, 280, 282, 283, 285, and 284. The insulator 241 is formed also on the side surfaces of the insulator 224, the oxide 230, and the conductor 242a which extend in the opening. Here, at least part of the conductor 242a is exposed from the insulator 241 and is in contact with the conductor 240. That is, the conductor 240 is provided to fill the opening through the insulator 241.

Note that as illustrated in FIG. 23, an uppermost portion of the insulator 241 formed below the conductor 242a is preferably positioned below the top surface of the conductor 242a. With such a structure, the conductor 240 can be in contact with at least part of the side end portion of the conductor 242a. The insulator 241 which is formed below the conductor 242a preferably has a region in contact with the side surface of the oxide 230. This structure can inhibit impurities contained in the insulator 280 and the like, such as water and hydrogen, from entering the oxide 230 through the conductor 240.

The insulator 241 can be formed using a barrier insulating film that can be used as the insulator 275 or the like. For the insulator 241, for example, an insulator such as silicon nitride, aluminum oxide, or silicon nitride oxide may be used. This structure can inhibit impurities contained in the insulator 280 and the like, such as water and hydrogen, from entering the oxide 230 through the conductor 240. Silicon nitride is particularly preferable because of its high blocking property against hydrogen. Moreover, oxygen contained in the insulator 280 can be inhibited from being absorbed into the conductor 240.

Although the insulator 241 has a single-layer structure illustrated in FIG. 23, the present invention is not limited to this structure. The insulator 241 may have a stacked-layer structure of two or more layers.

In the case where the insulator 241 has a two-layer structure, a barrier insulating film against oxygen is used as a first layer in contact with the inner wall of the opening formed in the insulator 280 and the like, and a barrier insulating film against hydrogen is used as a second layer positioned inside the first layer. For example, aluminum oxide deposited by an ALD method is used as the first layer and silicon nitride deposited by a PEALD method is used as the second layer. This structure can inhibit oxidation of the conductor 240 and reduce the amount of hydrogen entering the oxide 230 and the like from the conductor 240. Thus, the electrical characteristics and reliability of the transistor 11 can be improved.

In the opening where the conductor 240 and the insulator 241 are provided, the sidewall of the opening may be perpendicular or substantially perpendicular to the top surface of the insulator 222 or may have a tapered shape. The tapered shape of the sidewall can improve the coverage with the insulator 241 and the like provided in the opening.

<Structure Example of Storage Device 300>

A structure example of the storage device 300 is described with reference to FIG. 24.

Figure 24:
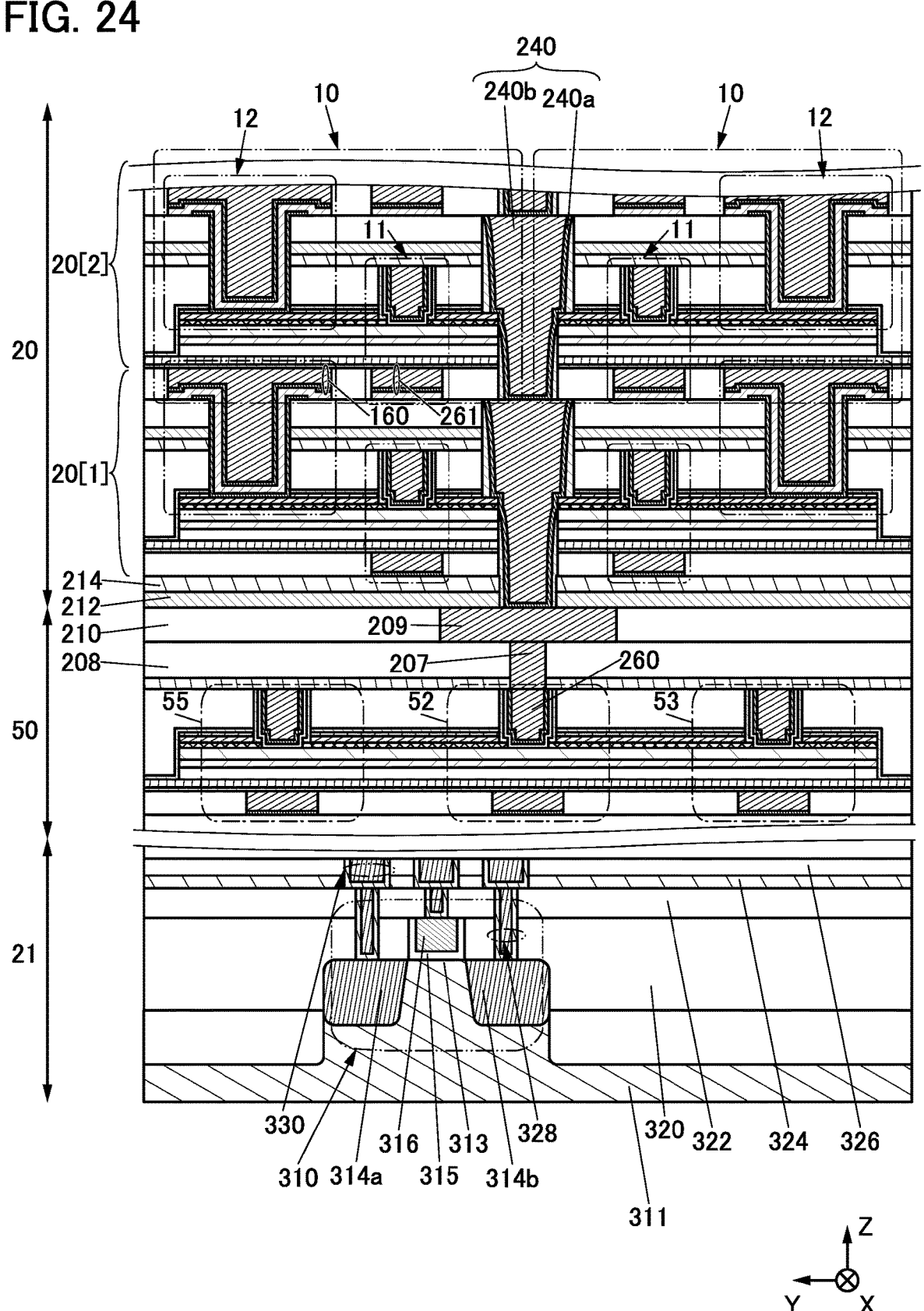
FIG. 24 is a cross-sectional view illustrating an example of a storage device.

The storage device 300 includes the driver circuit 21, which is a layer including a transistor 310 and the like, the functional layer 50, which is a layer including transistors 52, 53, 54, 55, and the like over the driver circuit 21, and the memory arrays 20[1] to 20[m] over the functional layer 50 (FIG. 24 illustrates only the memory arrays 20[1] and 20[2]). Note that the transistor 52 corresponds to the transistors 52_a and 52_b, the transistor 53 corresponds to the transistors 53_a and 53_b, the transistor 54 corresponds to the transistors 54_a and 54_b, and the transistor 55 corresponds to the transistors 55_a and 55_b.

FIG. 24 illustrates an example of the transistor 310 included in the driver circuit 21. The transistor 310 is provided on a substrate 311 and includes a conductor 316 functioning as a gate, an insulator 315 functioning as a gate insulator, a semiconductor region 313 including a part of the substrate 311, and a low-resistance region 314a and a low-resistance region 314b functioning as a source region and a drain region. The transistor 310 may be a p-channel transistor or an n-channel transistor. As the substrate 311, a single crystal silicon substrate can be used, for example.

Here, in the transistor 310 illustrated in FIG. 24, the semiconductor region 313 (part of the substrate 311) where a channel is formed has a protruding shape. In addition, the conductor 316 is provided to cover side surfaces and a top surface of the semiconductor region 313 with the insulator 315 therebetween. Note that a material adjusting the work function may be used for the conductor 316. Such a transistor 310 is also referred to as a FIN-type transistor because it utilizes a protruding portion of a semiconductor substrate. Note that an insulator functioning as a mask for forming the protruding portion may be included in contact with an upper portion of the protruding portion. Although the case where the protruding portion is formed by processing part of the semiconductor substrate is described here, a semiconductor film having a protruding shape may be formed by processing an SOI substrate.

Note that the transistor 310 illustrated in FIG. 24 is an example and the structure is not limited thereto; an appropriate transistor can be used in accordance with a circuit structure or a driving method.

Wiring layers provided with an interlayer film, a wiring, a plug, and the like may be provided between the components. A plurality of wiring layers can be provided in accordance with design. Furthermore, in this specification and the like, a wiring and a plug electrically connected to the wiring may be a single component. That is, there are cases where part of a conductor functions as a wiring and part of a conductor functions as a plug.

For example, an insulator 320, an insulator 322, an insulator 324, and an insulator 326 are sequentially stacked over the transistor 310 as interlayer films. A conductor 328 or the like is embedded in the insulator 320 and the insulator 322. A conductor 330 or the like is embedded in the insulator 324 and the insulator 326. Note that the conductor 328 and the conductor 330 function as plugs or wirings.

The insulators functioning as interlayer films may also function as planarization films that cover uneven shapes therebelow. For example, the top surface of the insulator 322 may be planarized by planarization treatment using a chemical mechanical polishing (CMP) method or the like to improve planarity.

FIG. 24 illustrates the transistors 52, 53, and 55 included in the functional layer 50. Each of the transistors 52, 53, and 55 has the same structure as the transistor 11 included in the memory cell 10. Sources and drains of the transistors 52, 53, and 55 are connected in series.

An insulator 208 is provided over the transistors 52, 53, and 55, and a conductor 207 is provided in an opening formed in the insulator 208. An insulator 210 is provided over the insulator 208, and a conductor 209 is provided in an opening formed in the insulator 210. Moreover, an insulator 212 is provided over the insulator 210, and an insulator 214 is provided over the insulator 212. A part of the conductor 240 provided in the memory array 20[1] is embedded in an opening formed in the insulator 212 and the insulator 214. Here, for the insulators 208 and 210, an insulator that can be used for the insulator 216 can be used. For the insulator 212, an insulator that can be used for the insulator 283 can be used. For the insulator 214, an insulator that can be used for the insulator 282 can be used.

A bottom surface of the conductor 207 is provided in contact with the top surface of the conductor 260 of the transistor 52. A top surface of the conductor 207 is provided in contact with a bottom surface of the conductor 209. A top surface of the conductor 209 is provided in contact with a bottom surface of the conductor 240 provided in the memory array 20[1]. With this structure, the conductor 240 corresponding to the wiring BL can be electrically connected to a gate of the transistor 52.

Each of the memory arrays 20[1] to 20[m] includes the plurality of memory cells 10. The conductor 240 included in each memory cell 10 is electrically connected to the conductor 240 in an upper layer and to the conductor 240 in a lower layer.

As illustrated in FIG. 24, the conductor 240 is shared between the adjacent memory cells 10. In the adjacent memory cells 10 are provided with the conductor 240 positioned therebetween such that the right side and the left side are symmetrical.

Here, the conductor 160, which functions as an upper electrode of the capacitor 12 in a lower layer (e.g., a layer of the memory array 20[1]) and a conductor 261, which functions as a second gate electrode of the transistor 11 in an upper layer (e.g., a layer of the memory array 20[2]) can be formed in the same layer. In other words, the conductor 160 of the capacitor 12 in the lower layer and the conductor 261 of the transistor 11 in the upper layer can be formed to be embedded in the opening formed in the same insulator 216. One conductive film is processed into the conductor 160 of the capacitor 12 in the lower layer and the conductor 261 of the transistor 11 in the upper layer, whereby the above structure can be formed. In that case, the conductor 160 of the capacitor 12 in the lower layer contains the same material as the conductor 261 of the transistor 11 in the upper layer.

The conductor 160 of the capacitor 12 in the lower layer and the conductor 261 of the transistor 11 in the upper layer are formed at the same time in the above manner, whereby the number of steps for manufacturing the storage device of this embodiment can be reduced and the productivity of the storage device can be improved.

In the above memory array 20, the plurality of memory arrays 20[1] to 20[m] can be stacked. The memory arrays 20[1] to 20[m] included in the memory array 20 are arranged in the direction perpendicular to the surface of the substrate provided with the driver circuit 21, whereby the memory density of the memory cells 10 can be increased. The memory arrays 20 can be formed by repeating the same manufacturing process in the vertical direction. In the storage device 300, the manufacturing cost of the memory array 20 can be reduced.

This embodiment can be combined with any of the other embodiments as appropriate.

Embodiment 4

In this embodiment, an example of a chip on which the storage device of one embodiment of the present invention is mounted will be described with reference to FIGS. 26A and 26B.

Figure 26A:
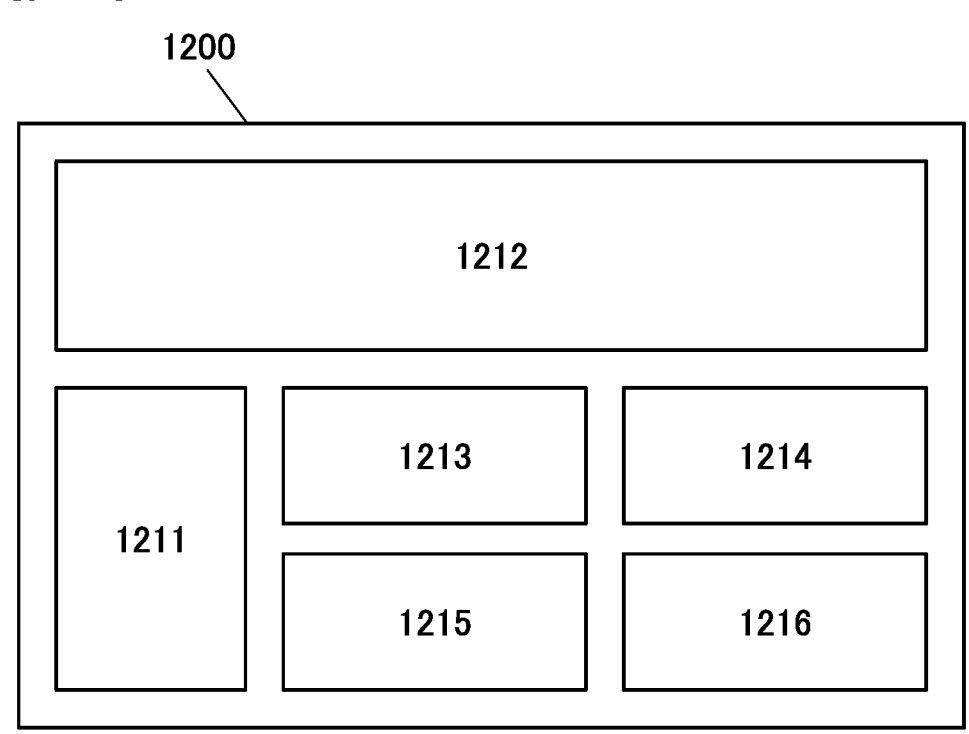
FIGS. 26A and 26B illustrate examples of semiconductor devices.
Figure 26B:
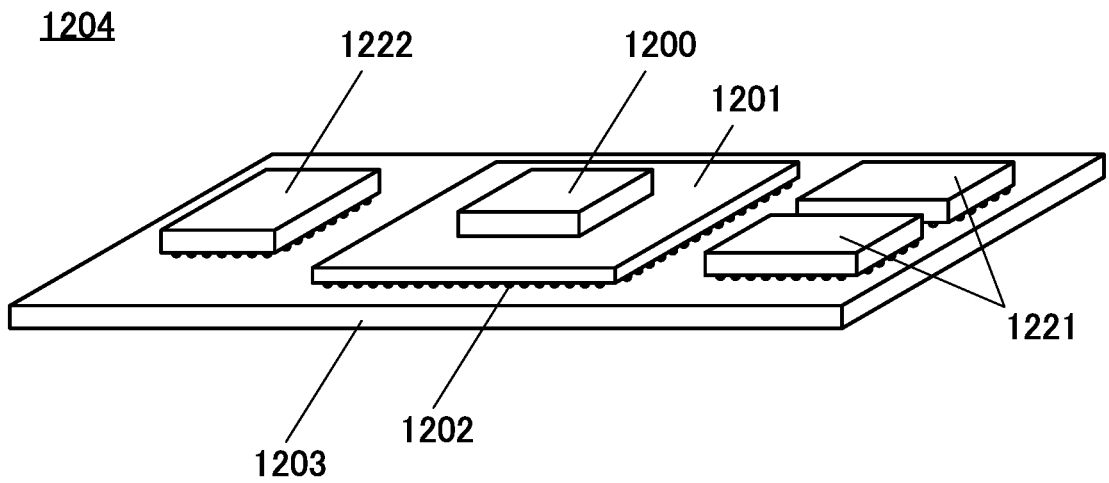

A plurality of circuits (systems) are mounted on a chip 1200 illustrated in FIG. 26A and FIG. 26B. The technique for integrating a plurality of circuits (systems) on one chip is referred to as system on chip (SoC) in some cases.

As illustrated in FIG. 26A, the chip 1200 includes a CPU 1211, a GPU 1212, at least one analog arithmetic unit 1213, at least one memory controller 1214, at least one interface 1215, at least one network circuit 1216, and the like.

A bump (not illustrated) is provided on the chip 1200, and as illustrated in FIG. 26B, the chip 1200 is connected to a first surface of a package substrate 1201. A plurality of bumps 1202 are provided on the rear side of the first surface of the package substrate 1201, and the package substrate 1201 is connected to a motherboard 1203.

A storage device such as a DRAM 1221 or a flash memory 1222 may be provided over the motherboard 1203. For example, the DOSRAM described in the above embodiment can be used as the DRAM 1221. This can make the DRAM 1221 have low power consumption, operate at high speed, and have a large capacity.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The DOSRAM described above can be used as the memory. The GPU 1212 is suitable for parallel computation of a number of data and thus can be used for image processing or product-sum operation. When an image processing circuit or a product-sum operation circuit including the OS transistor described in the above embodiments is provided in the GPU 1212, image processing or product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an analog/digital (A/D) converter circuit and a digital/analog (D/A) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, universal serial bus (USB), high-definition multimedia interface (HDMI) (registered trademark), or the like can be used.

The network circuit 1216 includes a circuit for the connection to a network such as a local-area network (LAN). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low costs.

The motherboard 1203 provided with the package substrate 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement techniques such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

This embodiment can be combined with any of the other embodiments as appropriate.

Embodiment 5

An electronic component, an electronic device, a large computer, a device for space, and a data center (also referred to as DC) for which the semiconductor device described in the above embodiments will be described in this embodiment. An electronic component, an electronic device, a large computer, a device for space, and a data center each employing the semiconductor device of one embodiment of the present invention are effective in improving performance, for example, reducing power consumption.

[Electronic Component]

Figure 27A:
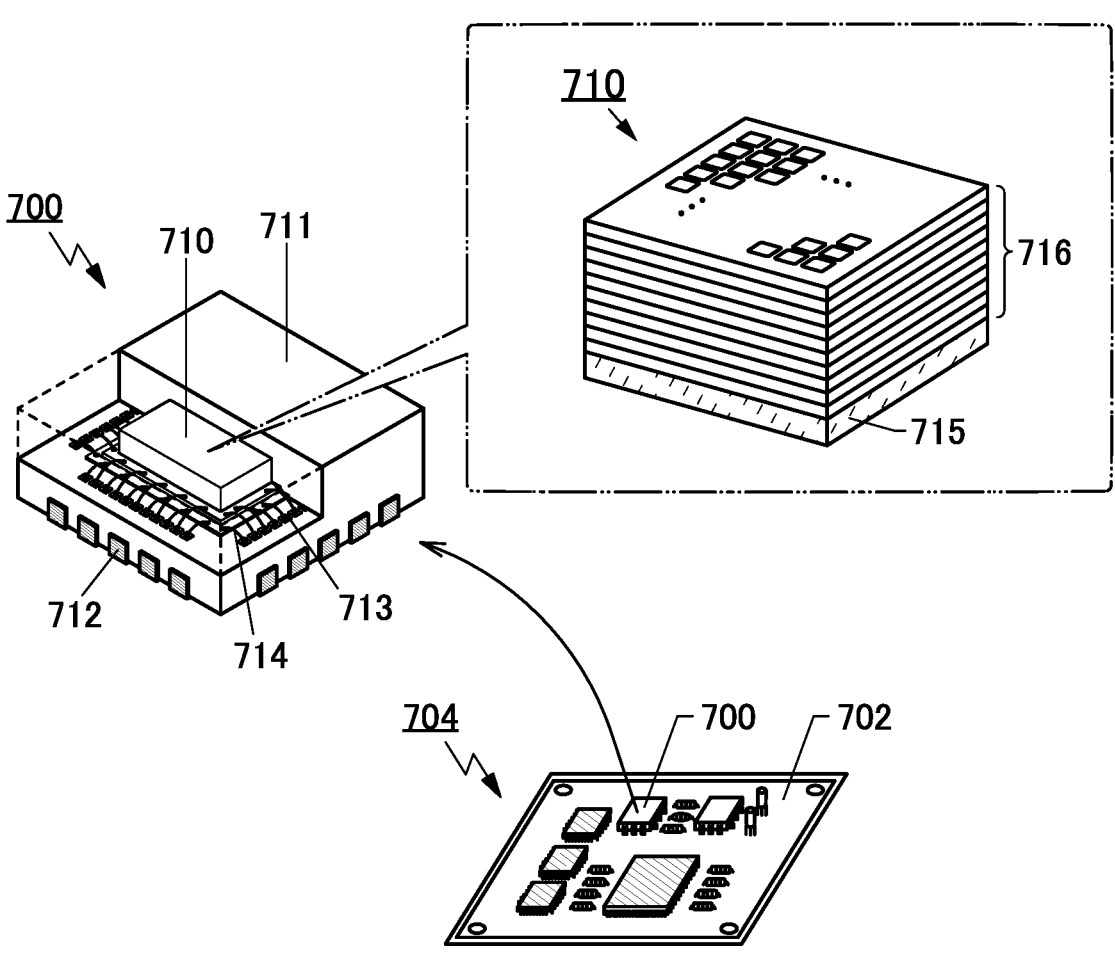
FIGS. 27A and 27B illustrate examples of electronic components.

FIG. 27A is a perspective view of a substrate (a circuit board 704) provided with an electronic component 700. The electronic component 700 illustrated in FIG. 27A includes a semiconductor device 710 in a mold 711. Some components are omitted in FIG. 27A to show the inside of the electronic component 700. The electronic component 700 includes a land 712 outside the mold 711. The land 712 is electrically connected to an electrode pad 713, and the electrode pad 713 is electrically connected to the semiconductor device 710 through a wire 714. The electronic component 700 is mounted on a printed circuit board 702, for example. A plurality of such electronic components are combined and electrically connected to each other on the printed circuit board 702, which forms the circuit substrate 704.

The semiconductor device 710 includes a driver circuit layer 715 and a memory layer 716. The memory layer 716 has a structure in which a plurality of memory cell arrays are stacked. A stacked-layer structure of the driver circuit layer 715 and the memory layer 716 can be a monolithic stacked-layer structure. In the monolithic stacked-layer structure, layers can be connected without using through electrode technique such as through-silicon via (TSV) technique and bonding technique such as Cu—Cu direct bonding. The monolithic stacked-layer structure of the driver circuit layer 715 and the memory layer 716, enables, for example, what is called an on-chip memory structure in which a memory is directly formed on a processor. The on-chip memory structure allows an interface portion between the processor and the memory to operate at high speed.

With the on-chip memory structure, the sizes of a connection wiring and the like can be smaller than those in the case where the through electrode technique such as TSV is used, which means that the number of connection pins can be increased. The increase in the number of connection pins enables parallel operations, which can improve the bandwidth of the memory (also referred to as a memory bandwidth).

It is preferable that the plurality of memory cell arrays included in the memory layer 716 be formed with OS transistors and be monolithically stacked. The monolithic stacked-layer structure of memory cell arrays can improve the bandwidth of the memory and/or the access latency of the memory. Note that the bandwidth refers to the data transfer volume per unit time, and the access latency refers to a period of time from data access to the start of data transmission. Note that in the case where the memory layer 716 is formed with Si transistors, the monolithic stacked-layer structure is difficult to form compared with the case where the memory layer 716 is formed with OS transistors. Therefore, an OS transistor is superior to a Si transistor in the monolithic stacked-layer structure.

The semiconductor device 710 may be called a die. Note that in this specification and the like, a die refers to a chip obtained by, for example, forming a circuit pattern on a disc-like substrate (also referred to as a wafer) or the like and cutting the substrate with the pattern into dices in a process of manufacturing a semiconductor chip. Examples of semiconductor materials that can be used for the die include silicon (Si), silicon carbide (SiC), and gallium nitride (GaN). For example, a die obtained from a silicon substrate (also referred to as a silicon wafer) is referred to as a silicon die in some cases.

Figure 27B:
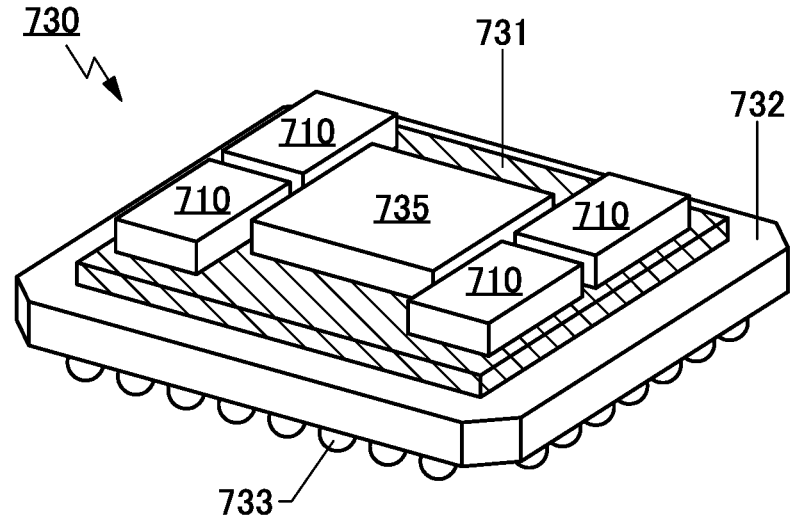

Next, FIG. 27B is a perspective view of an electronic component 730. The electronic component 730 is an example of a system in package (SiP) or a multi-chip module (MCM). In the electronic component 730, an interposer 731 is provided over a package substrate 732 (printed circuit board), and a semiconductor device 735 and a plurality of semiconductor devices 710 are provided over the interposer 731.

The electronic component 730 using the semiconductor device 710 as a high bandwidth memory (HBM) is illustrated as an example. The semiconductor device 735 can be used for an integrated circuit such as a central processing unit (CPU), a graphics processing unit (GPU), or an field programmable gate array (FPGA).

As the package substrate 732, a ceramic substrate, a plastic substrate, or a glass epoxy substrate can be used, for example. As the interposer 731, a silicon interposer or a resin interposer can be used, for example.

The interposer 731 includes a plurality of wirings and has a function of electrically connecting a plurality of integrated circuits with different terminal pitches. The plurality of wirings are provided in a single layer or multiple layers. In addition, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases.

Furthermore, a through electrode is provided in the interposer 731 and the through electrode is used to electrically connect an integrated circuit and the package substrate 732 in some cases. Moreover, in the case of using a silicon interposer, a TSV can also be used as the through electrode.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In the case where a plurality of integrated circuits with different terminal pitches are electrically connected with use of a silicon interposer, TSV, and the like, a space for a width of the terminal pitch and the like is needed. Accordingly, in the case where the size of the electronic component 730 is reduced, the width of the terminal pitch becomes an issue, which sometimes makes it difficult to provide a large number of wirings for obtaining a wide memory bandwidth. For this reason, the above-described monolithic stacked-layer structure with use of OS transistors is suitable. A composite structure obtained by combining a stacked-layer of memory cell arrays formed by TSV and a monolithic stacked-layer of memory cell arrays may be employed.

In addition, a heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the semiconductor devices 710 and the semiconductor device 735 are preferably equal to each other.

To mount the electronic component 730 on another substrate, an electrode 733 may be provided on a bottom portion of the package substrate 732. FIG. 27B illustrates an example in which the electrode 733 is formed of a solder ball. Solder balls are provided in a matrix on the bottom portion of the package substrate 732, so that BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods other than BGA and PGA. Examples of a mounting method include SPGA (Staggered Pin Grid Array), LGA (Land Grid Array), QFP (Quad Flat Package), QFJ (Quad Flat J-leaded package), and QFN (Quad Flat Non-leaded package).

[Electronic Device]

Next, FIG. 28A is a perspective view of an electronic device 6500. The electronic device 6500 in FIG. 28A is a portable information terminal that can be used as a smartphone. The electronic device 6500 includes a housing 6501, a display portion 6502, a power button 6503, buttons 6504, a speaker 6505, a microphone 6506, a camera 6507, a light source 6508, a control device 6509, and the like. Note that as the control device 6509, for example, one or more selected from a CPU, a GPU, and storage device are included. The semiconductor device of one embodiment of the present invention can be used for the display portion 6502, the control device 6509, and the like.

An electronic device 6600 illustrated in FIG. 28B is an information terminal that can be used as a laptop personal computer. The electronic device 6600 includes a housing 6611, a keyboard 6612, a pointing device 6613, an external connection port 6614, a display portion 6615, a control device 6616, and the like. Note that as the control device 6616, for example, one or more selected from a CPU, a GPU, and a storage device are included. The semiconductor device of one embodiment of the present invention can be used for the display portion 6615, the control device 6616, and the like. Note that the semiconductor device of one embodiment of the present invention is preferably used for the control device 6509 and the control device 6616, in which case power consumption can be reduced.

[Large Computer]

Next, FIG. 28C is a perspective view of a large computer 5600. In the large computer 5600 illustrated in FIG. 28C, a plurality of rack mount computers 5620 are stored in a rack 5610. Note that the large computer 5600 may be referred to as a supercomputer.

The computer 5620 can have a structure in a perspective view illustrated in FIG. 28D, for example. In FIG. 28D, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

The PC card 5621 illustrated in FIG. 28E is an example of a processing board provided with a CPU, a GPU, a storage device, and the like. The PC card 5621 includes a board 5622. The board 5622 includes a connection terminal 5623, a connection terminal 5624, a connection terminal 5625, a semiconductor device 5626, a semiconductor device 5627, a semiconductor device 5628, and a connection terminal 5629. Note that FIG. 28E also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA, a GPU, and a CPU. As the semiconductor device 5627, the electronic component 730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a storage device or the like. As the semiconductor device 5628, the electronic component 700 can be used, for example.

The large computer 5600 can also function as a parallel computer. When the large computer 5600 is used as a parallel computer, large-scale computation necessary for artificial intelligence learning and inference can be performed, for example.

[Device for Space]

The semiconductor device of one embodiment of the present invention can be suitably used as a device for space, such as devices processing and storing information.

The semiconductor device of one embodiment of the present invention can include an OS transistor. A change in electrical characteristics of the OS transistor due to radiation irradiation is small. That is, the OS transistor is highly resistant to radiation, and thus can be suitably used even in an environment where radiation can enter. For example, the OS transistor can be suitably used in outer space.

Figure 29:
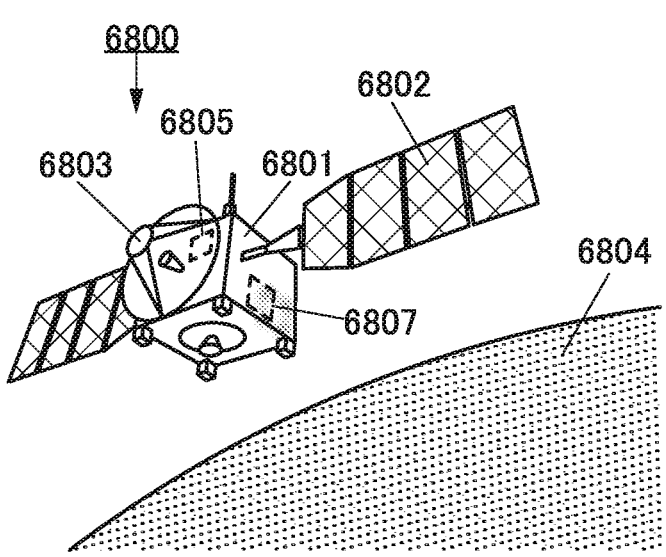
FIG. 29 illustrates an example of a device for space.

FIG. 29 illustrates an artificial satellite 6800 as an example of a device for space. The artificial satellite 6800 includes a body 6801, a solar panel 6802, an antenna 6803, a secondary battery 6805, and a control device 6807. In FIG. 29, a planet 6804 in outer space is illustrated. Note that outer space refers to, for example, space at an altitude greater than or equal to 100 km, and outer space described in this specification may also include thermosphere, mesosphere, and stratosphere.

Although not illustrated in FIG. 29, a battery management system (also referred to as BMS) or a battery control circuit may be provided in the secondary battery 6805. The battery management system or the battery control circuit preferably uses the OS transistor, in which case it has low power consumption and high reliability even in outer space.

The amount of radiation in outer space is 100 or more times that on the ground. Examples of radiation include electromagnetic waves (electromagnetic radiation) typified by X-rays and gamma rays and particle radiation typified by alpha rays, beta rays, neutron beam, proton beam, heavy-ion beams, and meson beams.

When the solar panel 6802 is irradiated with sunlight, electric power required for operation of the artificial satellite 6800 is generated. However, for example, in the situation where the solar panel is not irradiated with sunlight or the situation where the amount of sunlight with which the solar panel is irradiated is small, the amount of generated electric power is small. Accordingly, a sufficient amount of electric power required for operation of the artificial satellite 6800 might not be generated. In order to operate the artificial satellite 6800 even with a small amount of generated electric power, the artificial satellite 6800 is preferably provided with the secondary battery 6805. Note that a solar panel is referred to as a solar cell module in some cases.

The artificial satellite 6800 can generate a signal. The signal is transmitted through the antenna 6803, and can be received by a ground-based receiver or another artificial satellite, for example. When the signal transmitted by the artificial satellite 6800 is received, the position of a receiver that receives the signal can be measured. Thus, the artificial satellite 6800 can construct a satellite positioning system.

The control device 6807 has a function of controlling the artificial satellite 6800. The control device 6807 is formed with one or more selected from a CPU, a GPU, and a storage device, for example. Note that the semiconductor device of one embodiment of the present invention is suitably used for the control device 6807. A change in electrical characteristics of the OS transistor due to radiation irradiation is smaller than a change in electrical characteristics of a Si transistor. Accordingly, the OS transistor has high reliability and thus can be suitably used even in an environment where radiation can enter.

The artificial satellite 6800 can include a sensor. For example, with a structure including a visible light sensor, the artificial satellite 6800 can have a function of sensing sunlight reflected by a ground-based object. Alternatively, with a structure including a thermal infrared sensor, the artificial satellite 6800 can have a function of sensing thermal infrared rays emitted from the surface of the earth. Thus, the artificial satellite 6800 can function as an earth observing satellite, for example.

Although the artificial satellite is described as an example of a device for space in this embodiment, one embodiment of the present invention is not limited to this example. The semiconductor device of one embodiment of the present invention can be suitably used for a device for space such as a spacecraft, a space capsule, or a space probe, for example.

As described above, an OS transistor has excellent effects of achieving a wide memory bandwidth and being highly resistant to radiation as compared with a Si transistor.

[Data Center]

The semiconductor device of one embodiment of the present invention can be suitably used for, for example, a storage system in a data center or the like. Long-term management of data, such as guarantee of data immutability, is required for the data center. The long-term management of data needs setting a storage or a server for retaining a huge amount of data, stable power supply for retaining data, cooling equipment for retaining data, an increase in building size, and the like.

With use of the semiconductor device of one embodiment of the present invention for a storage system in a data center, electric power used for retaining data can be reduced and a semiconductor device for retaining data can be reduced in size. Accordingly, reductions in sizes of the storage system and the power supply for retaining data, downscaling of the cooling equipment, and the like can be achieved. Therefore, a space of the data center can be reduced.

Since the semiconductor device of one embodiment of the present invention has low power consumption, heat generation from a circuit can be reduced. Accordingly, adverse effects of the heat generation on the circuit itself, the peripheral circuit, and the module can be reduced. Furthermore, the use of the semiconductor device of one embodiment of the present invention can achieve a data center that operates stably even in a high temperature environment. Thus, the reliability of the data center can be increased.

Figure 30:
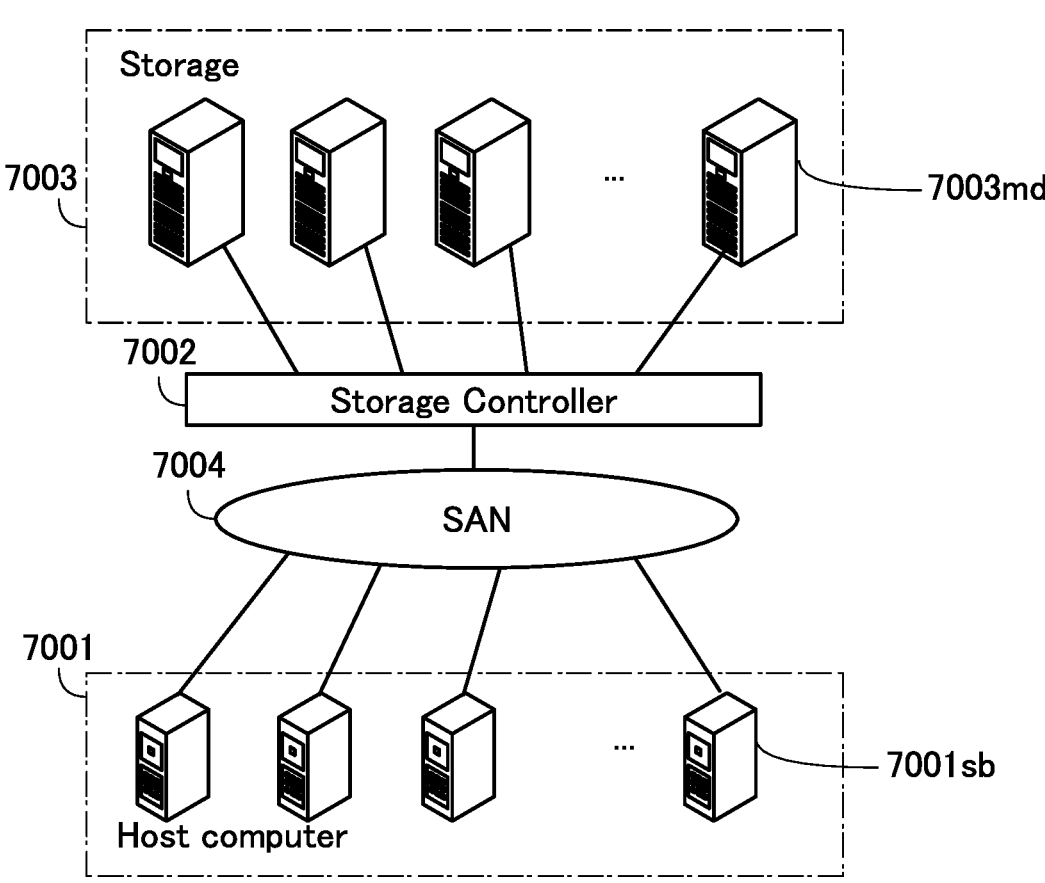
FIG. 30 illustrates an example of a storage system that can be used for a data center.

FIG. 30 illustrates a storage system that can be used in a data center. A storage system 7000 illustrated in FIG. 30 includes a plurality of servers 7001sb as host 7001 (indicated as "Host Computer" in the diagram). The storage system 7000 includes a plurality of storage devices 7003md as a storage 7003 (indicated as "Storage" in the diagram). In the illustrated example, the host 7001 and the storage 7003 are connected to each other through a storage area network 7004 (indicated as "SAN" in the diagram) and a storage control circuit 7002 (indicated as "Storage Controller" in the diagram).

The host 7001 corresponds to a computer which accesses data stored in the storage 7003. The host 7001 may be connected to another host 7001 through a network.

The data access speed, i.e., the time taken for storing and outputting data, of the storage 7003 is shortened by using a flash memory, but is still considerably longer than the data access speed of a DRAM that can be used as a cache memory in the storage 7003. In the storage system, in order to solve the problem of low access speed of the storage 7003, a cache memory is normally provided in the storage 7003 to shorten the time for data storage and output.

The above-described cache memory is used in the storage control circuit 7002 and the storage 7003. The data transmitted between the host 7001 and the storage 7003 is stored in the cache memories in the storage control circuit 7002 and the storage 7003 and then output to the host 7001 or the storage 7003.

With a configuration in which an OS transistor is used as a transistor for storing data in the cache memory to retain a potential based on data, the frequency of refreshing can be decreased, so that power consumption can be reduced. Furthermore, downscaling of the storage is possible by stacking memory cell arrays.

A reduction in power consumption of an electronic device, a large computer, a device for space, or a data center is expected with use of the semiconductor device of one embodiment of the present invention for their electronic components. While the demand for energy is expected to increase with higher performance or higher integration of semiconductor devices, the emission amount of greenhouse effect gases typified by carbon dioxide ($CO_2$) can be reduced with use of the semiconductor device of one embodiment of the present invention. Furthermore, the semiconductor device of one embodiment of the present invention has low power consumption and thus is effective as a global warming countermeasure.

The configurations, structures, methods, and the like described in this embodiment can be used in an appropriate combination with any of the configurations, structures, methods, and the like described in the other embodiments and the like.

This application is based on Japanese Patent Application Serial No. 2022-098829 filed with Japan Patent Office on Jun. 20, 2022, the entire contents of which are hereby incorporated by reference.

What is claimed is:

1. A method of manufacturing a semiconductor device, comprising the steps of:

forming an oxide over a substrate, a first conductor over the oxide, and a second conductor over the first conductor;

forming a first insulator to cover the oxide, the first conductor, and the second conductor;

forming an opening in the first insulator and the second conductor to divide the second conductor into a third conductor and a fourth conductor;

forming a second insulator to cover the opening and the first insulator;

forming a third insulator over the second insulator;

processing the second insulator and the third insulator by a dry etching method into a fourth insulator in contact with a side surface of the first insulator, a side surface of the third conductor, and a side surface of the fourth conductor and a fifth insulator in contact with a side surface and a top surface of the fourth insulator;

processing the first conductor by the dry etching method using the fourth insulator and the fifth insulator as a mask to divide the first conductor into a fifth conductor and a sixth conductor;

removing the fifth insulator by isotropic etching;

performing heat treatment on the oxide in an atmosphere containing oxygen;

forming a sixth insulator to cover the oxide, the first insulator, and the fourth insulator;

forming a seventh conductor over the sixth insulator; and processing the sixth insulator and the seventh conductor by CMP treatment to form a seventh insulator and an eighth conductor in the opening, wherein a nitride insulator is formed as the second insulator, and wherein an oxide insulator is formed as the third insulator.

2. The method of manufacturing a semiconductor device, according to claim 1, wherein silicon nitride is formed by a PEALD method as the second insulator.

3. The method of manufacturing a semiconductor device, according to claim 1, wherein silicon oxide is formed by a PEALD method as the third insulator.

4. The method of manufacturing a semiconductor device, according to claim 1, wherein a tantalum nitride is formed by a sputtering method as the first conductor.

5. The method of manufacturing a semiconductor device, according to claim 1, wherein tungsten is formed by a sputtering method as the second conductor.

6. The method of manufacturing a semiconductor device, according to claim 1, wherein an oxide containing indium, gallium, and zinc is formed by a sputtering method as the oxide.

7. A method of manufacturing a semiconductor device, comprising the steps of:

forming an oxide over a substrate, a first conductor over the oxide, and a second conductor over the first conductor;

forming a first insulator to cover the oxide, the first conductor, and the second conductor;

forming an opening in the first insulator and the second conductor to expose the first conductor and divide the second conductor into a third conductor and a fourth conductor;

forming a second insulator to cover the opening and the first insulator;

forming a third insulator over the second insulator;

removing part of the second insulator and part of the third insulator to form a fourth insulator in contact with a sidewall of the opening and a fifth insulator in contact with a side surface and a top surface of the fourth insulator;

removing part of the first conductor overlapped with the opening to divide the first conductor into a fifth conductor and a sixth conductor;

removing the fifth insulator; and forming a sixth insulator and a seventh conductor in the opening.

8. The method of manufacturing a semiconductor device, according to claim 7, wherein silicon nitride is formed by a PEALD method as the second insulator.

9. The method of manufacturing a semiconductor device, according to claim 7, wherein silicon oxide is formed by a PEALD method as the third insulator.

10. The method of manufacturing a semiconductor device, according to claim 7, wherein a tantalum nitride is formed by a sputtering method as the first conductor.

11. The method of manufacturing a semiconductor device, according to claim 7, wherein tungsten is formed by a sputtering method as the second conductor.

12. The method of manufacturing a semiconductor device, according to claim 7, wherein an oxide containing indium, gallium, and zinc is formed by a sputtering method as the oxide.

\* \* \* \* \*